(12) United States Patent
Litaize et al.

(10) Patent No.: US 6,345,321 B1
(45) Date of Patent: Feb. 5, 2002

(54) MULTIPLE-MODE MEMORY COMPONENT

(75) Inventors: Daniel Litaize, Saint Orens de Gameville; Jean-Claude Salinier, Ramonville Saint-Agne; Abdelaziz Mzoughi, Toulouse; Fatima-Zahra Elkhlifi, Toulouse; Mustapha Lalam, Toulouse; Pascal Sainrat, Toulouse, all of (FR)

(73) Assignee: Busless Computers Sarl, Toulouse (FR)

( * ) Notice: Subject to any disclaimer, the term of this patent is extended or adjusted under 35 U.S.C. 154(b) by 0 days.

(21) Appl. No.: 09/577,447

(22) Filed: May 24, 2000

Related U.S. Application Data

(63) Continuation of application No. 08/024,803, filed on Mar. 1, 1993, now Pat. No. 6,112,287, which is a continuation of application No. 07/400,113, filed as application No. PCT/FR88/00608 on Dec. 9, 1988, now abandoned.

(30) Foreign Application Priority Data

Dec. 14, 1987 (FR) .............................................. 87.18103

(51) Int. Cl.[7] .................................................. G06F 13/00
(52) U.S. Cl. .............................. 710/23; 710/25; 710/28; 712/225; 711/165
(58) Field of Search .............................. 710/22, 23, 24, 710/25, 26, 27, 28, 65, 66, 67, 68, 69, 70, 71; 712/225; 711/165

(56) References Cited

U.S. PATENT DOCUMENTS

| | | | | |
|---|---|---|---|---|
| 3,846,763 A | * | 11/1974 | Riikonen | 710/70 |
| 4,704,678 A | * | 11/1987 | May | 709/106 |
| 4,782,439 A | * | 11/1988 | Borkar et al. | 710/22 |
| 4,930,065 A | * | 5/1990 | McLagan et al. | 712/225 |

* cited by examiner

Primary Examiner—Richard L. Ellis
(74) Attorney, Agent, or Firm—Young & Thompson

(57) ABSTRACT

A memory component on a single integrated circuit includes a RAM, one or more configuration registers, and an associated controller. The behavior of the memory component, including selection from a number of different operating modes, is controllable via configuration register mode bits. The various modes include several transfer-length modes, where each mode corresponds to data transfers of a predetermined length. Based on the mode selection specified by the mode bits, the controller determines the length of the data transfers.

59 Claims, 22 Drawing Sheets

MULTIPLE-MODE MEMORY COMPONENT

This application is a continuation of U.S. application Ser. No. 08/024,803 filed Mar. 1, 1993, now U.S. Pat. No. 6,112,287, which was a file-wrapper continuation of U.S. application Ser. No. 07/400,113, filed Aug. 14, 1989 now abandoned, which was a 35 U.S.C. §371 National Stage Submission of International Application PCT/FR88/00608 filed Dec. 9, 1988.

The invention relates to a multiprocessor system of the type comprising a central memory, treatment processors and cache memories associated with treatment processors. It also relates to a process for the exchange of information between central memory and treatment processors via the cache memory associated with each of these processors. It also provides a new integrated circuit component, capable of equipping the multiprocessor system.

BACKGROUND

It is known that, in the most common known multiprocessor systems, all the information (data, address) is relayed by a common parallel communication bus between the central memory and the various treatment processors, which constitutes a bottleneck: its transfer rate is in effect insufficient to feed all the processors for full efficiency, from a common central memory.

For increasing the information transfer rate, a first solution consists in associating with each treatment processor a cache memory which, by the locality of the information, permits reducing the demands on the central memory. However, in the case in which the volume of data shared between processors is substantial, the maintenance of coherence of the data between memories generates complementary information traffic on the communication bus which resists a significant reduction of the overall flow on this bus, and therefore removes a large part of the interest in this solution.

Another solution consists in providing the communication bus in the form of a grid network designed as a "crossbar", which permits a direct communication between each treatment processor and each subassembly of the central memory (memory bank). However, this solution is very burdensome and very costly to achieve because of the very great number of interconnections, and it becomes completely unrealistic beyond about ten treatment processors. Moreover, in the case of multiple demands of several processors on the same memory bank, such a solution implies access conflicts, a source of slowing up the exchanges.

Another more current solution by reason it its architectural simplicity consists in associating a local memory with each treatment processor for storing specific data therein, and storing the transferred data in the common central memory. However, the great deficiency of this architecture is its non-transparency, that is, the need for the programmer to organize the detail of the allocation of data in the various memories, such that this solution is of a very constrained usefulness. Moreover, in the case of high volume of transferred data, it may lead as before to a saturation of the access bus in the central memory.

A solution which has been called "aquarius architecture" has been proposed by the University of California, at Berkeley, and consists in improving the aforementioned crossbar solution by combining with the crossbar network, for the non-shared data, cache memories which are connected to the crossbar network, and for the shared data, distinct cache memories which are connected to a common synchronization bus. This solution contributes a gain in speed of exchange but remains very burdensome and very costly to achieve.

SUMMARY

The present invention seeks to provide a new solution, permitting considerably increasing the flow rate of information exchange, while retaining an architecture which is transparent for the user, and much simpler than the crossbar architecture.

An object of the invention is thus to permit notably increasing the number of treatment processors of the system, while benefiting from a high efficiency for each processor.

Another object is to provide a structure of an integrated circuit component, permitting a very simple realization of the architecture of this new multiprocessor system.

To this end, the multiprocessor system provided by the invention is of the type comprising a central memory (RAM) organized in blocks of information (bi), treatment processors ($CPU_1$ . . . $CPU_j$ . . . $CPU_n$), a cache memory ($MC_j$) connected to each treatment processor ($CPU_j$) and organized in blocks of information ($b_i$) of the same size as those of the central memory, a directory ($RG_j$) and its management processor ($PG_j$) associated with each cache memory ($MC_j$), means for communication of addresses of blocks between processors ($CPU_j$) and a central memory (RAM). According to the present invention, the multiprocessor system is provided with:

- a set of memory shift registers, termed memory shift registers ($RDM_1$ . . . $RDM_j$ . . . $RDM_n$), each register ($RDM_j$) of this assembly being connected to the central memory (RAM) in such a manner as to permit, in one cycle of this memory, a parallel transfer in read or write of a block of information ($b_i$) between said register and said central memory;
- shift registers, termed processor shift registers ($RDP_1$ . . . $RDP_j$ . . . $RDP_n$), each processor shift register ($RDP_j$) being connected to the cache memory ($MC_j$) of a treatment processor ($CPU_j$) in such a manner as to permit a parallel transfer in reading or writing of a block of information (bi) between said shift register ($RDP_j$) and said cache memory ($MC_j$);
- a set of serial links ($LS_1$ . . . $LS_j$ . . . $LS_n$), each connecting a memory shift register ($RDM_j$) and a processor shift register ($RDP_j$) and permitting the transfer of blocks of information ($b_i$) between the two registers considered ($RDM_j$, $RDP_j$)

Thus, in the multiprocessor system according to the invention, the exchanges between the cache memories and the associated processors are carried out as in the conventional systems provided with cache memories. By contrast, the exchanges between the central memory and the cache memories are carried out in an entirely original manner.

Each transfer of an information block ($b_i$) from the central memory (RAM) to the cache memory ($MC_j$) of a given processor ($CPU_j$) consists of:

transferring, in a cycle of the central memory, the block ($b_i$) of said central memory (RAM) to the memory shift register ($RDM_j$) (of the size of one block) which is directly connected to the central memory and which corresponds to the processor ($CPU_j$) considered, transferring on the corresponding serial link ($LS_j$) the contents of this memory shift register ($RDM_j$) to the processor shift register ($RDP_j$) (of the same capacity) which is associated with the cache memory ($MC_j$) of the processor considered ($CPU_j$), transferring the contents of said processor shift register ($RDP_j$) to the cache memory ($MC_j$).

In the opposite direction, each transfer of information blocks ($b_i$) from the cache memory ($MC_j$) of a given processor ($CPU_j$) to the central memory (RAM) consists of:

- transferring the block ($b_i$) of said cache memory considered ($MC_j$) to the processor shift register ($RDP_j$) which is associated with said cache memory ($MC_j$),
- transferring on the corresponding serial link ($LS_j$) the contents of the processor shift register ($RDP_j$) to the memory shift register ($RDM_j$), allocated to the processor considered (among the assembly of shift registers ($RDM_1 \ldots RDM_j \ldots RDM_n$) connected to the central memory (RAM),
- transferring in a cycle of the central memory, the contents of the memory shift register ($RDM_j$) to said central memory (RAM).

In these conditions, the transfer of each block of information ($b_i$) is carried out, no longer through a parallel bus as is the case in the known systems, but by the serial links of high flow rate. These serial links permit obtaining comparable times of transfer for each block ($b_i$) and even lower than the transfer times in known parallel bus systems. The comparative example given hereinbelow with the current values of the parameter for current technology, illustrates clearly this fact which seems paradoxical.

It is assumed that each block of information ($b_i$) is of a size equal to 64 bytes.

In the system of the invention, the transfer time between the central memory and a cache memory breaks down into:

- a central memory transfer time (RAM)/memory shift register ($RDM_j$) : 100 nanoseconds (performance of a central random access memory of known type),
- a serial transfer time on the corresponding serial link: $64 \times 8 \times 1/500.10^6$, either 1024 nanoseconds, assuming a transfer frequency of 500 megahertz (not exceptional with current technology which permits attaining frequencies of 3000 megahertz),
- a processor shift register transfer time ($RDP_j$)/cache memory ($MC_j$): 50 nanoseconds (cache memory of the very current type).

The total time of transfer of a block is therefore on the order of 1200 nanoseconds (while integrating the chaining delays of the second order).

In known systems with cache memories in which the exchanges of information is carried out directly in parallel by words of 4 bytes (the most current systems leading to busses of the conventional type of 32 data lines), the transfer time for one block is equal to the transfer time of 16 words of 4 bytes which comprise this block, that is: $16 \times 100 = 1600$ nanoseconds.

Thus, it is seen that, with the average hypotheses in the two solutions, these times are comparable. But, if one compares the architecture of the system according to the invention with that of a parallel bus common with cache memories (first solution mentioned previously), it will be realized that:

- in the conventional solution (common parallel bus), the central memory and the common bus are occupied at 100% during the transfer, since the information circulates between the two for the entire transfer time,
- in the system according to the invention, the serial link is occupied 100% during the transfer, but the central memory is occupied less that 10% of the transfer time (time of memory reading and loading of the memory shift register ($RDM_j$), such that the central memory may serve 10 times more processors than in the preceding case (the use of the serial link being without significance since it is private and directed to the processor).

It is important to emphasize that in this system of the invention, each serial connection which connects each processor in an individual manner to the central memory is a simple connection (of one or two data leads), such that the serial network thus constituted is not comparable in the overall plan to the complexity with, for example, a crossbar network of which each connection is a parallel connection with multiplicity of leads (32 leads of data in the comparative example above), with all of the necessary switches.

Further, as will be seen below on the comparative curves, the system according to the invention has greatly improved performance with respect to the traditional common bus systems and permits in practice operating a much higher number of processors (of several tens to a hundred processors). This performance is compatible with that of a crossbar system, but the system according to the invention is of a much greater architectural simplicity.

In the system of the invention, each serial link may in practice be achieved either by means of two unidirectional serial links for bit by bit transfer, or by means of a single bidirectional serial link.

In the first case, each memory shift register; ($RDM_j$) and each processor shift register ($RDP_j$) are divided into two registers, one specialized for the transfer in one direction, the other for the transfer in the other direction. The two unidirectional serial links are then connected to the divided memory shift register ($RDM_j$) and to the corresponding divided processor shift register ($RDP_j$), in such a manner as to permit, for one, a transfer in one direction, and for the other, a transfer in the other direction.

This embodiment with two unidirectional links presents the advantage of not requiring any transfer management on the link, but the inconvenience of doubling the necessary resources (link, registers).

In the second case, a validation logic of the transfer direction is associated with the bidirectional link such as to permit an alternate transfer in the two directions on said link. This logic may be integrated in the management processor ($PG_j$) associated with the cache memory ($MC_j$) to which said bidirectional link is connected.

It will be understood that each serial link may ultimately be provided with a higher number of serial links.

In the multiprocessor system according to the invention, the address communication means may cover essentially two forms embodiments: in the first case, it may consist of a parallel address communication bus for blocks (BUSA), common to all of the processors ($CPU_j$) and connecting the latter and the central memory (RAM) in a conventional manner with a bus arbitrator (AB) adapted to manage access conflicts on said bus. It is necessary to note that this address bus is only utilized for communication of addresses of blocks: in the plan of the structure, this bus is identical to the parallel address communication bus of known systems, for which no problems of saturation are interposed, since it will be freed right after transfer of the address block.

However, another embodiment of this address communication means may be considered in the multiprocessor system of the invention, consisting in operating the serial links for transfer of blocks of information ($b_i$) to transfer the addresses of these blocks.

In this case, a complementary shift register ($RDC_j$) is connected to each serial link ($LS_j$) in parallel with the corresponding memory shift register ($RDC_j$). The addresses transmitted by said serial link are thus loaded into each of these complementary registers (RDC$_j$). An access management arbitrator connected to said registers (RDC$_j$) and to the central memory (RAM) is thus provided for selecting the addresses contained in said registers and for managing the conflicts of access to the central memory (RAM). Such an arbitrator is conceptually well-known, this type of access conflicts being now resolved for a number of years. In this embodiment, the presence of a parallel communication address bus is avoided, but the management resources are made more burdensome.

Further, the multiprocessor system according to the invention is particularly well suited for managing in an efficient manner the problems of coherence of the data shared between treatment processors. In effect, the conventional solutions for managing these shared data find their limits in the known systems from the fact of the bottleneck at the level of the communication of information, but become, on the contrary, perfectly satisfactory and efficient in the system of the invention where such a bottleneck no longer exists, such that this system may be equipped with shared data management means of an analogous concept to that of known systems.

For example, one traditional solution of shared data management consists in avoiding the relay of shared data by the cache memories: in a conventional manner, a partition logic (LP$_j$) is associated with each treatment processor (CPU$_j$) in order to differentiate the addresses of the shared data and those of the non-shared data so as to direct the first directly toward the central memory (RAM) and the second toward the corresponding cache memory (MC$_j$).

In a first version of the architecture according to the invention, the system comprises:

a special bus for parallel communication of words (BUSD) connecting the processors (CPU$_j$) and the central memory (RAM), a partition logic (LP$_j$) associated with each processor (CPU$_j$) and adapted to differentiate the addresses of the shared data and those of the non-shared data in such a manner as to transmit the non-shared data on the address communication means with their identification, a decoding logic (DEC) associated with the central memory (RAM) and adapted to receive the addresses with their identification and to direct the data into the memory output either to the corresponding memory shift register (RDM$_j$) for the non-shared data, or to the special word communication bus (BUSD) for the shared data.

This solution presents the advantage of being very simple in the architectural plan. The presence of the special parallel communication bus (BUSD) leads to better performances with respect to a solution which consists in utilizing the serial connections for transferring not only the blocks of non-shared data but also the words of shared data. It should be noted that this latter solution may, in some cases, be provided in case of low flow of shared data.

In another version, the system is provided with a special bus for parallel communication of words and a special common bus for communication of addresses of words (BUSAM) in order to transfer the data by the special word bus (BUSD), and direct the non-shared data to the address communication means (which may comprise a parallel communication bus where the communication is carried out by the serial links).

The presence of a special bus for communication of addresses of words permits, in this version, to move back the saturation limit of the address communication means, in case of high demand for shared data.

Another version which will be preferred in practice in the case in which the address communication means comprises a parallel address communication bus (BUSA) consists in providing the system with a memory management processor (PGM) associated with the memory (RAM) and a snooping processor with a bus (PE$_j$) associated with each treatment processor (CPU$_j$) and to the corresponding management directory (RG$_j$). The memory management processor (PGM) and each snooping processor, of structures known in themselves, are connected to the address communication bus (BUSA) in order respectively to oversee and to treat the addresses of blocks transmitted on said bus in such a manner as to permit an updating of the central memory (RAM) and of the associated cache memory (MC$_j$) in case of detection of an address of a block present in the associated directory (RG$_j$).

The memory management processor (PGM) and each snooping processor (PE$_j$) associate status bits of each block of information, holding them as a function of the nature (read or write) of the block requests which are put on the bus (BUSA) and assures the coherence of the shared data while using these status bits which permit them to force or not write a block into the central memory at the moment of the requests on the bus (BUSA).

In the case referred to previously where the communications of addresses are made by the serial connections, the management of shared data may also be assured in a centralized manner, by a memory management processor (PGM) associated with the central memory (RAM) and a processor for maintaining the coherence of the shared data (PMC$_j$) associated with each treatment processor (CPU$_j$) and with the corresponding management directory (RG$_j$), each coherence maintenance processor being connected to a synchronization bus (SYNCHRO) controlled by the memory management processor (PGM), in such a manner as to permit an updating of the central memory (RAM) and of the associated cache memories (MC$_j$) in case of detection of an address block, an updating of the central memory (RAM) and the cache memories (MC$_j$) at each address selection in the complementary shift registers (RDC$_j$).

As before this operation is assured due to the status bits associated with each block of information by the processor (PGM).

It should be noted that a synchronization bus of the type hereinafter defined may, in some cases, be provided in the preceding architecture where the address of blocks move on a common address bus BUSA. In this case, the snooping processors (PE$_j$) are urged by the memory management processor (PGM) via the synchronization bus, and this only when they are concerned by the transfer. Thus, non-useful access to the cache memories is avoided. The snooping processors become then passive (since driven by the processor PGM) and they are designated more by the more appropriate expression "coherence maintenance processor" according to the terminology hereinabove utilized.

Another solution consists in reserving the parallel address communication bus (BUSA) for the transfer of addresses of blocks of shared data and using the serial links for the transfer of blocks of non-shared data.

Further, the multiprocessor system according to the invention lends itself to the regroupings of treatment processors on a same serial link, in such a manner as to limit the serial links and the corresponding memory shift registers (RDM$_j$) necessary.

The number of memory shift registers (RDM$_j$) may correspond to the number of serial links (LS$_j$), to which case each memory shift register (RDM$_j$) is connected in a static manner to a serial link (LS$_j$) specifically appropriated to said register.

The number of memory shift registers ($RDM_j$) may also be different from that of the serial connections ($LS_j$) and in particular less, in which case these registers are connected in a dynamic manner to the serial links ($LS_j$) through an interconnection network.

As in conventional systems, the central memory (RAM) may be divided into 'm' memory banks ($RAM_1 \ldots RAM_p \ldots RAM_m$) arranged in parallel. Each memory shift register ($RDM_j$) is then comprised of m elementary registers ($RDM_{1p} \ldots RDM_{jp} \ldots RDM_{jm}$) connected in parallel to the corresponding serial link ($LS_j$). However, a level of supplementary parallelism and a better electrical or optical adaptation of the connection is obtained in a variation in which each memory bank $RAM_p$ is connected to each processor $CPU_j$ by a serial link $LS_{jp}$ in a point to point manner.

In order to provide transfer performance at least equal to those of conventional systems with a parallel bus, the system according to the invention is preferably synchronized by a clock of a frequency F at least equal to 100 megahertz. The memory shift registers ($RDM_j$) and processor shift registers ($RDP_j$) may very simply be of a type adapted to present a shift frequency at least equal to F.

In the case of very high frequencies (particularly greater than 500 megahertz with current technology), the registers may be divided into sub-registers of a lower shift frequency, and then multiplexed.

The invention also relates to a multiport serial memory component, suitable for equipping the multiprocessor system previously described, in order to simplify the fabrication. This component, which may have different applications, is constituted by an integrated circuit comprising a random access memory (RAM) of a pre-determined width corresponding to a block of information (bi), a set of shift registers ($RDM_1 \ldots RDM_j \ldots RDM_n$), each of a capacity corresponding to the size of the memory, an internal parallel bus (BUSI) connecting the access of the memory and the shift registers, a selection logic of a shift register (LSR) adapted to validate the connection on the internal bus between the memory and a predetermined shift register, and a set of external input/output pins for the input of addresses to the memory (RAM), for the input of addresses to the selection program (LSR), for the input and the validation of transfer commands in read or write of a block of information (bi) between the memory (RAM) and the shift registers ($RDM_j$), for the input of a clock signal to each shift register ($RDM_j$), for the input bit by bit of a block of information (bi) to each shift register ($RDM_j$) and for the output bit by bit of a block of information from each shift register ($RDM_j$).

This component may have its behavior controlled via parameters through the addition of configuration registers ($RC_1, RC_2, \ldots$) permitting particularly a choice of sizes of blocks of information ($b_i$) and of diverse modes of operation of the shift registers.

BRIEF DESCRIPTION OF THE DRAWINGS

The invention having been described in its general form, is illustrated by the description which follows in reference to the accompanying drawings which show without limitation several embodiments. In these drawings, which form an integral part of the present description.

DETAILED DESCRIPTION

Figure 1:
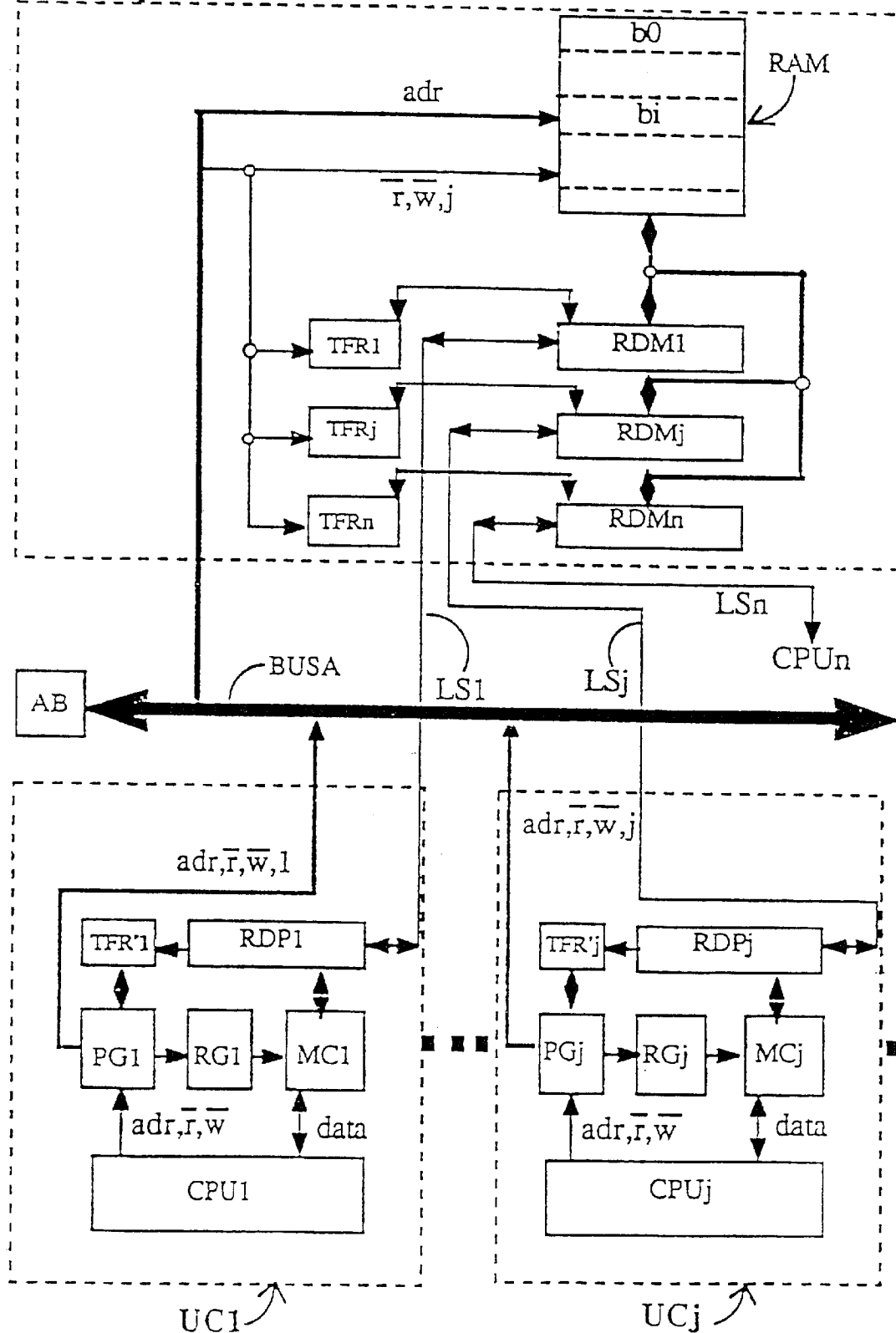
FIG. 1 is a block diagram of a first embodiment of the multiprocessor system according to the invention.

The apparatus presented in the form of a block diagram in FIG. 1 is a multiprocessor system having n treatment processors $CPU_1 \ldots CPU_j \ldots CPU_n$. Shown in this figure are two treatment processors CPU1 and $CPU_j$ with their associated logic. Each of these treatment processors is of a conventional type, for example "Motorola 68020" or "Intel 80386" . . . and with peripheral interfaces and being provided with a virtual memory device.

The apparatus comprises a central random access memory RAM provided in a conventional manner from integrated memory circuits: in particular dynamic RAM "INTEL," "NEC," "TOSHIBA" . . . of 256 Kbits, 1 Mbits, 4 Mbits . . . depending upon the application. This memory is organized in blocks of information $b_o \ldots b_j \ldots$ of predetermined size t (usually 256 bits per 2 Kbits) and the access front of said memory corresponds to the size of one block.

The central memory is connected in parallel to n shift registers $RDM_1 \ldots RDM_j \ldots RDM_n$ called memory registers, each memory register having the size t of one block of information. Each of these registers is provided from high speed technology ("GaAs"), one block able to be loaded or unloaded in one cycle of the central memory RAM. The number n of registers is equal to the number of processors $CPU_j$.

A cache memory $MC_j$ is associated in a known manner with each processor $CPU_j$. Each cache memory comprises a conventional high speed random access memory, of low capacity with respect to the central memory RAM. A directory $RG_j$ and a management processor $PG_j$ are, in a traditional manner, connected to the cache memory and to the treatment processor for managing the information flowing in the cache memory.

Further, in the system of the invention, a shift register $RDP_j$ called a processor register is connected by its parallel port to each cache memory $MC_j$. Each processor register $RDP_j$ is of a size corresponding to that of a block bi and of a structure similar to that of the memory registers $RDM_j$.

Figure 4:
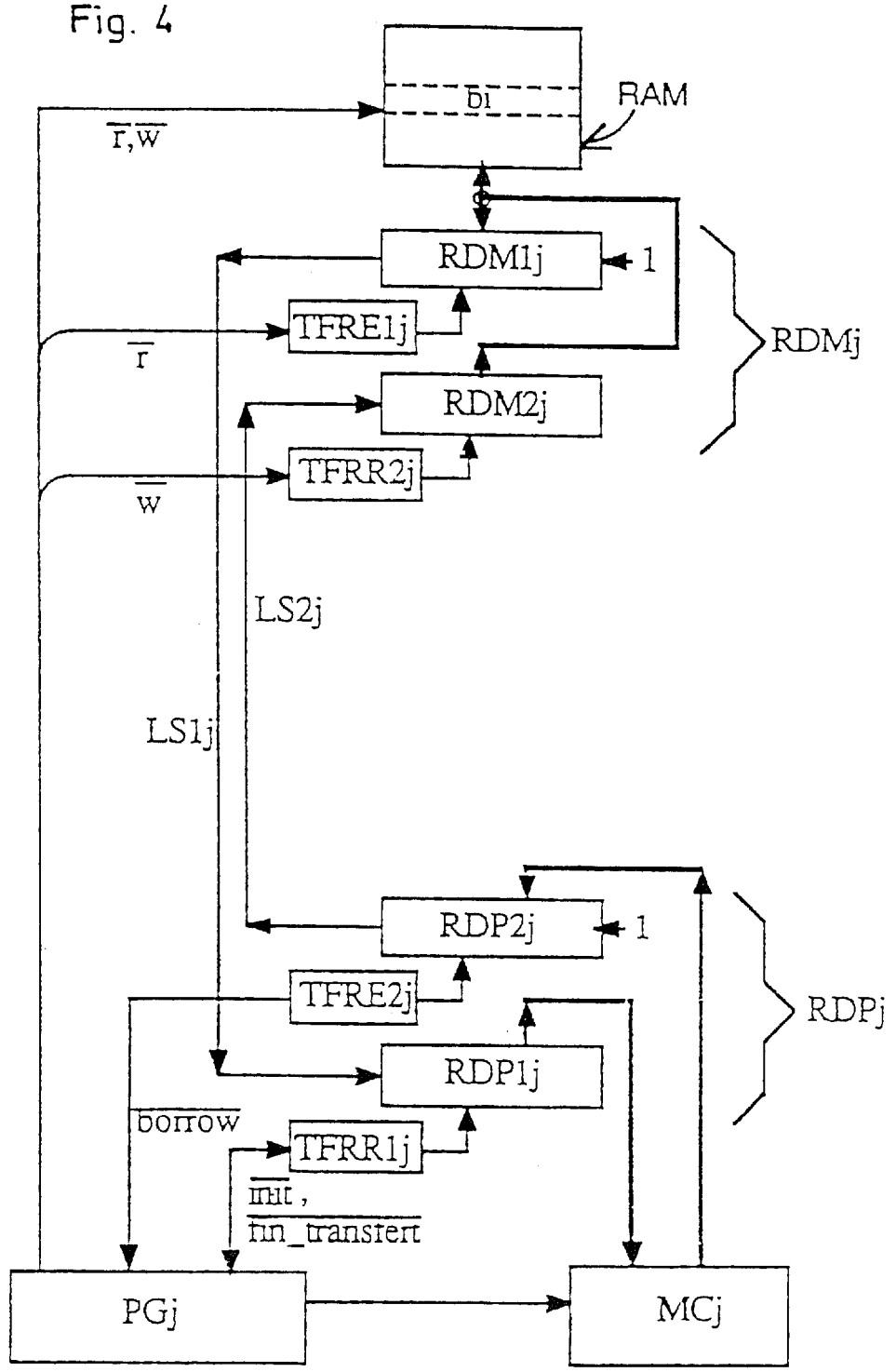
Figure 5:
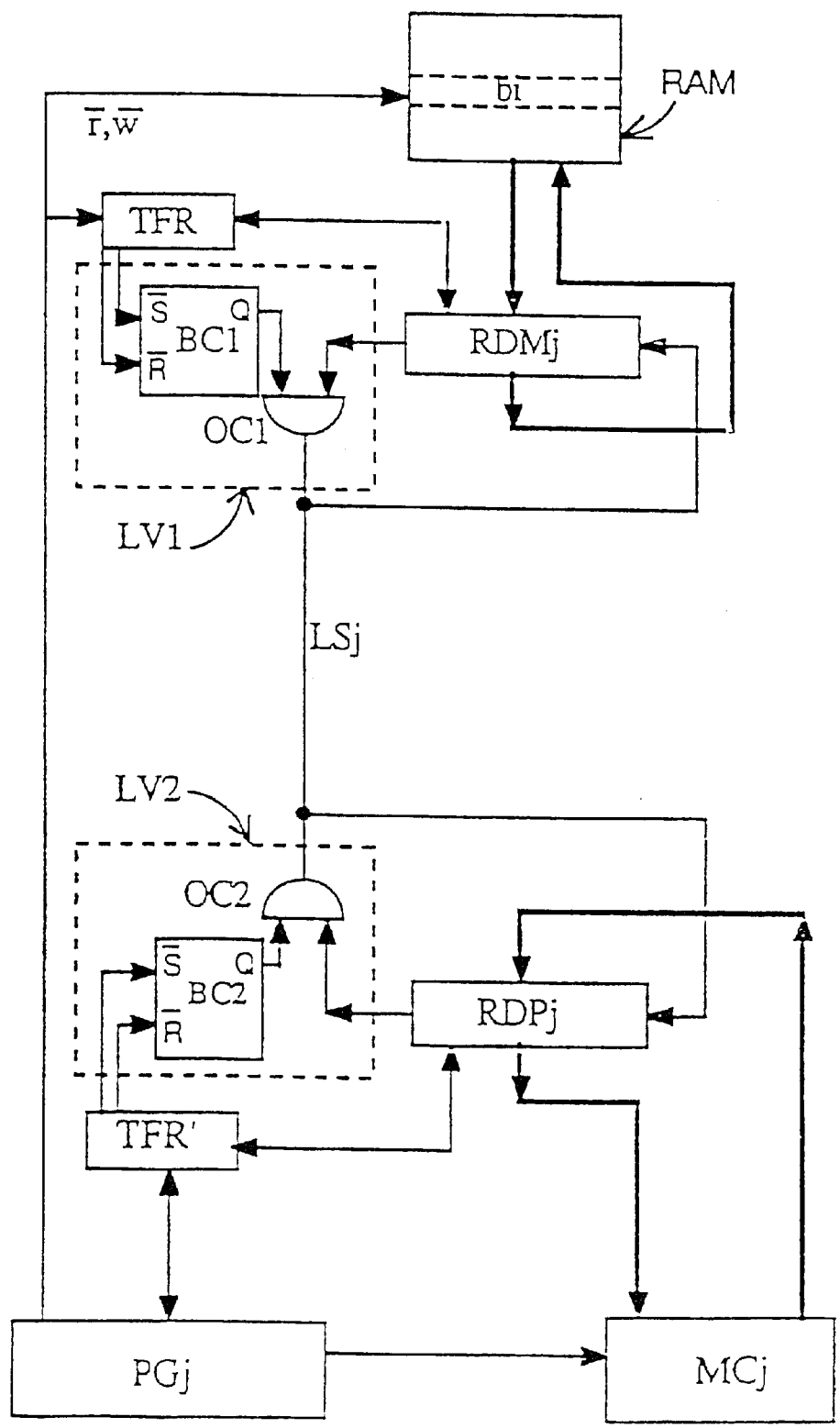

Each memory register $RDM_j$ is connected by its serial port to the serial port of a processor register $RDP_j$ by a serial link $LS_j$. Examples of the provision of this serial link, which may comprise a bidirectional link or two unidirectional links, are illustrated in FIGS. 4 and 5. The control of the transfer of the blocks $b_i$ between corresponding registers $RDM_j$ and $RDP_j$ is assured by the transfer logic $TRF_j$ and $TFR'$ which are associated in a symmetrical manner with the memory register $RDM_j$ and with the processor register $RDP_j$. One embodiment of these transfer logics (known in themselves) is detailed in FIG. 3.

The central memory RAM, memory shift registers $RDM_1 \ldots RDM_n$, and associated transfer logics $TFR_1 \ldots TFR_n$ comprise a functional assembly called a "multiport serial memory" MMS. The treatment processor assembly $CPU_j$, cache memory $MC_j$, management directory for the cache $RG_j$, management processor of the cache $PG_j$, shift register processor $RDP_j$ and the associated transfer logic $TFR'_j$ constitute a "functional" assembly called a "central unit" $UC_j$.

Further, the system comprises means for communication of addresses of blocks of the processors $CPU_j$ to the central memory RAM, comprising in the example a common parallel communication bus BUSA on which are connected the processors $CPU_j$ (though their management processor $PG_j$) and the central memory RAM.

Access to the bus BUSA is controlled in a conventional manner by a bus arbitrator AB.

The general operation of the architecture hereinabove defined is as follows:

A processor $CPU_j$ carries out its own program comprised of instructions, which are found in the form of words in the central memory RAM with extracts in the associated cache memory $MC_j$. On these instructions of the program, the processor $CPU_j$ is brought either to read the words of data which themselves are found in the central memory RAM or in the cache memory $MC_j$ in the form of extracts, or to write the words of data in the central memory RAM and in the cache memory $MC_j$.

Each operation of a processor $CPU_j$ (called a "request") requires the furnishing of the address adr of the word concerned, the nature r,w of the operation (read, write) and the data exchange of the word concerned.

Each request of a word activates the processor $PG_j$ which then consults in a conventional manner the directory of the cache $RG_j$ which indicates if the block bi containing the word concerned is present in the cache memory $MC_j$ and if it is the frame of the block in the cache memory where the block searched for is found.

If the block bi containing the word concerned is in the cache memory $MC_j$, then in case of reading, this word is read in said cache memory and sent to the processor $CPU_j$. In case of writing, the word furnished by the processor $CPU_j$ is written in the cache memory: the memory transaction is terminated.

If the block containing the word concerned is not in the cache memory $MC_j$, then a reading of the block bi into the central memory RAM is necessary. Two cases may be produced.

First Case

The cache memory $MC_j$ has at its disposal at least one free block, determined by the processor $PG_j$ with the help of status bits associated with each input of the directory $RG_j$. In this case, the processor $PG_j$ is requesting, in a conventional manner, the bus BUSA while referring its demand to the bus arbitrator AB. This latter grants, in turn, the bus BUSA to the processor $PG_j$ which acknowledges while writing to the central memory RAM, the block read in the memory being loaded into the register $RDM_j$, identified by the origin $j$ of the call. The end of the reading cycle translates by the liberation of the bus BUSA and the activation of the transfer with the serial link $LS_j$ permitting the transfer of the contents of the memory register $RDM_j$ in the processor register $RDP_j$. The end of the transfer activates the writing in the cache memory $MC_j$ of the contents of the processor register in the placement of the block reserved for this effect and the transaction may terminate as before.

Second case

The cache memory $MC_j$ does not have its disposal free placement then, by a conventional algorithm, a placement of the cache is made a candidate for receiving the block requested. Two situations may be encountered:

The block contained in the candidate position has not been modified since its installation: it is simply eliminated while freeing the frame of the block by a simple writing of a status bit in the directory ($RG_j$) and the transaction may proceed as before.

The block contained in the candidate position has been modified and an operation of the central memory is required. For this fact, the management processor $PG_j$ transfers the candidate block to the processor register $RDP_j$, activates the transfer of the processor register $RDP_j$ to the memory register $RDM_j$, then requests the common bus BUSA while referring its request to the arbitrator AB. When the arbitrator admits the bus to the management processor $PG_j$, the latter activates a write command which has the effect of transferring the contents of the memory register $RDM_j$ to its position in the central memory RAM. The operation of the memory RAM is terminated and the transaction may continue as before.

Thus, in the apparatus of the invention, the exchanges between the treatment processors $CPU_j$ and their cache memory $MC_j$ and associated logics $RG_j$, $PG_j$, are carried out in a conventional manner. By contrast, the transfers of blocks between central memory RAM and cache memories $MC_j$ proceed, no longer by a common parallel bus, but by the serial links $LS_j$ dedicated to each treatment processor $CPU_j$, the common bus BUSA only serving for the transfer of the addresses and having thus a considerably reduced traffic.

It is known that, for conventional common bus architectures, a modelization studied by "PATEL" ("Analysis of Multiprocessors With Private Cache") JANAK H. PATEL, IEEE Transactions on Computers, Vol C.31, No. 4, April, 1982) has led to the following approximate formula giving the efficiency U as a function of the number of processors present:

$$U = \frac{1}{1 + m(W + tf)}$$

where the efficiency U is the average rate of utilization of each treatment processor, m is the probability for a treatment processor to make a memory request, not present in its the cache memory (this probability m=α·Pa is proportional to the miss ratio Pa of the information in the cache memory and a factor α which is a function of the power of the treatment processor expressed as a percentage of the memory requests):

W is the average waiting time of the common bus, which is a function of the number of processors, tf is the transfer time of a block from the central memory to a cache memory.

The hypothesis from which this formula has been established show that it is applicable to the architecture according to the invention, with a level of approximation comparable to the level of approximation of the formula for conventional common bus architecture.

It is thus possible to compare the performances of the two types of architecture while assuming that the components common to the two architectures are of identical characteristics.

Figure 2:
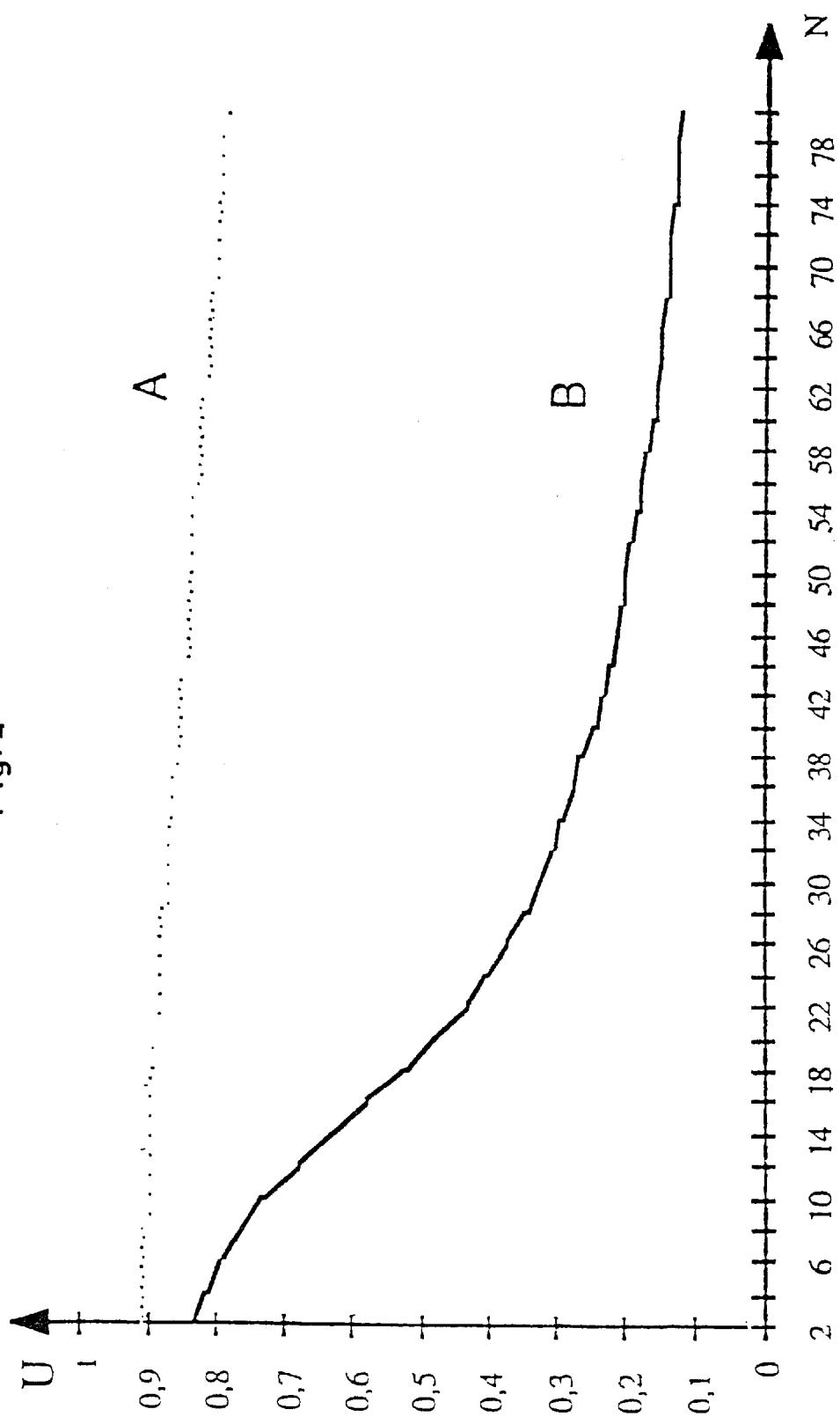
FIG. 2 is a diagram giving the calculated performance curve of this system (A) and, by way of comparison, the corresponding curve (B) for a conventional multiprocessor architecture with a common bus.

FIG. 2 gives the curves obtained of the efficiency U as a function of the number n of processors for the following parameters, the parameters common to the two systems being identical, and all of a usual value:

size of block $b_i$=64 bytes, size of word for the parallel transfer on common bus=4 bytes, central memory RAM access time=100 nanoseconds, cycle time of the bus BUSA=50 nanoseconds, serial transfer frequency=500 Mhz, miss ratio Pa=0.005 (cache memory of 16 bytes), power factor of the processors: $\alpha$=0.5.

It is established by comparing the curves A (architecture of the invention) and B (conventional architecture) that the architecture according to the invention has an efficiency clearly superior to the conventional architecture. The architecture of the invention permits putting in place a number of processors very superior to the conventional common bus architecture which, in practice, cannot exceed about ten processsors. For example, in the conventional case, an efficiency of 0.75 is obtained at the tenth processor, whereas it is obtained for more than 80 processors in the case of the invention.

Figure 3:
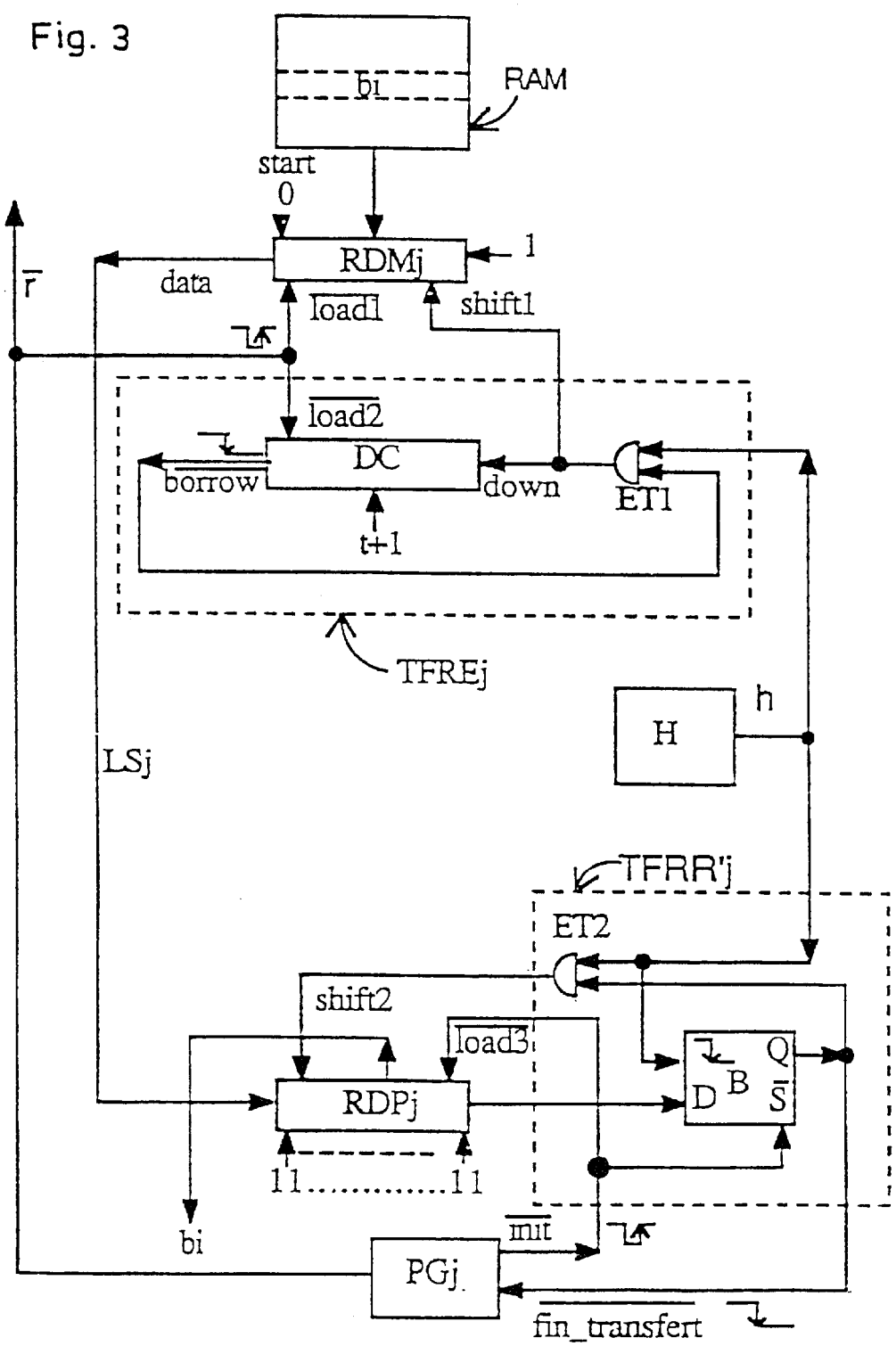
FIGS. 3, 4 and 5 are detailed logic schematics of functional units of the system of FIG. 1.

FIG. 3 presents an embodiment of a transfer logic $TFR_j$ or $TFR'_j$ permitting the transfer of a block bi of information from a memory register $RDM_j$ to a processor register $RDP_j$ (the inverse transfer is assured by the symmetric means not shown in this figure). Each logic $TRF_j$ or $TFR'_j$ comprises a part for control of the output $TFRE_j$ and $TFRE'_j$, and a part for control of the reception $TFRR_j$ and $TFRR'_j$ which are activated in a crossed manner (output $TFRE_j$ activated in synchronism with the reception $TFRR'_j$). The system comprises a clock generator H the frequency of which fixes the speed of transmission and furnishes the clock signal h at the output part $TFRE_j$ and at the reception part $TFRR'_j$.

In the output part $TFRE_j$ a countdown register DC receiving at its load input $\overline{load}_2$ the reading signal $\overline{r}$ from the management processor $PG_j$ permits allowing to pass t+1 clock pulses h through a logic gate ET1 controlled by a pass to zero signal "$\overline{borrow}$", the output of this gate ET1 being connected to the input of the "down" counting of the countdown device DC and to the shift input shift1 of the memory register $RDM_j$.

In the reception part $TFRR'_j$ a flip flop B is connected by its data input D to the serial output of the processor register $RDP_j$, the clock input clk of this flip flop being connected to the clock H for receiving the signal h. An initialization signal "$\overline{init}$" furnished by the management processor $PG_j$ is connected to the input $\overline{S}$ of the flip flop B and to the loading input $\overline{load3}$ of the processor register $RDP_j$. The output Q of the flip flop transmits a control signal $\overline{end\text{-}transfer}$ to the logic gate ET2, permitting the clock signal h to pass toward the shift input shift2 of the processor register $RDP_j$. This control signal is also delivered to the management processor $PG_j$ for indicating the end of transfer of the block.

The operation of the assembly is as follows: the management processor $PG_j$, after having obtained access to the central memory RAM via the bus BUSA, carried out its reading of the block bi while furnishing the address of the block concerned and the reading signal r. This signal releases the activation of the output part $TFRE_j$: the trailing edge of the reading signal r provokes the loading of the block bi into the memory register $RDM_j$ while activating the signal $\overline{load1}$ and the loading of the value t+1, corresponding to the size in bits of the block bi plus one supplementary bit called "start", into the countdown register DC by the signal $\overline{load2}$. This has for effect to reset to 1 the signal $\overline{borrow}$ and authorize the transfer clock H to furnish, through the logic gate ET1 conditioned by this borrow signal, t+1 clock pulses h: these pulses have for effect to shift by the input shift1 t+1 bits from the memory register $RDM_j$ and to cause to wait for the value 0 from the down input to the countdown device DC: the signal $\overline{borrow}$ is reset to zero and locks the operation of the output part $TFRE_j$.

Thus, the serial connection $LS_j$ initially having the logic wait state 1, transfers the start bit 0, then the t bits of the block bi, and then returns to the logic wait state 1, the latter bit sent being the value 1 forced on the serial input of the memory register $RDM_j$.

As a preliminary to the reading demand, the management processor $PG_j$ has initialized the receiving part $TFRR'_j$ while activating the $\overline{init}$ signal which has the effect of loading the processor register $RDP_j$ with t bits to 1 through the input $\overline{load3}$ and to set the output Q of the flip flop B to the logic state 1 by the input $\overline{S}$. This output Q then validates the logic gate ET2 which allows the clock signal h to pass toward the input shift2 of the processor register RDP1. At each clock pulse this processor register furnishes a bit on its serial output which is stored in the flip flop B. The first bit 0 which is presented has the effect of setting to zero the output Q of the flip flop B and locking the clock signal h on the gate ET2. This first bit 0 being the start bit which precedes the block bi, this latter is then trapped in the processor register $RDP_j$ when the management processor $PG_j$ is notified of the change of state of the flip flop B by the $\overline{end\text{-}transfer}$ signal: the management processor $PG_j$ need only come to read this block bi on the parallel output of the register $RDP_j$.

The writing of a block bi to the central memory RAM requires the presence of a logic $TFRE'_j$, identical to the logic $TFRE_j$, associated with the processor register $RDP_j$, and a logic $TFRR_j$, identical to the logic $TFRR'_j$, associated with the memory register $RDM_j$. In this case, the signal init of the logic $TFRR_j$ is connected to the writing signal $\overline{w}$: the liberation of the memory register $RDM_j$ automatically rearms the receive logic $TFRR_j$.

This embodiment of the transfer control logic is only one possible example: the transmitter register may be in permanent shifting itself, and the receiver register activated for t pulses of the clock on detection of the start bit at the beginning of transfer.

The clock H may be connected to two registers, or two local independent clocks may be used, the synchronization being obtained in a conventional manner by an introduction of synchronization.

The system shown in FIG. 4 comprises a divided memory shift register $RDM_j$ and $RDM_2$, a divided processor shift register $RDP1_j$ and $RDP2_j$, two unidirectional serial links $LS1_j$ and $LS2_j$, one connecting the memory register RDM1 to the processor register $RDP_j$ in such a manner as to transmit the contents of the first to the second, the other connecting the memory register RDM2$_j$ to the processor register RDP2$_j$ in such a manner as to transmit the contents of the second to the first, and the associated logics for the control of the transfer: TFRE1$_j$ for RDM1; TFRR2$_j$ for RDM2; TFRE2$_j$ for RDP2$_j$; TFRR1$_j$ for RDP1$_j$.

For reading a block of information bi into the central memory RAM, the management processor PG$_j$ initializes by the signal $\overline{\text{init}}$ the logic TFRR1$_j$ associated with the processor register RDP1$_j$, then activates its demand to read to the memory RAM by the read signal r. This signal activates the logic TFRE1$_j$ associated with the memory register RDM1$_j$: this assures the transfer on the link LS1$_j$ of the block bi of information. The end of the transfer is detected by the logic TFRR1$_j$ associated with the processor register RDP1$_j$ which notifies the management processor PG$_j$ of the arrival of the block bi by the signal $\overline{\text{end}_{13}\text{transfer}}$. The management processor; PG$_j$ thus transfers the contents of the processor register RDP1$_j$ into the cache memory MC$_j$.

For writing a memory block bi, the management processor PG$_j$ loads the processor register RDP2 with the block b$_i$ concerned extracted from the cache memory MC$_j$, which activates the transfer of this block on the link LS2$_j$. The transfer logic TFRR2$_j$ associated with the memory register RDM2$_j$ assures the good reception of this block. The management processor PG$_j$ is notified of the end of transfer by the change of state of the signal $\overline{\text{borrow}}$ issued from the transmission logic TFRE2$_j$. The management processor PG$_j$ then carries out its writing request which becomes effective at the time of activation of the writing signal w. This has the effect of transferring the contents of the register RDM2$_j$ into the central memory RAM and to reinitiate for a next transfer the logic TFRR2$_j$.

This system authorizes a simultaneous transfer of blocks in two directions and permits treating more rapidly the defects of blocks bi in the cache memory MC$_j$ when the latter is saturated. It authorizes also the operation of a conventional mechanism for anticipation of the reading of blocks.

In another embodiment shown in FIG. 5, the connection LS$_j$ comprises a single bidirectional link provided at each extremity with a validation logic, LV1 and LV2, each of these constituted by a two input open collector logic gate, OC1 and OC2 respectively, one of the inputs being connected to the serial output of the memory register RDM$_j$ for the gate OC1 and the processor register RDP$_j$ for the gate OC2, the other input being connected to the output Q of a control flip flop BC1 and BC2; each of these is connected by its inputs $\overline{S}$ and $\overline{R}$ to the transfer logic TFR for the flip flop BD1 and TFR' for the flip flop BD2.

Readings and writings are carried out in an exclusive manner, at the sole initiative of the management processor PG$_j$.

A reading memory activates the reading signal $\overline{r}$ which causes the setting to 1 of the flip flop BC1 by its input $\overline{S}$, the resetting to zero being controlled, on the input R by the transfer logic TFR at the end of the transfer of the block.

A writing memory releases a mechanism identical to the validation logic LV2.

Other combinations of registers/links are possible, and in the case of a bidirectional link, bidirectional shift registers may in particular be used, receiving a signal of the direction of transfer. This solution leads to the use of shift registers more complex in logic, therefore a priori less efficient in speed of transfer.

The speed of transfer coming to be very high, the shift registers RDM$_j$ and RDP$_j$, their associated control logic TFR and TFR', the validation logics LV1 and LV2, are selected from a fast technology (ECL, GaAs), and synchronized by a clock of a frequency F at least equal to 100 MHz.

Another solution with multiplexed registers shown in FIG. 21 permits, as will be understood below, considerably reducing the quantity of efficient, and therefore costly logic necessary.

Figure 6:
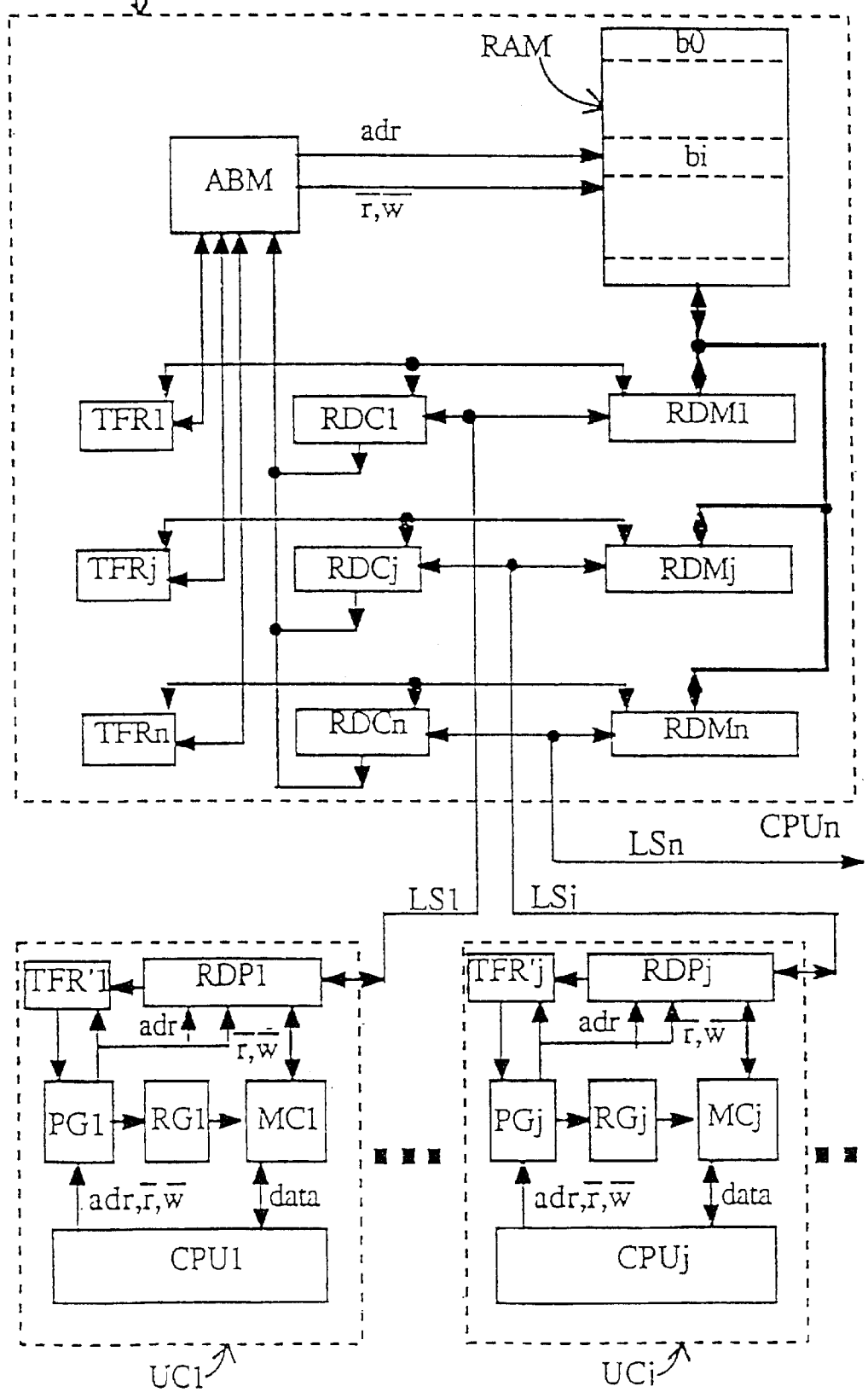
FIG. 6 is a block diagram of another embodiment of the system.

The multiprocessor of FIG. 1 was provided at the same time with a common communications bus for block addresses and data transfer serial links. FIG. 6 shows, as a variation, a multiprocessor system of the same general principle, but in which data and addresses transfer by the serial connections, in the absence of a common bus.

This system comprises, besides the memory registers RDM$_j$, complementary shift registers RDC$_j$ able to store the addresses of blocks called for and controlled by a logic of the type TFR$_j$. Further, an access management arbitrator ABM is connected to the central memory RAM and to the complementary registers RDC$_j$ by their parallel output. Each logic TRF$_j$ is connected to this arbitrator ABM of conventional structure. The management processor PG$_j$ of each cache memory MC$_j$ is connected to one part of the parallel input of the processor register RDP$_j$, in order to have access thereto in writing.

For reading a block b$_i$ in central memory RAM, the management processor PG$_j$ places the address of the block called for and the nature of the request (by a prefix bit: 1=read, 0=write) in the part of the register processor RDP$_j$ to which it is accessible, which has the effect of initializing the transfer of this information. The transfer logic TRF$_j$ detects the end of the transfer on the complementary register RDC$_j$ and activates a demand operation toward the arbitrator ABM. This is loaded for serializing and treating the read requests of the block in the central memory RAM while going to read the address of the block requested in the complementary register RDC$_j$ corresponding to the transfer logic selected by the arbitrator ABM, then in going to read the block in the central memory RAM which will then be loaded into the memory register RDM$_j$ and transmitted as before.

For writing a block in the central memory RAM, the management processor PG$_j$ chains the transmission of the address then of the block to be written through the processor register RDP$_j$. The complementary register RDC$_j$ receives at once the address and the nature of the request.

The transfer logic TRF$_j$ analyzes this request and validates the reception of the block in the memory register RDM$_j$ from the fact of the nature of the request (write). The transfer logic TRF$_j$ is notified of the end of the transfer of the block b$_i$ and then transmits its request for service to the arbitrator ABM. This request is treated, in turn, by the arbitrator which activates the writing of the block bi into memory.

Figure 7:
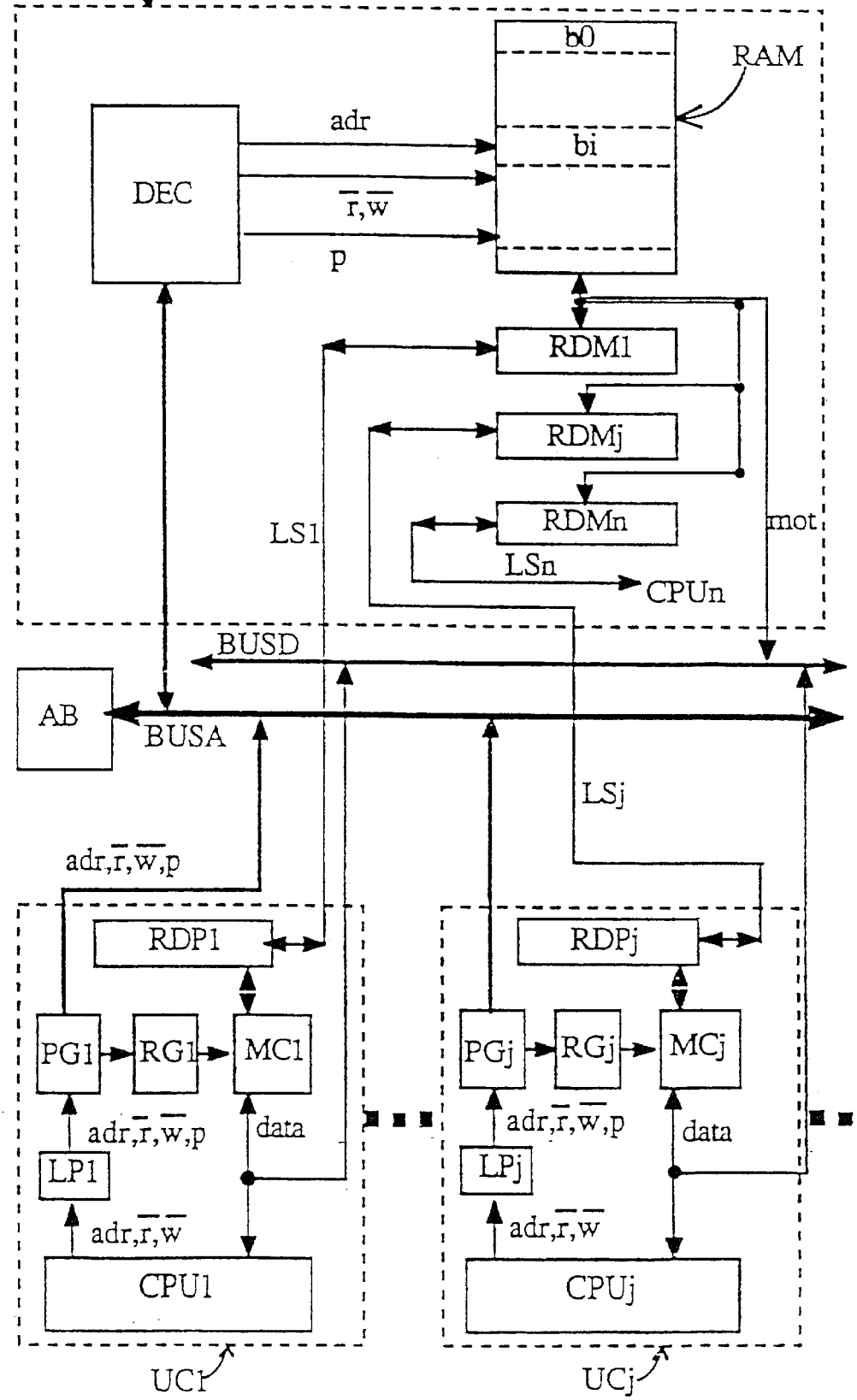
FIG. 7 is a block diagram of a system of the type as that of FIG. 1, provided with shared data management means.

Further, the multiprocessor system shown in FIG. 7 comprises means for management of the shared data, permitting treating, in a static manner, the classical problem of maintaining the coherence of the shared data. This system comprises the resources of the system of FIG. 1 (with the same reference characters) with the following logic and supplementary resources:

A special parallel communication bus for words BUSD connects the processors CPU$_j$ and the central memory RAM. A partition logic LP$_j$ is associated with each processor CPU$_j$. Each logic LP$_j$ is constituted in a conventional manner by an assembly of coupled register-comparators connected in parallel on the address bus adr of the processor CPU$_j$, in order to provide a division of the memory space of the central memory RAM in the zone of non-shared data and shared data, said logic $LP_j$ delivering to this effect a signal p (indicating the nature of the data, shared or not). A decoding logic DEC is associated with the central memory RAM, itself arranged to be controlled by a writing by word or by block by said logic DEC.

Figure 8:
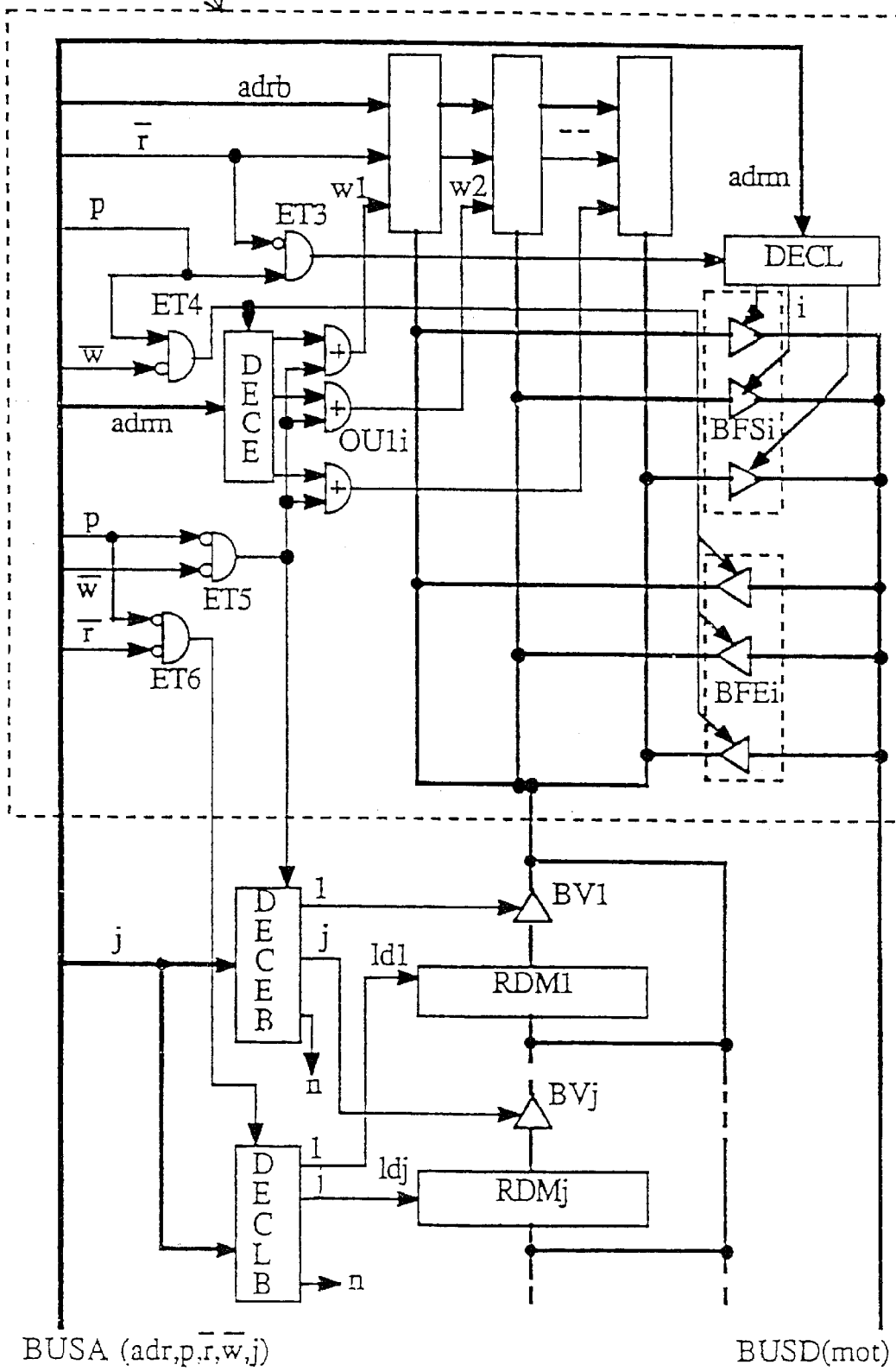
FIG. 8 is a detailed logic diagram of a sub-assembly of the system of FIG. 7.

The decoding logic DEC is detailed in FIG. 8 and comprises a decoder DECL, receiving on its data input the address portion word adrm of the address adr, and connected through its validation input to the output of a logic gate ET3, each output i of said decoder being connected to a validation buffer of the type $BFS_i$. The logic gate ET3 receives on its inputs the signal p and the inverted signal $\bar{r}$. A decoder DECE is connected through its validation input to the output of a logic gate ET4, its outputs being connected to an assembly of logic gates $OU1_i$ of a number equal to the number of words in a block. The logic gate ET4 receives on its inputs the signal p and the inverted signal $\bar{w}$. The output of the gate ET4 is also connected to an assembly of validation input buffers $BFE_1$, $BFE_i$... The central memory RAM may be controlled in writing by word. Each clipped word thus defined has its writing control input $w_i$. The output of each logic gate $OU1_i$ is connected to the input w1 of each clipped word of the central memory RAM.

FIG. 8 shows further the detail of the addressing of the memory registers $RDM_j$, which comprises in the first place a decoder DECEB connected through its data input to the common bus BUSA, in order to receive the number $j$ of the processor concerned by the request of the central unit $UC_j$. This decoder DECEB is connected through its validation input to the output of a logic gate ET5 and through its outputs 1, 2 ... $j$ to the validation buffers BV1, $BV_j$... The logic gate ET5 receives on its inputs the signal p and the inverted signal $\bar{w}$. In the same manner, a decoder DECLB is connected through its data input to the field $j$ of the common bus BUSA and through its outputs 1, 2 ... $j$ of this decoder DECLB are connected to the loading inputs ld1, $ld_j$ of the memory shift registers $RDM_j$. The logic gate ET6 receives on its inputs the signal p and the inverted signal $\bar{r}$.

The operation of the system is as follows: at each reference memory, the processor $CPU_j$ provides an address on its address bus adr, and the nature of the request: reading $\bar{r}$ or writing $\bar{w}$. It waits for a datum in case of reading and furnishes a datum in case of writing. The address adr traverses the partition logic $LP_j$, which indicates, by the signal p, if the address adr belongs to a zone of non-shared data (p=0) or of shared data (p=1). In the first case, the request is directed to the management processor $PG_j$ and is treated according to the mode of operation described in reference to FIG. 1. In the second case, the request is directly sent through the common bus BUSA. The bus address adr permits supplementary address streams permitting identification of the word concerned: the address adr is comprised of a block address part adrb and a word address part adrm. Thus, after agreement of the bus arbitrator AB, the central memory RAM receives either a block transaction request (p=0) and in this case, only the block part adrb of the address adr is significant, or a word transaction request (p=1) and, in this case, the whole address adr (block adrb and word adrm) is significant.

In case of a reading block, p=0 and r=0, the logic gate $ET_6$ validates the decoder DECLB which delivers a loading signal $LD_j$ to the shift register $RDM_j$, permitting loading into the latter the block read into the central memory RAM with the address adrb by the reading signal $\bar{r}$.

In the case of a writing block, p=0 and w=0, the logic gate ET5 validates the decoder DECEB which delivers a validation signal to the buffer $BV_j$, permitting the contents of this register to be presented to the central memory RAM and to thus be written to the address adrb, the output of the logic gate ET5 providing the block writing signal. This latter is broadcasted on the writing inputs w1, $w_i$... to the clipped words of the central memory RAM across the logic gates $OU1_i$.

In case of word reading, p=1 and r=0, the logic gate ET3 validates the decoder DFCL which delivers a validation signal to the buffer $BFS_i$, permitting the requested word (address adrm in the block adrb) of which the reading is assured by the signal $\bar{r}$, to be directed toward the special communication bus BUSD. This word is recovered directly by the processor $CPU_j$ on its data input data.

In case of writing word, p=1 and w=0, the logic gate ET4 validates the decoder DECE which furnishes on its output $i$ a signal directed across the logic gate $OU1_i$ toward the writing input $w_i$ of the clipped word of the central memory RAM concerned. This signal present at the input $w_i$ permits writing in this sole clipped word the word furnished by the processor $CPU_j$ on the data bus BUSD. The contents of this bus are presented in parallel on all the clipped words of the central memory RAM, due to an activation of the buffers $BFE_i$ by the signal emitted by the logic gate ET4.

An essential characteristic of the architecture of the invention is to present a minimum load of requests on the common bus BUSA. In the architecture shown schematically in FIG. 7, the common bus BUSA is driven by the block addresses and the word addresses. The frequency of the word address requests is a function of the rate of shared data and may lead to a saturation of the common bus BUSA.

Figure 9:
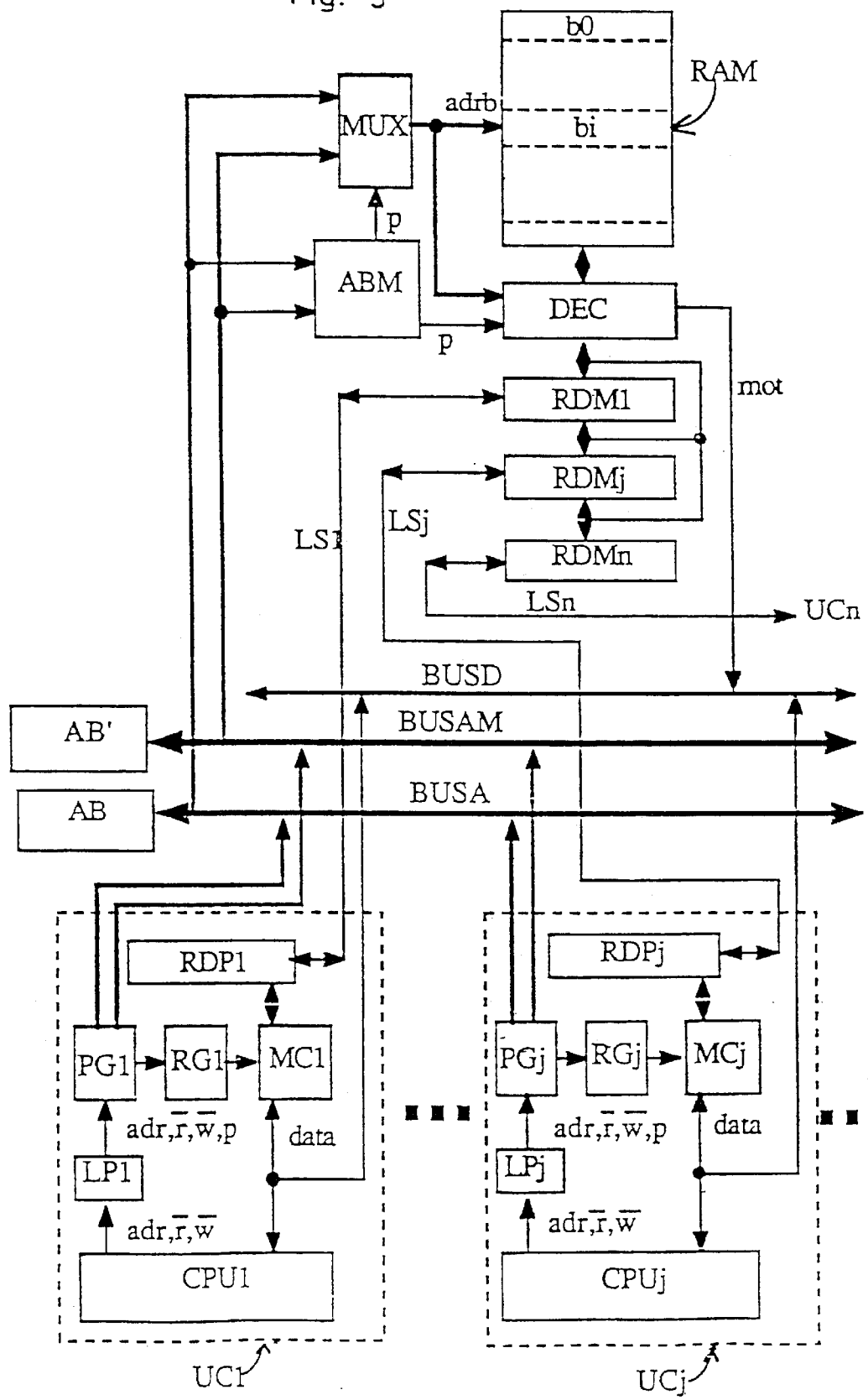
FIG. 9 is a block diagram of a system analogous to that of FIG. 7 with a variation in the shared data management means.

FIG. 9 shows a variation of a solution for reducing this load. The system provided comprises, in addition to the resources of FIG. 7, a bus BUSAM for the word addresses, an arbitrator AB' for arbitrating the access conflicts to the bus BUSAM, an arbitrator ABM for arbitrating the access conflicts in the origin of the busses BUSA and BUSAM, and connected to a multiplexer MUX which in turn is connected through its inputs to the two busses BUSA and BUSAM.

The operation of this system is as follows:

If the request concerns non-shared data (p=0), any lack of information generates a memory request of the block type which transfers through the common bus BUSA.

If the request relates to shared data (p=1), the request is directed toward the common bus BUSAM. Thus, the central memory RAM may receive simultaneous requests on the two busses BUSA and BUSAM, which must then be arbitrated. The arbitrator ABM allows, in a conventional manner, access to the central memory RAM by one of the two requests and reconstructs the signal p from the origin of the request (p=0 for BUSA, p=1 for BUSAM). The signal p thus controls both the multiplexer MUX which allows the signals from the bus concerned to pass through the request, and the decoding logic DEC: one is thus situated as in the preceding system.

It will be noted that the load is shifted from the common bus to the central memory RAM, since the rate of request at the level of this latter remains the same, and its cycle time is of the same order of magnitude or even greater than that of the bus cycle.

Figure 20:
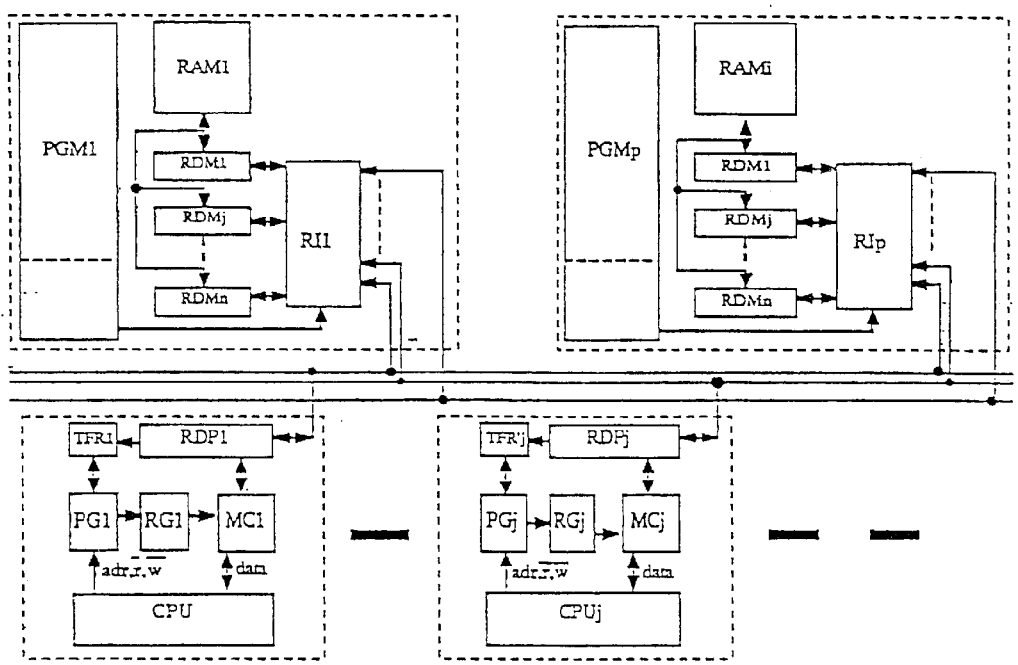
FIG. 20a is a block diagram of a preferred embodiment, in which the central memory is organized into several memory banks.
FIG. 20b is a variation of the architecture shown in FIG. 20A.
Figure 20:
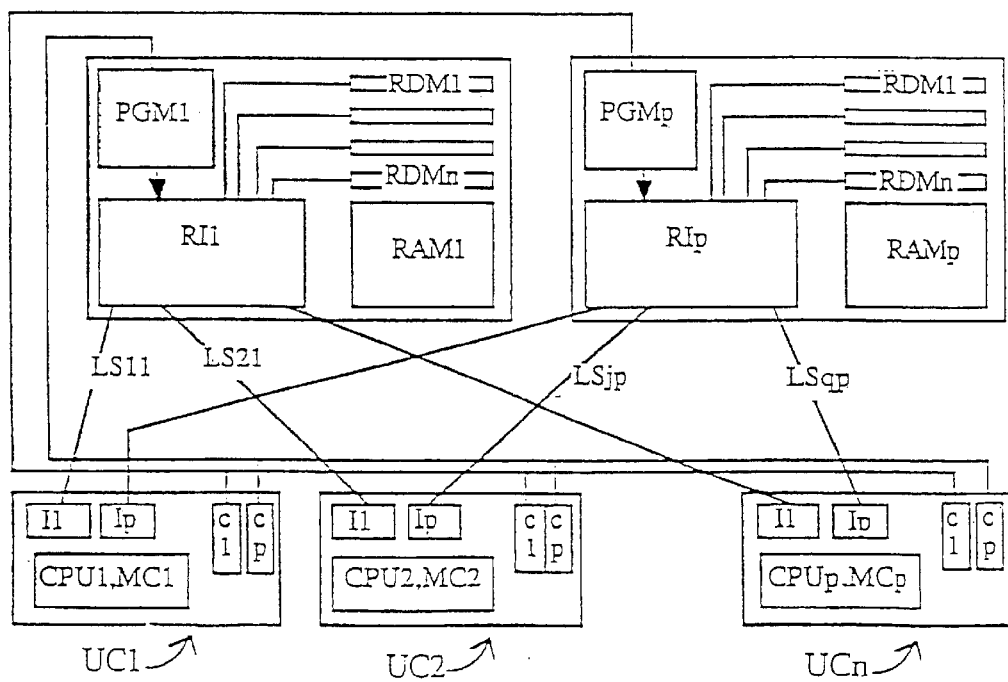

This solution is therefore only of interest if the central memory RAM comprises central independent memory banks organized according to the description given later with reference to FIG. 20: several transactions may in this case, if they affect different memory banks, take place simultaneously.

Figure 10:
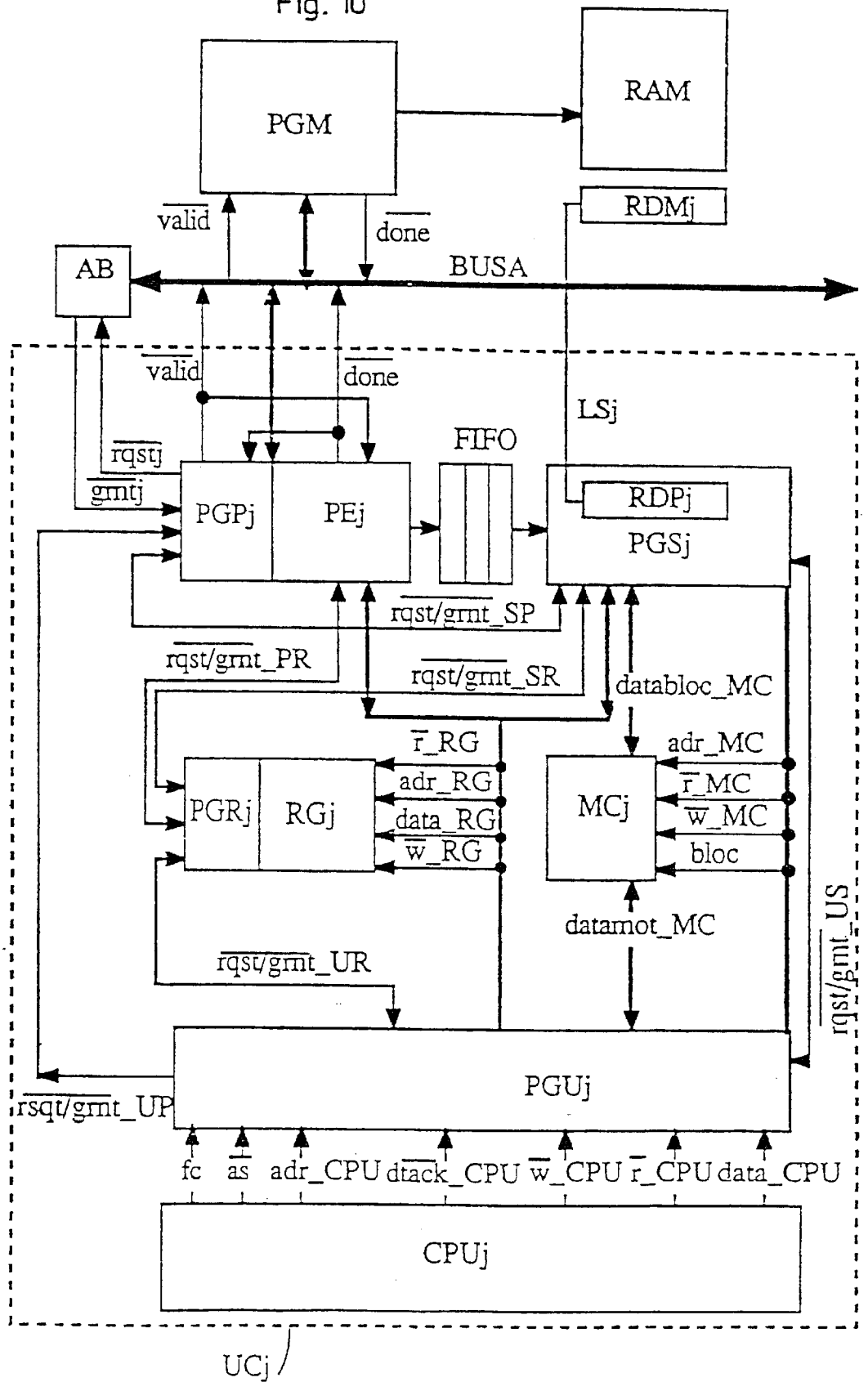
FIG. 10 is a block diagram of an analogous system, provided with a different shared data management means.

FIG. 10 presents a block diagram of an embodiment of the architecture according to the invention, in which the problem of shared data is treated in a dynamic fashion. To this end, the system conforming to this embodiment comprises a snooping processor with a bus $PE_j$, coupled to a management processor with a parallel link $PGP_j$. A management processor with a serial link $PGS_j$ is connected to a snooping processor $PE_j$ by a waiting line $FIFO_j$. A management processor for requests from the central unit $PGU_j$ is connected, first to the treatment processor $CPU_j$, and to the parallel link management processors $PGP_j$ and the serial link manager $PGS_j$. The logic corresponding to the management processor $PG_j$ of each cache memory is in this embodiment split into various processors presented hereabove. The access to the cache memory $MC_j$ and to its directory $RG_j$ is controlled by a management processor with a directory and a cache $PGR_j$.

Finally, a management processor PGM of the central memory RAM is connected to the bus BUSA and to the central memory RAM, and to its shift registers $RDM_j$.

The functioning of the assembly is as follows:

Each transaction on the common bus BUSA corresponds to a reading or writing request of the block $b_i$. The snooping processors of the bus $PE_j$ are activated by each reading request of the block of data. This operation provided in the same cycle through all of the snooping processors is going to permit protecting the uniqueness of the value of the shared data. The snooping processor $PE_j$ arranges an access to the directory $RG_j$. The function of the application used for the management of the cache memory $MC_j$ is in the described embodiment of the direct application type. Each element of the directory is a descriptor of the block which contains a "tag" field (address of the block), conventional status bits of the block: a validation bit v and a modification bit m and two supplementary bits a for noting that the block is known by the cache memory but still in the course of transfer on the serial link, f for indicating that the block is in the waiting line FIFO and thus avoiding its being placed several times.

The management processor memory PGM arranges a waiting line AFIFO of addresses of blocks bi and of addresses of processors, accessible in an associative manner, and a status directory of blocks constituted by 2 bits per block ro and rw indicating the possible states of the following block:

ro=rw=0: block not yet broadcast,
ro=1; rw=0: block already broadcast in reading:
one or several copies of this block being found in the cache memories.

The evolution of block status bits is the following, different according to the nature of the request of the treatment processor $CPU_j$:

If the processor $CPU_j$ makes a request for reading non-shared data (program space or explicitly non-shared data): the block is marked already broadcast in reading (ro=1; rw=0) central memory part at the time of transfer of said block from the central memory RAM to the register $RDM_j$ and marked non-modified (m=0), cache memory part in the same cycle of operation of the directory $RG_j$ of the cache memory (valid block). The snooping processors have not reacted to the request on the common bus (the request having been made with the indication "shared" or "non-shared").

If the processor CPU: makes a request for reading data (a priori shared), the common bus BUSA is occupied for the time of passage of the information of addresses and of the type requested, the time of their treatment by the processor PGM and the snooping processors of the common bus $PE_j$. In the central memory RAM, this block may be:

1. Not yet broadcast: ro=rw=0. It is then transmitted to the central unit $UC_j$ and takes the non-modified state.

2. Already broadcast in reading: ro=1; rw=0. It is then transmitted to the central unit $UC_j$. Its state does not change.

3. Already broadcast in writing: ro=0; rw=1.

The open copy of this block is found in a cache memory $MC_i$. The snooping processor associated with this cache memory has noted the request of the central unit $UC_j$ at the time of passage of the address on the common bus and has attempted its transfer to the central memory RAM as soon as possible on the serial link $LS_i$. While waiting its effective transfer, the memory management processor PGM places the request while waiting in the associative waiting line which comprises a number of elements equal to the number of processors.

At the time of the reading request on the common bus BUSA, all the snooping processors $PE_i$ have reacted by consulting the directory $RG_i$ associated with their cache memory $MC_i$. The common bus BUSA is only freed when all the snooping processors $PE_i$ have had their access to the management directory $RG_i$, which assures the same state of the block in the entire system. The processor which has the current copy in its cache memory carries out, as soon as its serial link is free, the transfer of this block into the register $RDM_i$ and makes a writing request for the block on the common bus which will have the effect to free the request while waiting in the associative file AFIFO and carrying out the operation of the status bits of the block.

The operation of the block only needs a writing to the central memory RAM without activation of the snooping processor.

If the processor $CPU_j$ requests the writing of a datum in a block present in its cache memory $MC_j$ with a non-modified state, an informative writing request must be emitted on the common bus BUSA as it is possible that other cache memories $MC_i$ have this block with the same status. These other memories must be informed of the change of state. To this end, all the snooping processors $PE_i$ (activated by the informative writing broadcast on the common bus BUSA) consult their management directory and invalidate this block, while the central memory notes in the same time the change of state of this block as well as the parallel management processor $PGP_j$, in the management directory $RG_j$. The liberation of the common bus BUSA by all the snooping processors and the central memory RAM permits the processor $CPU_j$ to provide the writing in its cache memory $MC_j$, the broadcasting of the status bit of the management directory $RG_j$ having been carried out.

If one central unit is awaiting access to the bus BUSA for the same request on the same block, its request is transformed in simple writing and then follows the protocol of the request of the block in writing.

If the processor $CPU_j$ requests writing of a datum in a block absent from the cache memory $MC_j$, this block is read into the central memory RAM and brought into the cache memory $MC_j$ in order that the writing will be carried out effectively.

In the central memory RAM, this block may be:

1. Not yet broadcast: ro=rw=0. The block is then emitted on the serial connection $LS_j$ to the cache memory $MC_j$. It takes the states ro=0; rw=1 in the central memory and the modified state (m=1) in the cache memory, 2. Already broadcast in writing: ro=1; rw=0.

The block is sent on the serial connection $LS_j$ to the cache memory $MC_j$. It takes the states ro=0, rw=1 in the central memory, and the modified state (m=1) in the cache memory. At the time of a request on the common bus BUSA, the snooping processors $PE_i$ have noted the request and invalidated this number in the block in their cache memory $MC_i$.

3. Already broadcast in writing: ro=0; rw=1.

The request is placed in the associative waiting line AFIFO and the common bus BUSA is liberated.

The snooping processor $PE_i$ of the cache memory $MC_i$, winner of the current copy, activates as soon as possible the transfer of the block requested from its cache memory $MC_i$ to the central memory RAM. This block is then invalidated in the cache memory $MC_i$.

The central unit $UC_j$ makes a writing request to publish the block in the two following cases:

a) the cache memory is saturated and the purging of a block requires sending this block into the central memory, b) a central unit $UC_i$ is awaiting a block the only current copy of which is found in the cache memory $MC_j$. The snooping processor notes the request and provides as soon as possible the purging of this block.

The central memory side RAM, each request for a writing operation entails a consultation with the associative waiting line AFIFO, and in the case of discovery of a central unit $UC_i$ awaiting this block, the loading of this block into the shift register $RDM_i$ and the publishing of the status bits corresponding to this block. This type of writing request does not drive the snooping processors.

The directory management processor $PGR_j$ which is added in this embodiment, permits the execution of the algorithm mentioned above, while coordinating the accesses to the directory of the cache memory $MC_j$ which receives the requests of three asynchronous functional units:

1. The treatment processor $CPU_j$, in order to read the instructions of the program during execution and to read or write the data manipulated by this program, 2. The common bus BUSA, in order to maintain the coherence of the data in the cache memory $MC_j$, 3. The serial link $LS_j$, in order to load/un-load a block of information from/to the central memory RAM.

Each of these requests arrives at the management directory $RG_j$ of the cache memory. The serialization of these accesses on said management directory permits the good operation of the algorithm mentioned above with coherence of information in the cache memories. Thus there is obtained a strong coupling of the requests at the level of the management directory $RG_j$ but the synchronization which must exist at the level of the treatment of these requests is sufficiently low to consider an asynchronous functioning of the treatment logic for these requests, which leads to the following functional segmentation:

The interface of each processor $CPU_j$ and of its auxiliaries ($PGS_j$, $PGU_j$) with the common bus BUSA is composed of two parts having a mutually exclusive functioning: the management processor for the parallel link $PGP_j$ is loaded to request of the common bus BUSA to the request of the request management processor $PGU_j$ or of the management serial link $PGS_j$ and to control the common bus BUSA in writing. The snooping processor of the bus $PE_j$ assures the snooping function, which returns to control the common bus BUSA in reading. It frequently reaches the directory $RG_j$ of the cache memory $MC_j$.

The management processor of the serial link $PGS_j$ manages the interface with the serial link $LS_j$. It assures the loading and unloading of blocks of information bi upon request of the request management processor $PGU_j$ and of the snooping processor of bus $PE_j$. It reaches less frequently the cache memory $MC_j$ and the corresponding management directory $RG_j$.

The request management processor $PGU_j$ assures the following of the requests issued from the processor $CPU_j$. It reaches very frequently into the cache memory $MC_j$ and the management directory $RG_j$. This interface includes possible "MMU" logic (memory management unit) usually associated with the treatment processor $CPU_j$.

The management processor $PGR_j$ of the management directory $RG_j$ is the arbitrator charged with granting access to the cache memory $MC_j$.

FIGS. 11, 12, 13, 14, 15, 16 and 17 show by way of examples the embodiments of the various functional units of the system of FIG. 10. The designations of signals or inputs and outputs of these units are chosen in a conventional manner. The signals of the same functionality which are generated in each functional unit from a base signal will be designated by the same reference, for example: dnp=nonshared data, dl=reading request, $ma_j$=updating, de=demand writing, $e_i$=informative writing. The system has several processors and the indicia 'j' used heretofore refers to a current processor and its auxiliaries; for alleviating the description, this indicia has been omitted in these figures and it will be understood that the description which follows is directed at each of the functional units which are connected with each treatment processor. Further, the signals denoted x_YZ define the name and the origin of the signal in the case where YZ=RG, MC, UC, and the source and the destination of the signal in the other cases, with Y and Z representing: U=PGU, R=PGR, P=PGP or PE, S=PGS.

Figure 11:
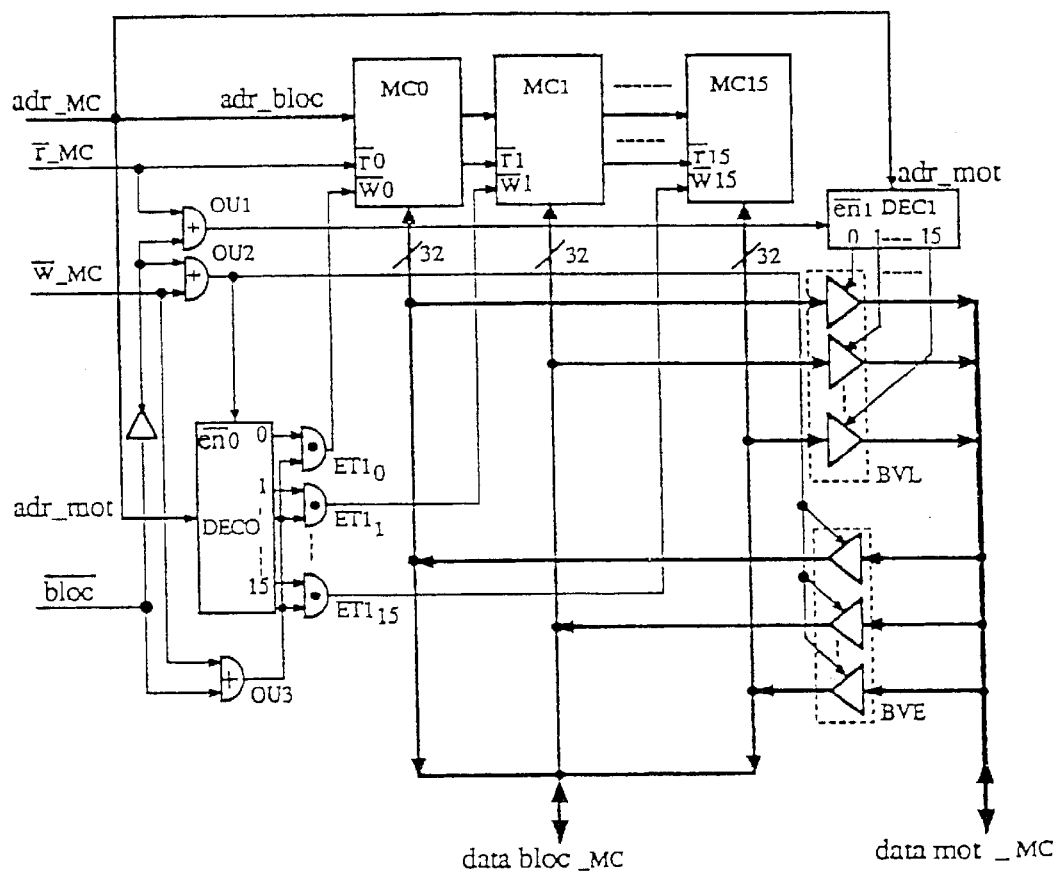
FIGS. 11, 12a, 12b, 12c, 12d, 13, 14, 15, 16 17 are detailed logic schematics of the functional units of the processor system of FIG. 10.

The cache memory MC shown in FIG. 11 has, for example, a capacity of 16 K. It is organized in 16 modules of high speed read write memory of 1 k MC0, . . . $MC_{15}$, each accessible on a front of 4 bytes: the address bus of the cache memory MC (noted adr_MC) comprises a partial block address adr_block and a partial word address in the block adr_mot. The address bus adr_MC comprises 14 lines, permitting addressing the 16 k of the cache memory MC. The partial $adr_{13}$ bloc comprises 8 lines permitting addressing the 256 block sites in the cache memory, and the adr_mot part 6 lines permitting addressing a word in the block the size of which is, in the example, 64 bytes.

The address part $adr_{13}$ bloc is connected to the address input of each of the memory modules $MC_0$ . . . $MC_{15}$. The word address part adr_mot is connected to the input of two decoders DEC0 and DEC1 (only the 4 significant bits of the address bus adr_mot are used: the address is an byte address and the cache has an access unit which is a word of 4 bytes) The read signal $\overline{r}$_MC is delivered to each of the read inputs of the memory modules $MC_0$ . . . $MC_{15}$ and to one of the inputs of a logic gate OU1. The other input of this logic gate OU1 receives the inverted signal $\overline{bloc}$. The writing signal $\overline{w}$_MC is delivered to one of the two inputs of the logic gates OU2 and OU3. The logic_gate OU2 receives on its other input the inverted signal $\overline{bloc}$. The logic gate OU3 receives on its other input the signal $\overline{bloc}$. The output of the logic gate OU1 is connected to the validation input $\overline{en1}$ of the decoder DEC1, and the output of digit position i of this decoder DEC1 activates a validation buffer BVL of digit position i. The output of the logic gate OU2 is connected to the validation input $\overline{en0}$ of the decoder DEC0 and to the validation buffers BVE. The output of the logic gate OU3 is connected to the logic gates $ET1_0$ . . . $ET1_{15}$, which receive on their other input the output of the corresponding logic position of the decoder DECO. The output i of each logic gate $ET1_0$ . . . $ET1_{15}$ is connected to the writing input $\overline{w}_0$ . . . $\overline{w}_{15}$ of each memory module $MC_0$ . . . $MC_5$. A data bus connects each memory module $MC_0$ . . . $MC_{15}$ to one of the validation buffers BVL and to one of the validation buffers EVE. The output of the buffers RVL and the input of the buffers RVE receive in parallel a data bus datamot_MC (connected to the request management processor PGU).

The operation of the example of the cache memory described above is as follows:

Case 1

The request comes from the management processor of the serial link PGS. This case is signaled by the presence of a logic state zero on the signal bloc.

In reading the cache memory, the management processor of the serial link PGS presents on the address bus adr_MC the address of placement of the block to be read (in this case, only the part $adr_{13}$ bloc of the bus adr_MC is used) and activates the reading signal $\overline{r}$_MC. At the end of the access time, the block is available on the bus databloc_MC.

In writing the cache memory, the management processor of the serial link presents on the address bus adr_MC the address of placement of the block to write, on the data bus databloc_MC the data to be written there, and activates the line $\overline{w}$_MC. The zero state of the signal bloc directs the signal $\overline{w}$_MC toward the writing control inputs of the cache memory modules $MC_0 \ldots MC_{15}$, via the logic gates OU3 and ET1. The information presented on the data bus databloc_MC is written in the cache memory at the end of the writing.

Case 2

The request come from the request management processor PGU of the treatment processor CPU. This case is signaled by the presence of a logic state one on the signal bloc.

In the reading cache memory, the management presents on the bus adr_MC the address of the word requested, and activates the reading signal $\overline{r}$_MC. The block corresponding to the part $adr_{13}$ bloc is read in cache memory, and the word requested is directed, via one of the validation buffers BVL, toward the data bus datamot_MC. The validation buffer BVL concerned is activated by the output of the decoder DEC1 corresponding to the word address adr_mot requested.

In writing the cache memory, the management processor PGU presents on the bus adr_MC the address of the word to be written, on the data bus datamot_MC the data to be written, and activates the writing signal $\overline{w}$_MC. The data presented on the bus datamot_MC is distributed on each cache memory module, via the buffers BVE validated by the writing signal. The writing signal $\overline{w}$_MC. is then presented to only the memory module concerned. It is delivered to the output of the decoder DECO corresponding to the address adr_mot concerned.

In the embodiment described above, the problems of access in an byte and double byte, and of access in double byte and a word on both sides of two memory modules are resolved in the same manner as in conventional information systems and are not described here.

Figure 12A:
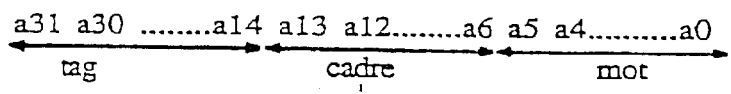

FIGS. 12a, 12b, 12c and 12d show, by way of example, the characteristics of a management directory of the cache RD and of an associated management processor PGR. FIG. 12a illustrates the logic structure of the address adr_RG in the hypothesis of a space addressing on 32 bits and with the characteristics of the cache memory described previously. The field -tag-, composing the address block, is coded on 18 bits. The field -cadre- is coded on 8 bits and permits addressing the 256 positions of the block of the cache memory MC. The last 6 bits define the address word in the block, in a byte unit.

Figure 12B:
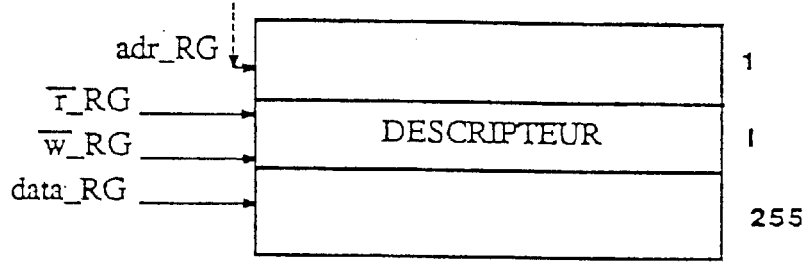

FIG. 12b shows the structure of the management directory of the cache RG, which is a simple fast read/write memory of 256 words of 22 bits. Each word of the address i contains the descriptor of the block written in the position i of the cache memory.

Figure 12C:
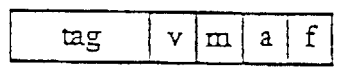

FIG. 12c shows schematically the structure of the descriptor which comprises:
- a field tag of 18 bits, defining the address of the block in the position or frame of the current block,
- the validation bit v,
- the modification bit m,
- the wait-for-end-of-transfer bit a,
- the wait-for-purge bit f.

Figure 12D:
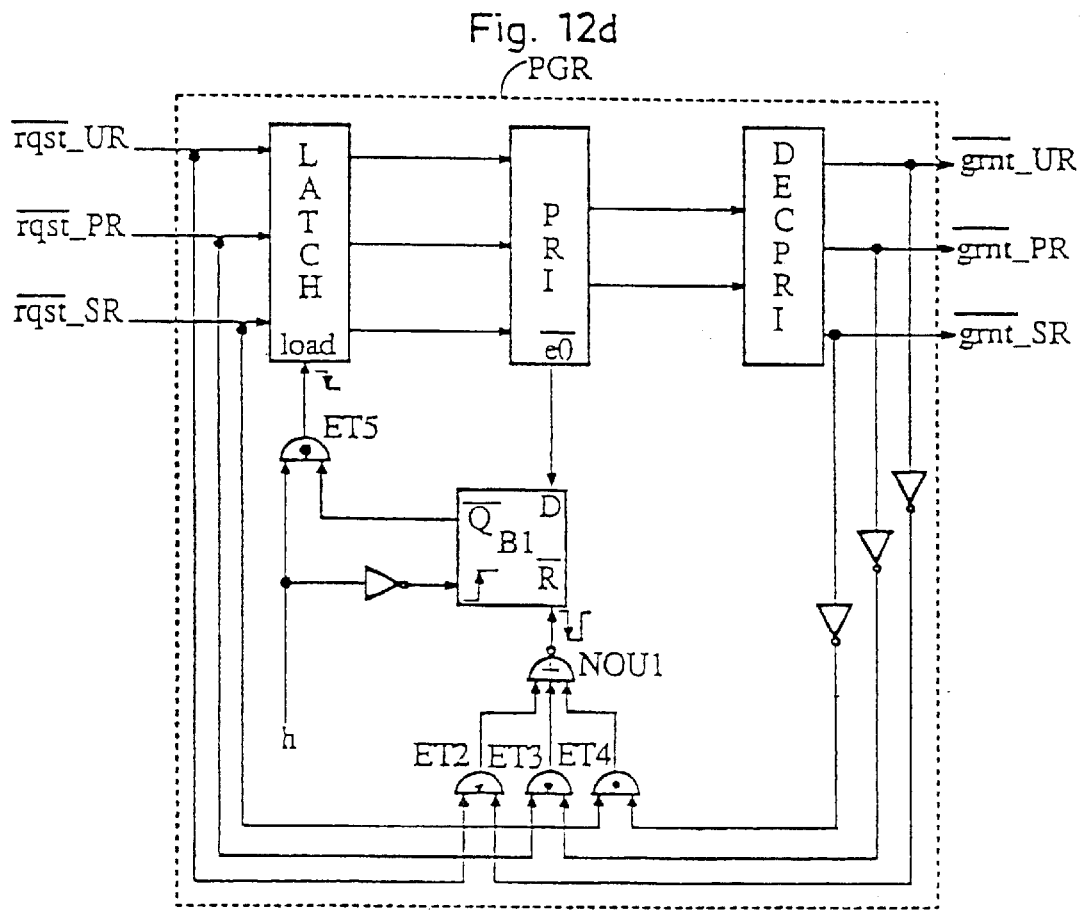

FIG. 12d provides the structure of the processor PGR, which is nothing other than a conventional arbitrator with fixed priority.

This arbitrator comprises a register LATCH, of which three inputs receive respectively the signals $\overline{rqst}$_UR, $\overline{rqst}$_PR, $\overline{rqst}$_SR, also delivered respectively to the logic gates ET2, ET3, ET4. The corresponding outputs of the register LATCH are connected to the inputs of a priority encoder PRI, the outputs of which are connected to the inputs of a decoder DECPRI. The outputs of the digit position corresponding to those of the register LATCH are connected to the signals $\overline{grnt}$_UR, $\overline{grnt}$_PR, $\overline{grnt}$_SR as well as, in an inverted manner, respectively to the inputs of the logic gates ET2, ET3, ET4. The outputs of the logic gates ET2, ET3, ET4 are connected to the inputs of the logic gate NOU1. The output of the logic gate NOU1 is connected to a flip flop B1, which receives on its input D the output $\overline{e0}$ of the priority encoder PRI. The assembly of the apparatus is synchronized by a general clock which delivers a signal h to one of the inputs clk of a logic gate ET5, and in a reverse manner, to the clock input of the flip flop B1. The output $\overline{Q}$ of the flip flop B1 is connected to the other input of the logic gate ET5. The output of the logic gate ET5 is connected to the input load of the register LATCH.

The operation of this arbitrator is as follows: in the absence of any request on the lines $\overline{rqst}$, the flip flop B1 stores permanently the state of the line $\overline{e0}$, inactivates, and thus validates through the logic gate ET5 the loading of the register LATCH.

The arrival of a signal $\overline{rqst}$ provokes the latching of the clock and the activation of the signal $\overline{grnt}$ associated with the signal $\overline{rqst}$, until deactivation of the latter: the arbitrator is fixed in its state during the entire transaction in progress.

Figure 13:
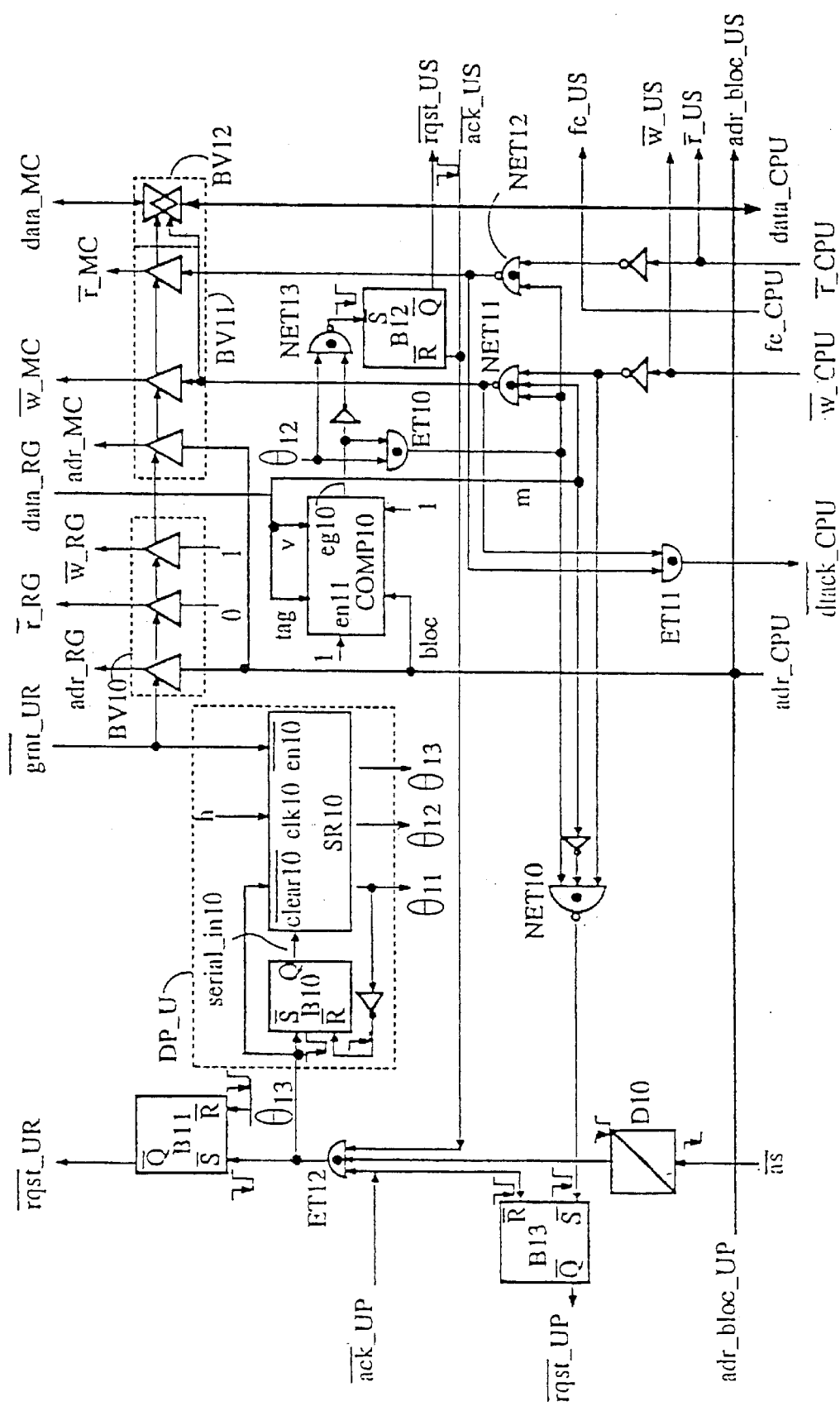

The request management processor PGU, represented in FIG. 13, constitutes an interface between the treatment processor CPU and:
- the various processors with which it must exchange information: parallel management processor PGP, serial management processor PGS, directory management processor PGR, and
- the management directory of the cache memory RG and the cache memory MC.

The treatment processor CPU unlatches the activity of the request management processor PGU while activating the signal $\overline{as}$ ("address strobe"). This signal validates the address bus adr_CPU, the reading signals $\overline{r}$_CPU and the writing signals $\overline{w}$_CPU as well as the function lines fc_CPU of the treatment processor CPU. The treatment processor CPU is then placed in a waiting state until discharge of the request by the signal $\overline{dtack}$_CPU.

The signal as is connected to the input of a differentiator circuit DI0. The output of this circuit is connected to one of the three inputs of a logic gate ET12, the two other inputs receive respectively the signals $\overline{ack}$_US and $\overline{ack}$_UP. This latter signal is also delivered to the input R of a flip flop B13. The input $\overline{S}$ of the flip flop B13 receives the output of a logic gate NET10. The output of the logic gate ET12 is connected to the input $\overline{S}$ of a flip flop B11, at the input $\overline{S}$ of the flip flop B10 and at the input $\overline{clear10}$ of a shift register SR10. The output $\overline{Q}$ of the flip flop B11 furnishes the signal $\overline{rqst}$_UR.

The flip flop B11 receives on its input $\overline{R}$ the inverted phase θ13 and the flip flop B10 the inverted phase θ11. The output Q of the flip flop B10 is connected to the serial input serial_in10 of the register SR10. The shift register SR10 receives on its input clk10 the clock signal -h- and on its validation input en10 the signal $\overline{grnt\_UR}$.

The activation of the signal as releases the operation of the differentiation circuit D10. The pulse produced by this circuit across the logic gate ET12, sets to the logic state one of the flip flops B10 and B11 by their input S, and also carries out the resetting to zero of the shift register SR10 by its input $\overline{clear10}$.

The flip flop B10 and the shift register SR10 constitute the logical sub-assembly "phase distributor" DP_U. The activation of this phase distributor is released by the setting to one of the flip flop B10 and the resetting to zero of the shift register SR10. If the shift register is validated by the presence of a level zero on its input $\overline{en10}$, then the next pulse of the clock h on the input clk of the shift register produces the shifting of one step of said register.

The logic state one of the flip flop B10 is propagated on the output θ11 of the shift register SR10 by its serial input serialin10. The output Q11, called phase θ11, inverted, resets the flip flop B10 to zero through its input R. Thus, one single bit i, introduced to the shift register SR10 on each activation of the phase distributor DP_U. At each clock pulse h, this bit comes to be shifted in the shift register SR10 and produce the consecutive disjointed phases θ11, θ12, θ13.

The setting of the flip flop B11 to the logic state of one causes activation of the signal $\overline{rqst\_UR}$. This signal is emitted to the destination of the directory management processor PGP. This latter, as soon as possible, comes to accord access to the management directory RG and to the cache memory MC while activating the signal $\overline{grnt\_UR}$, which comes to validate the assembly of passage buffers BV10, BV11 and BV12 situated respectively on the busses of the management directory and on the busses of the cache memory. This signal $\overline{grnt\_UR}$ also validates the phase distributor which then produces sequentially the phases θ11, θ12, θ13. The phase θ11 corresponds to a time-out permitting reading of the descriptor of the block requested by the treatment processor CPU in the management directory RG, addressed by the field frame with the address adr_CPU and connects to the bus adr_RG through the passage buffers BV10. The signal $\overline{r\_RG}$ is always active on the input of a buffer BV10, the signal $\overline{w\_RG}$ always inactive on the input of a buffer BV10. At the start of the time out, the descriptor is returned to the processor PGU via the bus date_RG. The part tag of this descriptor and the validation bit v are delivered to one of the comparison inputs of a comparator COMP10, the other input being connected to the part tag of the address adr_CPU. The bit opposite the validation bit v is always at one. The comparator COMP10 is validated permanently by the presence of a level of one on its input en11.

The time of access of the management directory RG and the frequency of the clock h are in a ratio such that at the end of the phase θ11, the output eg10 of the comparator COMP10 is positioned and furnished the information "the block requested is present in the cache memory or absent from the cache memory."

If the block requested is present in the cache memory MC (eg10=1), then the signal eg10, delivered to one of the two inputs of the logic gate ET10, furnishes a signal calibrated by the phase θ12, present on the other input of the logic gate ET10.

This calibrated signal present on the output of the logic gate ET10 is connected to the inputs of the logic gates NET10, NET11, NET12.

The logic gate NET10 receives on its inputs, in addition to the output of the logic gate ET10, the inverted status bit m coming from the descriptor, and the inverted writing request signal $\overline{w\_CPU}$.

The activation of the logic gate NET10 corresponds to the state "request writing of a word in a block present in the cache and which has not yet been modified (m=0)". The output of the logic gate NET10 is connected to the input S of a flip flop B13. The activation of the logic gate NET10 sets the flip flop B13 in the logic state of one, which releases an informative writing request by the line $\overline{rqst\_UP}$ to the management processor of the parallel link PGP. The address of the block concerned is furnished by the lines adr_bloc_UP, derived from the lines adr_CPU.

The request management processor PGU has terminated the first part of its task: the management directory RG and the cache memory are freed by deactivation of the signal $\overline{rqst\_UR}$, as a consequence of the arrival of the inverted phase θ13 on the input R of the flip flop B11.

The informative writing mechanism is described in the paragraph "management processor of the parallel link PGP", and has for effect to place the requested block in the modified state (m=1) or the invalid state (v=0). One will note that the liberation of the management directory RG and the cache memory MC by the request management processor PGU is necessary in order that the management processor of the parallel link PGP may have access thereto. The end of the "informative writing" operation is signaled to the request management processor PGU by the activation of the signal $\overline{ack\_UP}$, which has the effect of resetting the flip flop B13 to zero and activating, through the logic gate ET12, the flip flop B12, the flip flop B11 and the phase distributor: the cycle initially activated by the signal as is reproduced, but the consequential sequence of the activation of the gate NET10 is not reproduced a second time in this request cycle.

The logic gate NET11 receives on its inputs, other than the output of the logic gate ET10, the status bit m from the descriptor, and the inverted signal of the writing request $\overline{w\_CPU}$. The activation of the gate NET11 corresponds to the state "writing request in a block present in the cache and which has already been modified. The output of the gate NET11 is connected, through one of the buffers BV11, to the writing signal $\overline{w\_MC}$ of the cache memory MC. This signal permits writing in the cache memory, at the address present on the bus adr_MC, connected to the bus adr_CPU, via the buffers BV11, the data present on ths bus data_MC, connected to the bus data CPU via the bidirectional buffers BV12. The direction of activation of these buffers is furnished by the signal $\overline{w\_MC}$. The output of the gate NET11 is also connected to one of the inputs of the logic gate ET11, which thus re-sends the signal dtack_CPU to the treatment processor CPU. The writing operation in the cache is done in parallel with the activation of the signal dtack_CPU, which is conformed to the usual specifications of treatment processors.

The operation is terminated by freeing of the management directory RG and of the cache memory MC by deactivation of the signal $\overline{rqst\_UR}$, as a consequence of the arrival of the inverted phase θ13 on the flip flop B11.

The logic gate NET12 receives on its inputs, in addition to the output of the logic gate ET10, the inverted reading request signal $\overline{r\_CPU}$. The activation of the logic gate NET12 corresponds to the state "request reading of a word in a block present in the cache."

The continuation of the operations is identical to the preceding operation, with the sole difference of the activated signal ($\overline{r\_MC}$ rather than $\overline{w\_MC}$) associated with the direction of transit of the data on the busses data_CPU and data_MC.

If the block requested is absent from the cache memory (eg10=0), then the signal eg10, inverted, connected to one of the two inputs of the logic gate NET13, furnishes a signal calibrated by the phase θ12, present on the other input of the logic gate NET13. The output of the logic gate NET13 is connected to the input $\overline{S}$ of the flip flop B12. This calibrated signal forces the flip flop to one, which has the effect of sending a service request $\overline{rqst\_US}$ to the management processor of the serial link PGS. This processor also receives the address of the block to request on the lines adr_bloc_ US and the nature of the request on the lines $\overline{w}\_US$, $\overline{r}\_US$ and $\overline{fc}\_US$.

The request management processor PGU has terminated the first part of its task: the management directory RG and the cache memory MC are freed by deactivation of the line $\overline{rqst\_UR}$, as a consequence of the arrival of the inverted phase θ13 on the flip flop B11.

The mechanism for updating the cache is described in the paragraph "management processor for the serial link PGS".

One will note that the liberation of the management directory RG and the cache memory MC is necessary in order that the management processor for the serial link PGS may have access thereto.

The updating of the cache is signaled to the request processor PGU by the activation of the signal $\overline{ack\_US}$. This signal is delivered to the input $\overline{R}$ of the flip flop B12 and to the input of the gate ET12. It thus has the effect of resetting to zero the flip flop B12 and activating through the logic gate ET12, the flip flop B1 and the phase distributor: the cycle initially started by the signal $\overline{as}$ is reproduced, but this time with success due to the presence of the block in the cache memory.

Figure 14:
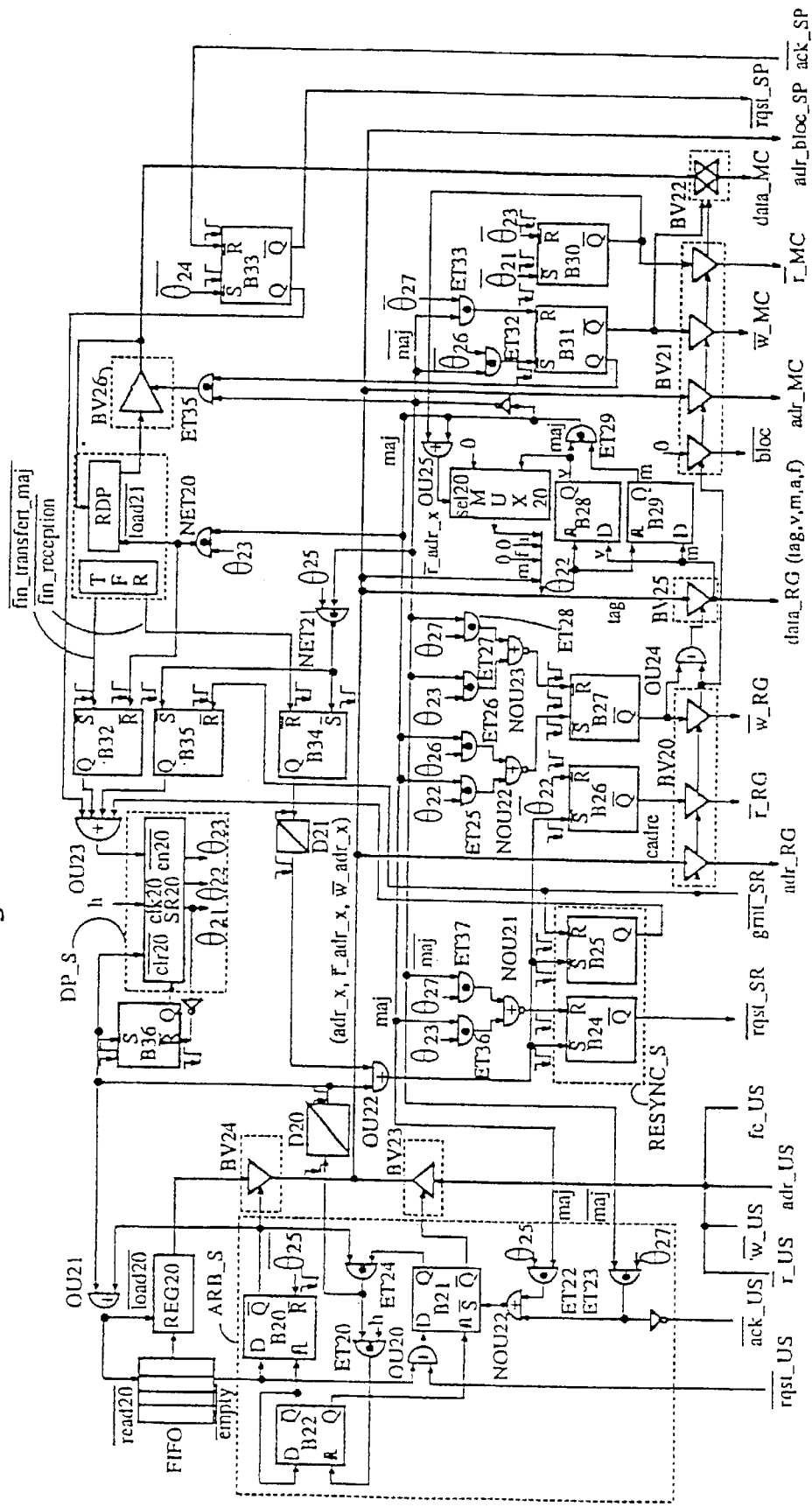

The serial management processor PGS shown by way of example in FIG. 14 is charged with managing the serial link LS and in this way to provide the block transfer requests between the central memory RAM and the cache memory MC and to produce the corresponding operations in the management directory RG. It treats in priority the requests from the snooping processor PE and waits in a waiting line FIFO. It also treats the requests from the request processor PGU.

This management processor for the serial link PGS comprises a flip flop B20 which receives on its data inputs D the signal $\overline{empty}$ coming from the waiting file FIFO and on its clock inputs the output $\overline{Q}$ of a flip flop B22. A flip flop B21 receives on its input the output data of a logic gate OU20. This logic gate OU20 validates the signal $\overline{rqst\_US}$, received on one of its two inputs, the other input being connected to the signal $\overline{empty}$. The clock input of the flip flop B21 coming from the output Q of the flip flop B22. The output $\overline{Q}$ of the flip flop 222 is reconnected on its data input D, which conditions it while dividing by two. The clock input of the flip flop B22 is connected to the output of a logic gate ET20, which receives on one of its inputs the general operating clock h and on the other input a validation signal. This validation signal comes from the output of a logic gate ET24, which receives respectively on its two inputs the outputs $\overline{Q}$ and Q of the flip flops B20 and B21.

The flip flop 120 receives on its input R the phase θ25, inverted, issuing from a phase distributor DP_S. the flip flop B21 receives on its input $\overline{S}$ the output of a logic gate NOU20. This logic gate NOU20 receives on its two inputs the respective outputs of the logic gates ET22 and ET23. The logic gate ET22 receives on its inputs the phase θ25 from the phase distributor and the signal maj from a logic gate ET29. The logic gate ET23 receives on its inputs the phase θ27 from the phase distributor and the inverted signal maj. The assembly of the circuits B20, B21, B22, ET20, ET22, ET23, OU20, ET24, NOU20 constitute a fixed priority arbitrator ARB_S. Its operation is as follows: the flip flop B22 furnishes on its outputs $\overline{Q}$ and Q the alternate frequency signals half of that of the general clock. These signals validate alternatively the flip flops B20 and B21. If a request for service is present on one of the inputs of the flip flops B20 or B21, then these alternated signals store the request in the corresponding flip flop (B20 for the snooper processor PE, B21 for the request management processor PGU) which, in return, lock out the alternated function. One will note that the signal $\overline{rqst\_US}$ originating from the request management processor PGU is conditioned by the signal $\overline{empty}$ through the gate OU20: the signal is only considered if the waiting line FIFO is empty. The flip flop B20 (respectively B21) is only reset to zero when the transaction to be carried out is terminated.

The sampling of a request on one or the other of the flip flops B20 and 321 translates by a change of state of the output of the logic gate ET24. The output of the logic gate ET24 is also connected to a differentiator circuit D20 which delivers a pulse upon changing of the state of the output of the logic gate ET24. The output of the differentiator circuit is connected, on one part, to the phase distributor DP_S (input $\overline{S}$ of flip flop B36 and $\overline{clr20}$ of a shift register SR20) of the management processor for the serial link, and for the other part to one of the two inputs of the logic gate OU22. The output of the logic gate is connected to the inputs $\overline{S}$ of the two flip flops B24 and B25. The flip flop B24 receives on its input $\overline{R}$ the output of a logic gate NOU21 and the flip flop B25 the signal $\overline{grnt\_SR}$. The logic gate NOU21 receives on its two inputs the outputs of the logic gates ET36 and ET37. The logic gate E36 receives on its inputs the phase θ23 from the phase distributor and the signal maj, and the logic gate E37 the phase θ27 from the phase distributor and the signal maj inverted.

The pulse from the differentiator circuit D20 thus initializes the phase distributor and sets the logic state of the flip flops B24 and B25 to one across the logic gate OU22.

The phase distributor DP_S is composed of shift register SR20 and the flip flop B36. Its operation is identical to that described in the paragraph concerning the request management processor PGU.

The output $\overline{Q}$ of the flip flop B24 is connected to the signal $\overline{rqst\_SR}$, to the destination of the directory management processor PGR. Its activation releases a request for service to this processor, which responds by the line $\overline{grnt\_SR}$, connected to the input $\overline{R}$ of the flip flop B25. The output Q of the flip flop B25 is connected to one of the inputs of a logic gate OU23. The output of the logic gate OU23 is connected to the input $\overline{en20}$ of the shift register SR20.

The logic assembly B24 and B25 constitute a resynchronization logic RESYNC_S between asynchronous units. Its operation is as follows:

A service request $\overline{rqst\_SR}$ to the directory management processor PGR is made by activation of the flip flops B24 and B25 through the logic gate OU22, which authorizes two origins of activation. The logic proper to the directory management processor PGR assures a response $\overline{grnt\_SR}$ in an indeterminate time, which resets the flip flop B25 to zero. The flip flop B24 maintains its request until it is reset to zero by activation of its input $\overline{R}$. In return, the directory management processor PGR deactivates its line grnt_SR: the resynchronization logic is ready to operate for a next request for service. The output Q of the flip flop B25 serves to block the phase distributor by action on its input $\overline{en20}$ via the logic gate OU23: the resetting to zero of the flip flop B25 frees the phase distributor which furnishes the first phase θ21 upon the next active transition of the general clock h, connected to the input clk20 of the phase distributor.

The line $\overline{grnt\_SR}$ is also connected to the validation buffers BV20, BV25 and BV21, BV22 which open access respectively to the management directory RG and to the cache memory MC.

If the flip flop B20 is active, then the transaction in progress is a purge of the block requested by the snooping processor PE via the waiting line FIFO. The output Q of the flip flop B20 is connected to the validation buffers BV24. These buffers receive on their input the output of a register REG20. The output $\overline{Q}$ of the flip flop B20 is connected to one of the two inputs of a logic gate OU21, which receives on its other input the output of the differentiator circuit D20. The output of the logic gate OU21 is connected to the input $\overline{load20}$ of the register REG20 and to the input $\overline{read20}$ of the waiting line FIFO.

Thus, the activation of the flip flop B20 provokes:
1. Initialization of the phase distributor,
2. A request for access to the management directory RG and to the cache memory MC,
3. The loading of the element at the head of the waiting line FIFO in the register REG20 and advancing of the waiting line,
4. The validation of the buffer BV24: the bus adr_x contains the address of the block to be purged. The nature of the operation (carried out) will be relocated from the combination of the bits v and m (signal maj).

If the flip flop B21 is active, then the transaction in progress comes from a miss in the cache memory MC. The output $\overline{Q}$ of the flip flop B21 is connected to the validation buffers BV23. These buffers receive on their input the information originating from the request management processor PGU.

Thus, the activation of the flip flop B21 provokes:
1. The initialization of the phase distributor,
2. A request for access to the management directory RG and to the cache memory MC,
3. The validation of the buffers BV23: the bus adr_x contains the address of the block which has provoked the miss in the cache memory MC, and the nature of the request: reading or writing, shared data of non-shared data (lines fc_US).

The field "frame" of the bus adr_x is connected to the address lines adr_RG of the management directory through the validation buffers BV20. The outputs $\overline{Q}$ of the flip flop B26 and B27 are respectively connected to the lines $\overline{r}\_RG$ and $\overline{w}\_RG$ of the management directory through the validation buffers BV20. The flip flop B26 receives on its input $\overline{S}$ the output of the logic gate OU22 and on its input $\overline{R}$ the phase 922 inverted, coming from the phase distributor. The flip flop B27 receives on its input $\overline{S}$ the output of a logic gate NOU22 and on input $\overline{R}$ the output of a logic gate NOU23. The logic gate NOU22 receives on its two inputs the respective outputs of the logic gates ET25 and ET26, themselves receiving on their inputs, for the gate ET25 the phase θ22 and the signal maj, and for the gate ET26 the phase θ26 and the signal maj. The logic gate NOU23 receives on its two inputs the respective outputs of the logic gates ET27 and ET28, themselves receiving on their inputs, for the gate ET27 the phase θ23 and the signal maj inverted, and for the gate ET28 the phase θ27 and the signal maj inverted.

The field tag of the bus adr_x is connected to the field tag of the lines data_RG through the validation buffers BV25.

These latter receive on their validation input the output of a logic gate OU24 which receives on its inputs the signal $\overline{grnt\_SR}$ and the output Q from the flip flop B27.

The inputs D of the flip flops B28 and B29 are respectively connected to the bit validation lines v and bit modification lines m of the bus data_RG. The clock inputs of these flip flops B28 and B29 are connected to the phase θ22 of the phase distributor. The output Q of the flip flop B28 and the output Q of the flip flop B29 are connected to two inputs of a logic gate ET29, which furnishes on its output the signal maj. A logic gate OU25 receives on its inputs the signal maj and the output $\overline{Q}$ of a flip flop B30. The output of the logic gate OU25 is connected to the selection input sel20 of a multiplexer MUX20, which receives on its two data inputs the output Q of the flip flop B28 (bit v) and the constant 0, the constant zero being selected when the selection input sel20 is at the logic state of one. The output of the multiplexer MUX20 is connected to the bit validation line v of the bus adr_x. The bit waiting line -a- of the bus adr_x is forced to the logic state zero. The modification bit -m- is connected to the reading line $\overline{r}\_adr\_x$ of the bus adr_x.

The logic assembly described above constitutes the access logic and operation logic of the management directory RG. Its operation is as follows: the activation of the signal $\overline{grnt\_SR}$, authorizing access to the management director and to the cache memory, validates the validation buffers BV20. The reading of the descriptor concerned is controlled from the beginning of the access authorization until the arrival of the phase θ22, the storage instant of the bits -v- and -m- in the flip flops B28 and B29. The combined state of these two bits produces, across the logic gate ET29, the signal maj which conditions the succeeding operations.

First Case: maj=1. This case is produced when the validation bit is equal to 1 and the modification bit is equal to 1. This case corresponds either to a request to purge the block from the snooping processor PE, or to an information defect established by the request management processor PGU upon placement of the block occupied and modified: in the two cases, the block concerned must be written into the central memory RAM.

To this effect; the field -cadre- of the bus adr_x is connected to the lines adr_MC via the validation buffers BV21. The outputs $\overline{Q}$ of the flip flops B30 and B31 are respectively connected to the lines r_MC and $\overline{w}\_MC$ of the cache memory MC through the validation buffers BV21. The line $\overline{bloc}$ is forced to zero via one of the validation buffers BV21. The data lines data_MC of the cache memory are connected, via the bidirectional validation buffers BV22 to the inputs of the shift register RDP and to the outputs of the validation buffers BV26, which receive on their inputs the output lines of the shift register RDP. The buffers BV22 are validated by the line $\overline{grnt\_SR}$ and their direction of validation controlled by the output $\overline{Q}$ of the flip flop B31. The flip flop B30 receives on its inputs $\overline{S}$ and $\overline{R}$ respectively the phases θ21 and θ23, inverted, coming from the phase distributor. The flip flop B31 receives on its inputs $\overline{S}$ and $\overline{R}$ respectively the outputs of the logic gates ET32 and ET33. The logic gate ET32 receives on its inputs the phase θ26 and the signal maj inverted, the logic gate ET33 the phase θ27 and the signal maj inverted. A logic gate NET20 receives on its inputs the phase θ23 and the signal maj. The output of a logic gate ET35 controls the validation buffers BV26, and receives on its two inputs respectively the signal maj inverted and the output Q of the flip flop Q31. The output of the logic gate NET20 is connected to the signal $\overline{load21}$ of the shift register RDP and to the input S of a flip flop B32. The input R of this flip flop B32 receives the signal fin_transfert_maj coming from the logic TFR associated with the shift register RDP. The output Q of the flip flop B32 is connected to one of the inputs of the logic gate QU23.

The logic described above permits purging a block from the cache memory. Its operation is as follows:

In parallel with the access to the management directory RG, a reading of the cache memory MC is activated by the line r_MC, coming from the flip flop B30, during the phases θ21 and θ22. At the output of this reading, the data read, representing the block to be downloaded, are presented at the input of the shift register RDM. The activation of the signal maj, the state of which is known from the beginning of the phase θ22, provokes:

1. The invalidation of the block in the management directory: the input sel20 of the multiplexer MUX20 being at the logic state one, the value zero is forced on the validation bit, the descriptor being written in the management directory RG with the activation of the signal w_RG, controlled by the flip flop B27 during the cycle θ22,
2. The loading of the shift register RDH and the activation of the transfer, upon passage of the phase θ22 to the phase θ23,
3. The placement at the logic state one of the flip flop B32, which comes to block the phase distributor on the phase θ23 until the end of the transfer, signaled by the signal fin_transfert_maj coming from the logic TFR,
4. The liberation of the management directory RC and of the cache memory MC by resetting to zero the flip flop B24 on the phase θ23.

Thus, the access to the directory if freed (therefore accessible for the snooping processor PE), the transfer of the operation is in progress, and the phase distributor blocked on θ23.

When the transfer is terminated, the block is in waiting state in the shift register RDM and it is necessary to activate the management processor of the parallel link in order that the writing into central memory RAM will be effective.

To this effect, the flip flop B33 is connected by its output Q to the service request line rqst_SP at the destination of the parallel link management processor PGP. The output Q is connected to one of the inputs of the logic gate OU23, the input S to the phase E24 inverted from the phase distributor and the input R to the signal ack_SP. The bus adr_x is connected to the bus adr₁₃ bloc_SP of the parallel link management processor PGP. One of the lines of the bus adr_bloc_SP receives the signal maj in order to indicate the nature of the request: position open.

After the liberating of the phase distributor by the signal fin_transfert_maj, the next active transition of the general clock h causes the passage of the phase θ23 to the phase θ24. The phase θ24 provokes a service request from the parallel link management processor PGP (activation of the line rqst_SP) and the blocking of the phase distributor until discharge of the request by the signal ack_SP. At this moment, the writing in operation will be effectively achieved by the parallel link management processor PGP. The phase distributor, on the next active transition of the clock h, comes to pass from the phase θ24 to the phase θ25.

The updating of the central memory RAM is terminated: the flip flop B20 is set to zero by activation of its input R by the phase θ25 inverted. The flip flop B212 is set to one by activation of its input S by the phase θ25, conditioned by the signal maj by means of the logic gate ET22 via the logic gate NDU22. In case of a miss in the cache memory, the purge of a block only constitutes the first part of the request: the request rqst_US is always present, but the liberation of the flip flop B21 is going to permit eventual consideration of requests for operation while waiting in the waiting line FIFO. When the waiting line FIFO is empty (empty=0), the whole cycle described previously is reproduced, with, this time, the validation bit at zero. On is then in the following case:

Second Case: maj=0. This case arises when the validation bit is equal to zero (by following perhaps, a purge of a block) or when the validation bit is equal to one, but the modification bit is equal to zero: the current copy of this block is already in the central memory RAM.

Thus, the request for service rqst_SR comes to cause in return an accord for access to the management directory RG and to the cache memory MC with reading of the descriptor, storing the bits m and v, generation of the signal maj, rewriting of the descriptor with v=0 (maj is at the logic state zero, the flip flop B31 is at the logic state zero and its output Q has a value of one, which imposes a logic signal at the state one on the input sel20 of the multiplexer MUX20 and therefore forces the constant 0) and the freeing of access to the management directory RC and the cache memory MC. The operations are effective upon activation of the phase θ23.

The block request must now be read in the central memory RAM. To this effect, the signal maj inverted is received at one of the inputs of a logic gate NET21, which receives on its other input the phase θ25. The output of the logic gate NET21 is connected to inputs S of the flip flops B34 and B35. The flip flop B34 receives on its input R the signal fin_reception coming from the transfer logic TFR. Its output Q is connected to the differentiator circuit D21. This circuit is connected to the logic gate OU22. The input R of the flip flop B35 is connected to the signal grnt_SR and the output Q on one of the inputs of the logic gate OU23.

The reading of a block in the central memory RAM and its transfer into the cache memory are realized in the following manner: the transition of the phase θ23 to the phase θ24 unlatches a service request to the parallel link management processor by activation of the line rqst_SP, coming from the flip flop B33. The type of operation is this time a reading (r_adr_x=0) or a writing (w_adr_x=0) and the bus adr_x furnishes the address of the block requested on the bus adr_bloc_SP. The phase distributor is blocked until arrival of the release signal ack_SP: the reading or writing request has been made to the central memory RAM by the parallel connection management processor PGP, and the block has been at the same time validated and marked "in waiting" by this same processor. The transfer is then in progress, from the central memory RAM to the shift register RDP.

The phase distributor, freed, furnishes then the phase θ25. This phase, by the intermediary of the logic gate NET21 which receives on its other input the signal maj inverted, comes to set to the logic state one, the flip flops B34 and B35. The flip flop B35 blocks the phase distributor. The flip flop B34 is reset to zero upon arrival of the block request in the register RDP, signaled by the activation of the line fin_reception coming from the transfer logic TFR, which releases the activation of the differentiator circuit D21 and an access demand to the management directory RG and the cache memory MC, by the activation of the line rqstSR from the flip flop B24.

The access accord, signaled by the line grnt_SR, frees the phase distributor by resetting the flip flops B25 and B35 to zero, and opening the access to the management directory RG and to the cache memory MC. The phase distributor, upon the next active transition of the general clock h, furnishes the phase θ26.

The flip flop B27, connected to the signal $\overline{w\_RC}$ of the management directory, is activated by θ26 and θ27, which permits providing the operation of the management directory with:

field tag of the bus data_RG=field tag of the bus adr_x, validation bit v=1 (maj=0 and the output Q of the flip flop B31 is at zero: the multiplexer MUX20 allows v to pass, which has been forced to one by the parallel connection management processor PGP, or already reset to zero by the snooping processor PE), modification bit m=state of the line $\overline{r}\_adr\_x$ of the bus adr_x (writing request causes m=1, reading request m=0), awaiting transfer bit a=0, bit f=0.

The flip flop B31 activates the signal $\overline{w\_MC}$ of the cache memory MC of θ26 and θ27, which permits writing the contents of the shift register RDM (the buffers EV26 are validated by the output $\overline{Q}$ of the flip flop B31 and the signal maj inverted) in the good placement (field -cadre- of the bus adr_x connected to the bus adr_MC) of the cache memory, via the validation buffers BV22, controlled in the direction of transfer by the flip flop B 31.

Upon arrival of the phase θ27, the operation of the management directory and of the cache memory is terminated. The arrival of the phase θ27 provokes the resetting of the flip flop B24 to zero, which frees the access to the management directory RG and to the cache memory MC and the activation of the output of the logic gate ET23, resetting the flip flop B21 to zero and activating the signal $\overline{ack\_US}$ to the destination of the request management processor PGU: the request is terminated.

Figure 15:
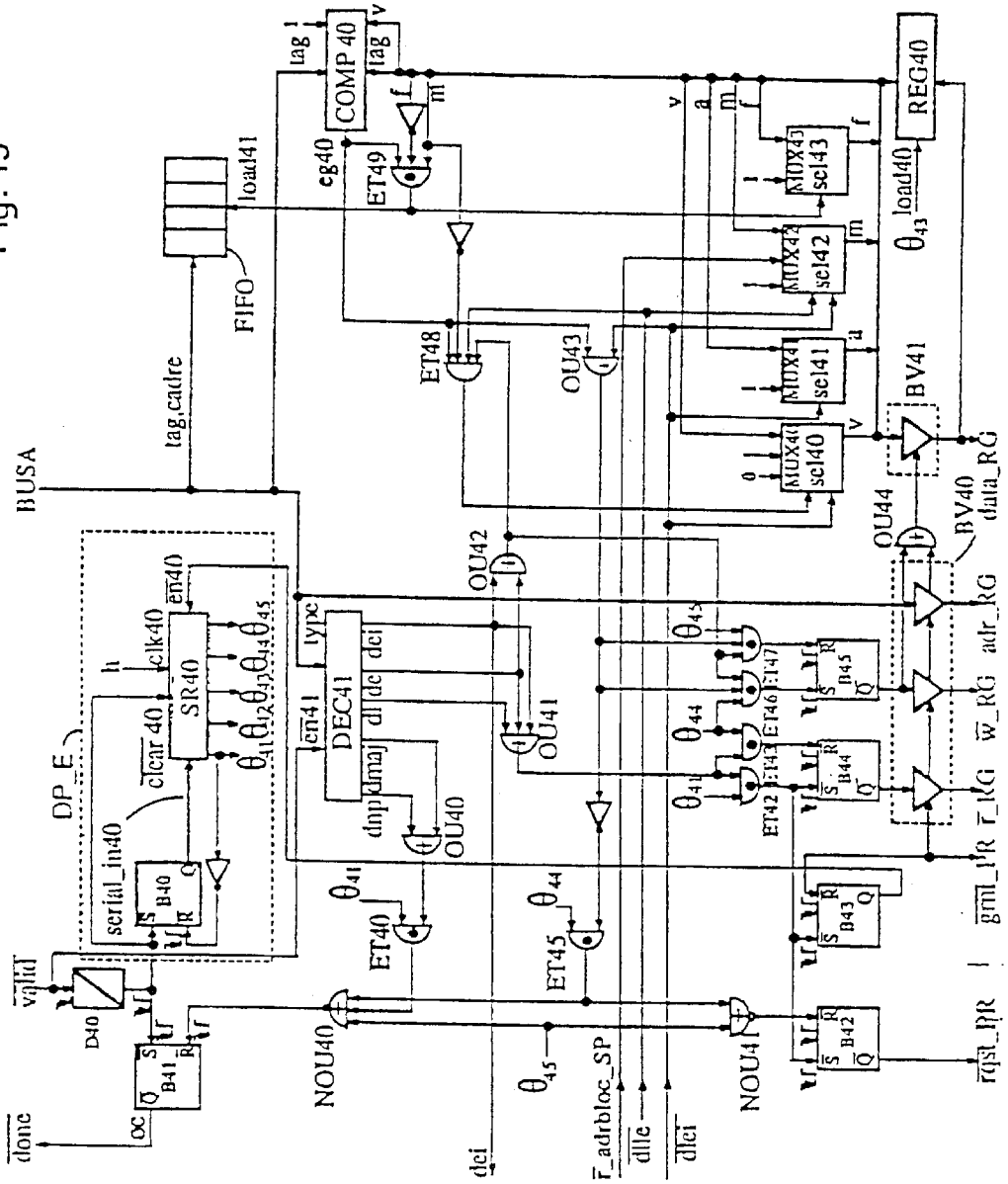

In addition, the snooping processor PE is charged with maintaining the coherence of the data in the cache memory MC. By way of example, there is shown in FIG. 15 an architecture of this processor. This is released at each active transition of the signal $\overline{valid}$ from the common bus BUSA.

If the signal $\overline{valid}$ is activated by a parallel connection management processor PGP other that that associated with the snooping processor PE, then the task of this latter is as follows, as a function of the request:

request for reading of the block of non-shared data, or request for writing of the operation of the block: nothing, request for reading of the block of shared data:

block absent: nothing, block present and not modified: nothing, block present and modified: request for purge of the block (that this block be present or in the course of transfer from the central memory RAM to the cache memory MC, state signaled by the bit -s- of the descriptor), request for writing of the block of shared data:

block absent: nothing, block present unmodified: invalidate the block, block present modified: request for purge of the block (same remark as above), request for informative writing of the block:

block absent: nothing, block present unmodified: invalidate the block, block present modified: impossible case, if a request for informative writing is in waiting on this same block, it is transformed into a request for writing of the block, since this block has been invalidated: to this effect, the request in progress is annulled and a release is sent to the request management processor PGU. This latter consults the directory RG and comes to find the block absent: a request is sent to the management processor PGS. This operation is taken into consideration by the parallel management processor PGP.

If the signal $\overline{valid}$ is activated by the parallel connection management processor PGP associated with the snooping processor, then the task of the latter is as follows, function of the type of request (termed local request):

request for reading of the block of non-shared data or request for writing of the operation of this block: nothing, request for reading of the block of shared data: mark the block valid, while waiting for transfer and modified (v=m=s=1), request for informative writing of the block: mark the block "modified" (m=1).

To assure the functions described above, the snooping processor PE comprises a phase distributor DP_E, comprising a shift register SR40 and a flip flop B40. The output of a differentiator circuit D40 is connected to the input $\overline{S}$ of the flip flop B40 and the input $\overline{clear40}$ of the register SR40, as well as the input $\overline{S}$ of a flip flop B41. The output Q of the flip flop 540 is connected to the input serial_in40 of the register SR40. The input clk40 of the register SR40 receives the signal h from the general clock and the validation input $\overline{en40}$ is connected to the output Q of the flip flop B43. The phase θ41, inverted, coming from the register SR40 is connected to the input $\overline{R}$ of the flip flop B40.

The operation of the phase distributor is in accordance with the description given for the request management processor PGU.

The signal $\overline{valid}$ of the bus BUSA is connected to the input of the differentiator circuit D40 and to the validation input $\overline{en41}$ of a decoder DEC41. The flip flop R41 receives on its input $\overline{R}$ the output of the logic gate NOU40. The output $\overline{Q}$ of the flip flop B41, to the open collector, is connected to the signal $\overline{done}$ of the bus BUSA.

The signals $\overline{valid}$ and $\overline{done}$ assure the synchronization of the snooping processor PE with the other snooping processors of the multiprocessor system: the negative transition of the signal valid unlatches the differentiator circuit D40 which produces a pulse permitting activation of the phase distributor and sets the signal $\overline{done}$ at the logic state zero through the intermediate flip flop B41. The end of the work of the snooping processor is signaled by a change of state on the output of the logic gate NOU40, which produces the setting of the logic state of the signal $\overline{done}$ to one through the intermediary of the flip flop B 41.

The work of the snooping processor is a function of the nature of the request and, to this effect, the field type of the bus BUSA is connected to the input of the decoder DEC41. The outputs dnp and dmaj of the decoder DEC41 are connected to the inputs of a logic gate OU40. The outputs di, de, dei of the decoder DEC41 are connected to the inputs of a logic gate OU41, the outputs de and dei being both connected to the inputs of a logic gate OU42. The output of the logic gate OU40 is connected to one of the inputs of the logic gate NOU40 by the intermediary of a logic gate ET40, which receives on its other input the signal Q41. The output of the logic gate OU41 is connected respectively to one of the inputs of the logic gates ET42, ET43, which receive on their other input respectively the phase signal θ41 and θ44.

The outputs of the logic gates ET42 and ET43 are connected respectively to the inputs $\overline{S}$ and $\overline{R}$ of a flip flop B44. The output of the logic gate ET42 is also connected to the inputs $\overline{S}$ of the flip flops B42 and B43. A logic gate NOU41 receives on its inputs the phase signal θ45 and the output of a logic gate ET45, which receives on its two inputs the phase θ44 and the inverted output of a logic gate OU43. The output of the logic gate NOU41 is connected to the input $\overline{R}$ of the flip flop B42. The output $\overline{Q}$ of the flip flop B42 is connected to the signal $\overline{rqst\_PR}$ and the signal $\overline{grnt\_PR}$ is delivered to the input $\overline{R}$ of the flip flop B43, to the validation inputs of the passage buffers BV40, and to one of the inputs of the logic gate OU44. The logic gate OU44 receives on its other input the output $\overline{Q}$ of a flip flop B45, and its output validates the passage buffers BV41. The output of the logic gate ET45 is also connected to one of the inputs of the logic gate NOU40 which receives on another input the phase signal θ45. the output of the logic gate OU42 is connected to the inputs of the logic gates ET46 and ET47, which receive also on their inputs the output of a logic gate OU43 and respectively the phases θ44 and θ45.

The output $\overline{Q}$ of the flip flop B44 delivers the signal $\overline{r}\_RG$ via a buffer BV40, the output $\overline{Q}$ of the flip flop B45 delivers the signal $\overline{w}\_RG$ via a buffer BV40. The field cadre of the common bus BUSA is connected to bus adr_RG via a buffer BV40. The bus data_RG is connecte4d to the outputs of the validation buffers BV41 and to the input of the register REG40, which receives on its input load40 the phase signal θ43. The output of the register REG40 is connected, for the part tag, to the inputs of the buffers BV41 and to one of the inputs of a comparator COMP40. The comparator COMP40 receives on its other input the part tag from the bus BUSA.

The validation bit v, issued by the register REG40, connected to the comparator COMP40 has opposite the constant value 1. The bits v, a, m, f in the output of the register REG40 are connected respectively to one of the inputs of the multiplexers MUX40, MUX41, MUX42, MUX43. The outputs of these multiplexers furnish the state of these same bits to the inputs of the buffers EV41. The multiplexer MUX40 receives on its other inputs the constants zero and one, the inputs sel40 are connected to the output of a logic gate ET48 and to a signal $\overline{dlle}$. The multiplexer MUX41 receives on its other input the constant one, selected when its input sel41, receiving a signal dlle from the management processor PGP, is at the logic state of one. The multiplexer MUX42 receives on its other inputs the constant one and the signal $\overline{r}\_adrbloc\_SR$, on its inputs sel42 receiving the signals $\overline{dlei}$ and $\overline{dlle}$ coming from the management processor PGP. The multiplexer MUX43 receives on its other input the constant one, selected when its input sel43, connected to the output of a logic gate ET49, is at logic state one.

The logic gate ET49 receives on its inputs the output eg40 of the comparator COMP40, the signal f inverted and the signal m. The logic gate ET48 receives on its inputs the output eg40, the signal m inverted, the signal $\overline{dlei}$ and the output of the logic gate OU42. The logic gate OU43 receives on one of its inputs the signal eg40, and on its other input the signal $\overline{dlle}$. The output of the logic gate ET49 is also connected to the input load41 of the waiting line FIFO, already written in the serial link management processor PGS. The fields cadre and tag of the bus BUSA are connected to the inputs of the waiting line FIFO. The signals $\overline{dlei}$, $\overline{dlle}$ and $\overline{r}\_adrblock\_SP$ come from the parallel link management processor PGP, which receives also the signal dei of the decoder DEC41.

The operation of the assembly is as follows: the activation signal $\overline{valid}$ initializes the phase distributor DP_E and validates the decoder DEC41 which produces the activation of an output as a function of the information type coding the nature of the demand in progress on the common-bus BUSA. The active output may be:

dnp: request for reading of non-shared data. The signal $\overline{done}$ is deactivated upon appearance of the phase θ41;

dmaj: writing request for operation of the block. The signal $\overline{done}$ is deactivated at phase θ41;

dl: request for reading the block;

de: request for writing the block;

dei: request for informative writing.

These three cases necessitate an access in reading to the directory RG, and the two latter an eventual re-writing of the directory. to this effect, a request for access is sent to the directory management processor PGR by the flip flop B42 (signal $\overline{rqst\_PR}$), the flip flop B43 blinding the phase distributor until access agreement, signified by the signal $\overline{grnt\_PR}$. The reading thus carried out of θ41 and θ44 (flip flop B44) and the eventual writing of θ44 to θ45 (flip flop B45) with storage of the descriptor in the register REG40 from the phase θ43. If the block is absent from the cache memory MC (eg40=0), then the signal $\overline{done}$ is deactivated on the phase θ44. If the block is present in the cache (eg40=1), then:

if m=1, a request to purge is activated (activation logic gate ET49) on the condition that this block is not already in the line (f=0); the only bit modified is f, set to one, at the time of re-writing of the descriptor, if m=0, the block is invalidated by the multiplexer MUX40 (activation of the logic gate ET48), if the request is local ($\overline{dlle}$ or $\overline{diei}$ active) then:

1) in case of reading or writing, the bits v and a are set to 1 and me is set to 0 (reading) or 1 (writing) (state of the signal $\overline{r}\_adrbloc\_SP$), in the case of informative writing, the bit m is forced to 1.

In these latter cases which require a re-writing in the management directory RC, the signal $\overline{done}$ is deactivated on the phase θ45.

Figure 16:
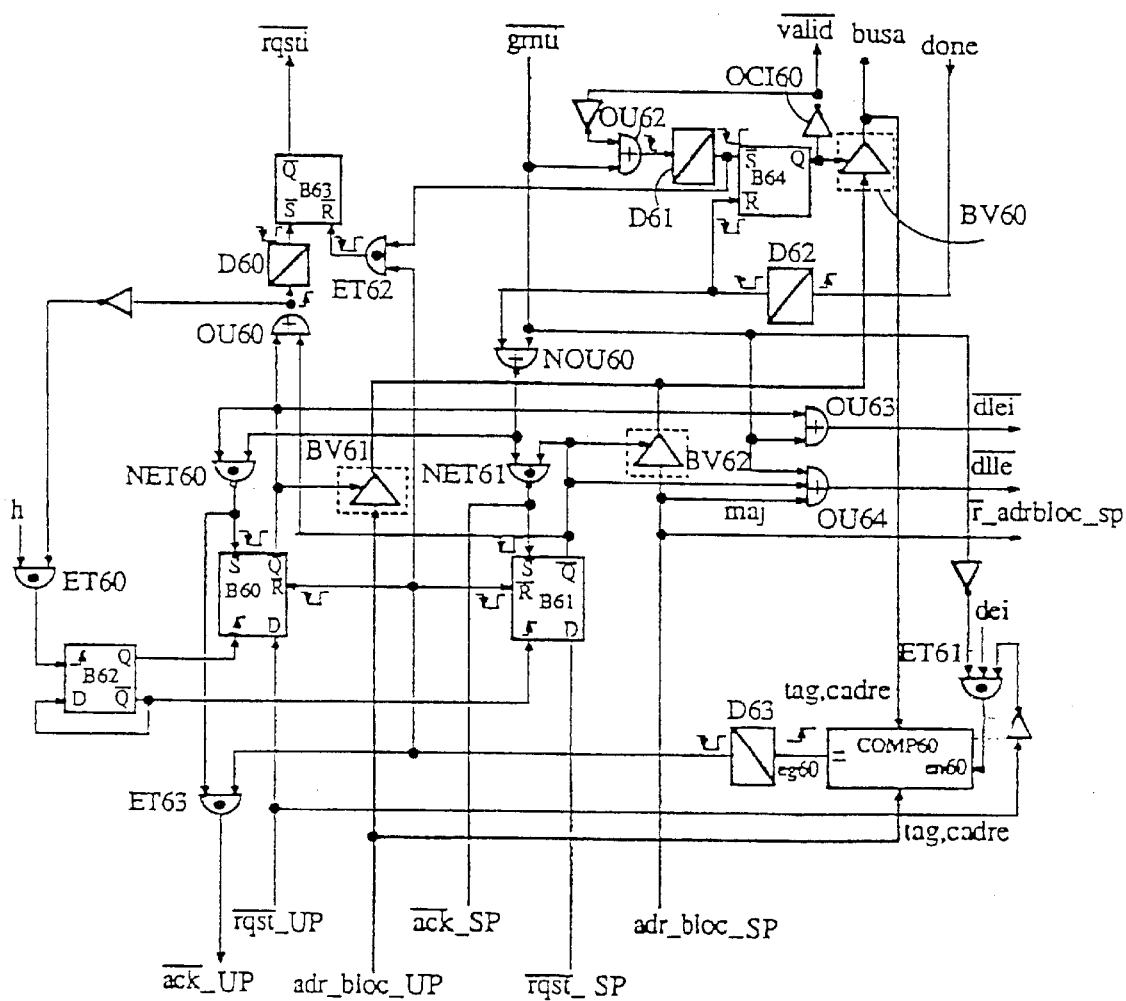

The parallel link management processor PGP, an example of which is shown in FIG. 16, is charged with requesting the common bus BUSA and providing the transaction requested, either by the request management processor PGU, or by the serial link management processor PGS.

A request coming from the request management processor PGU can only be an informative writing request. A request coming from the serial link management processor PGS is either a request for reading or writing of the block, or a request for the current setting of the block.

The parallel link management processor PGP comprises a flip flop B60, connected through its data input D to the signal $\overline{rqst\_UP}$. A flip flop B61 is connected through its data input D to the signal $\overline{rqst\_SP}$. the outputs Q and $\overline{Q}$ of a flip flop B62 are connected respectively to the clock inputs of flip flop B62s B60 and B61. The output $\overline{Q}$ of the flip flop B62 is looped around to its data input. The outputs $\overline{Q}$ of the flip flops B60 and B61 are connected to the inputs of a logic gate OU60. The output of the logic gate OU60 is connected, first, to a differentiator circuit D60, and in an inverse manner, to an input of a logic gate ET60, which receives on its other input the general clock signal h. The output of the logic gate ET60 is connected to the clock input of the flip flop B62. The output of the differentiator circuit D60 is connected to the input $\overline{S}$ of a flip flop B63. The output $\overline{Q}$ of the flip flop B63 delivers a signal $\overline{rqsti}$ to the destination of the arbitrator AB, and its input $\overline{R}$ is connected to the output of a logic gate ET62. The signal $\overline{grnti}$ coming from the arbitrator AB is connected to the logic gates OU62 and NOU60. The logic gate OU62 receives on its other input the signal $\overline{valid}$ inverted, and its output is connected to the input of a differentiator circuit D61. The output of this circuit D61 is connected to one of the inputs of the logic gate ET62 and to the input $\overline{S}$ of a flip flop B64. The output Q of this flip flop B64 is connected to the validation input of the passage buffers BV60 and in an inverted manner, across an inverter with an open collector I60, to the signal $\overline{valid}$. The signal $\overline{done}$ is connected to the input of a differentiator D62. The output of this circuit D62 is connected to the input $\overline{R}$ of the flip flop B64 and to one of the inputs of the logic gate NOU60. The output of this logic gate NOU60 is connected to one of the input logic gates NET60 and NET61, which receive on their other input, respectively the outputs $\overline{Q}$ of the flip flops B60 and B61. The outputs $\overline{Q}$ of the flip flops B60 and B61 are also connected respectively to the validation inputs of the passage buffers BV61 and BV62. The output of the logic gate NET60 is connected to the input $\overline{S}$ of the flip flop B60 and to one of the inputs of a logic gate ET63, which receives on its other input the output of a differentiator circuit D63. The output of the logic gate ET63 delivers the signal $\overline{acq\_UP}$ to the management processor PGU. The output of the logic gate ET63 delivers the signal $\overline{acq\_UP}$ to the management processor PGU. The output of the logic gate NET61 is connected to the input $\overline{S}$ of the flip flop B61 and furnishes the signal $\overline{ack\_SP}$. The bus $adr_{13}$ bloc_UP is connected to the input of the validation buffers BV61 and to one of the inputs of a comparator COMP60.

The bus $adr_{13}$ bloc_SP is connected to the input of the validation buffers BV62. The outputs of the buffers BV61 and BV62 are connected together and to the input of the validation buffer EV60. The output of the buffer BV60 is connected to the common bus BUSA. The logic gates OU63 and OU64 receive on their inputs respectively the outputs $\overline{Q}$ of the flip flops B60 and B61, the logic signal $\overline{grnti}$ and the signal maj for OU64. The output of the logic gate OU63 delivers the signal $\overline{dlei}$, and the output of the logic gate OU64 the signal $\overline{dlle}$. The other input of comparator COMP60 receives the fields tag and cadre from the common bus BUSA. The input en60 of the comparator COMP60 is connected to the output of the logic gate ET61, which receives on its inputs the signal $\overline{grnti}$ inverted, the signal dei and the signal rqst_UP inverted. The output eg60 of the comparator COMP60 is connected to the input of the differentiator circuit D63. The output of this circuit is also connected to the inputs $\overline{R}$ of the flip flops B60 and B61 and the other input of the logic gate ET62.

The operation of the assembly is as follows: The flip flops B61 and B62 associated with the logic gates ET60 and ET61 constitute a local arbitrator. This arbitrator examines alternatively the requests $\overline{rqst\_UP}$ and rqst_SP, and resends them to the arbitrator AB of the common bus BUSA by the signal $\overline{rqsti}$. The access accord is furnished by the validation of the signal $\overline{grnti}$ and cycle bus takes place upon deactivation of the signal $\overline{valid}$ which frees the arbitrator AB. The activation of the signal $\overline{done}$ frees the local arbitrator: the transaction is terminated.

If the request comes from the serial link management processor PGS, then the signals $\overline{dlei}$ and $\overline{dlle}$ indicate to the associated snooping processor PE the nature of the updating of the status bits of the block to be carried out in the directory RG.

If the request comes from the request management processor PGU, the in case of detection of informative writing on the same block (signal dei coming from the snooping processor PE), an immediate liberation takes place: the request management processor PCU, after consultation of the directory (the block has been invalidated) will direct its request to the serial link management processor PGS.

Figure 17:
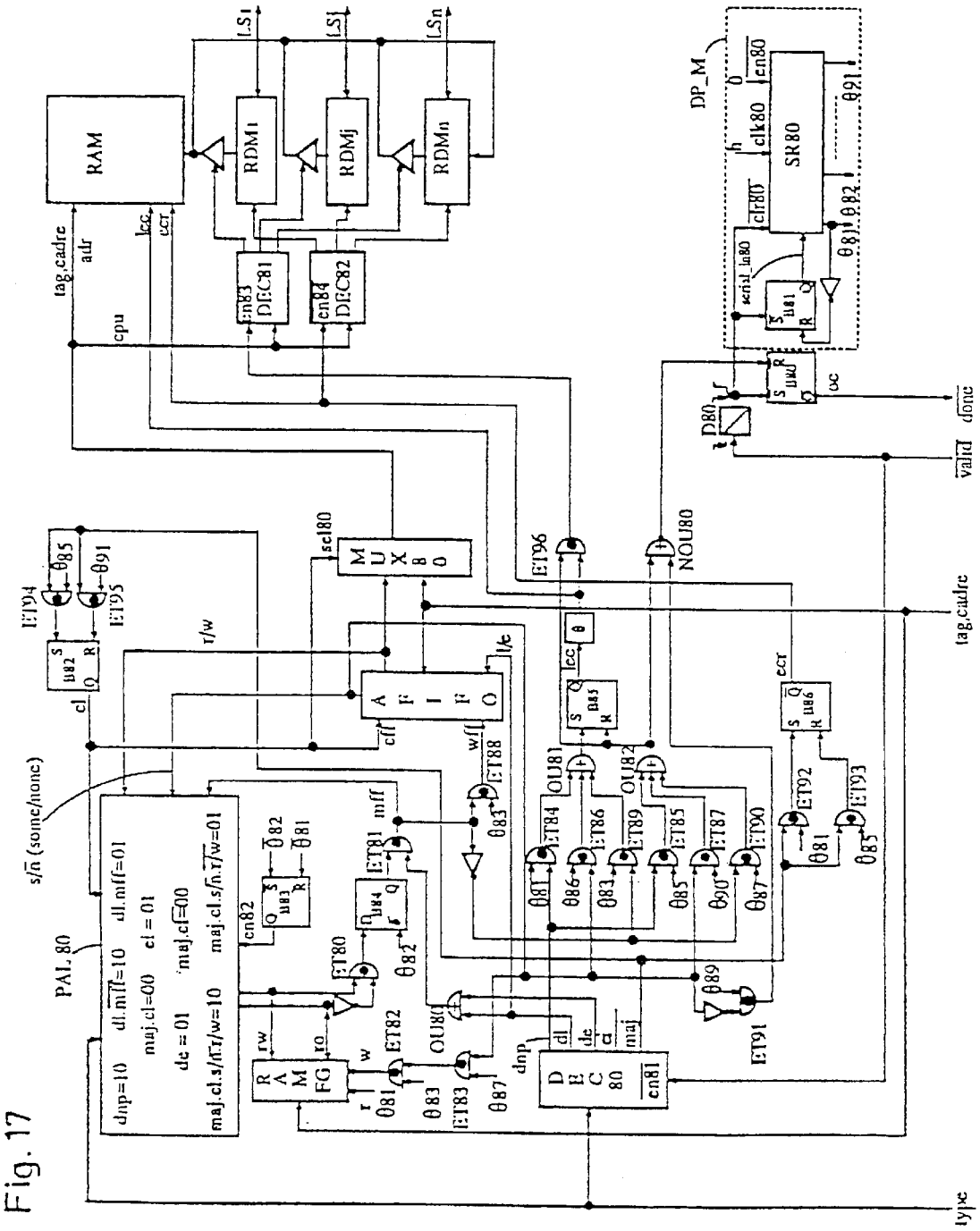

The memory management processor PGM, one example of which is shown in FIG. 17, is charged with assuring the reading or writing of the block in the central memory RAM and to participate in maintaining the coherence of the information in the various cache memories MC of the multiprocessor system.

To this end, it comprises a differentiator circuit D80 receiving on its input a signal $\overline{valid}$ and connected by its output to the inputs $\overline{S}$ of the flip flops B80 and B81 as well as to the input clr__80 of a shift register SR80. On the output Q of the flip flop B80, with an open collector, is delivered the signal $\overline{done}$. The output Q of the flip flop B81 is connected to the input serial__in80 of the register SR80. This flip flop B81 is connected by its input $\overline{R}$ to the output Q81, inverted, of the register SR80. The register SR80 receives on its input clk80 the general clock signal h and its validation input en80 is always active. The flip flop B81 and the shift register SR80 constitute a phase distributor DP__M. The signal $\overline{valid}$ is also delivered on the validation input en81 of a decoder DEC80. This decoder is connected by its data input to the part type of the common bus BUSA, and furnishes the signals dnp, dl, de, ei and maj. A readwrite memory RAMFG of a size of two bits (termed respectively ro and rw) receives on its address bus the fields tag and cadre of the common bus BUSA. The data bus of this memory, constituted of bits ro and rw, is connected by one part to a logic PAL80, and to a logic gate ET80, directly for rw, and inverted for ro. The logic PAL80is connected to the field type and receives the logic signals cl, r/w, s/n, mff and en82: the signal cl is emitted from a flip flop B82, the signals r/w and s/n from an associative waiting line AFIFO, the signal mff from a logic gate ET81, and the signal en82 from a flip flop B83, which receives on its inputs $\overline{S}$ and $\overline{R}$ respectively the signals O82 and O81 inverted from the phase distributor DP__M. The logic PAL cables on its outputs ro-rw the following logic equations: dnp=10; dl.mff=10; dl.mff =01; de=01; maj.cl=00; ei=01; maj.cl.s/$\overline{n}$.$\overline{r/w}$=10; maj.cl.s/$\overline{n}$.$\overline{r/w}$=01. The output of the logic gate ET80 is connected to the input D of a flip flop B84 which receives on its clock input the phase θ82. The output Q of this flip flop is connected to one of the inputs of the logic gate ET81, which receives on its other input the output of the logic gate OU80. The two inputs of this logic gate OU80 are connected to the outputs de and dl of the decoder DEC80. The reading input r of the memory RAMFG is connected to the phase θ81, and the writing input w to the output of a logic gate ET82. The logic gate ET82 receives on its inputs the signal θ83 and the output of a logic gate ET83, the inputs of which are connected to the signal s/$\overline{n}$ and the phase θ87. The output dnp of the decoder DEC80 is connected to the logic gates ET84 and ET85, which receive on their other input respectively the phases E81 and 085. The signal s/$\overline{n}$ is also delivered to the logic gates ET86 and ET87 which receive on their other input respectively the phases θ86 and θ90. The output mff of the logic gate ET81 is also connected to a logic gate ET88, which receives on its other input the phase θ83, and in an inverted manner to the logic gates ET89 and ET90 which receive on their other input respectively the phases θ83 and θ87. The output of the logic gate ET88 is connected to the input wff of the line AFIFO. The outputs of the logic gates ET84, ET86 and ET89 are connected to the inputs of a logic gate OU81, the output of which is connected to the input S of a flip flop B85. The outputs of the logic gates ET85, ET87, ET90 are connected to the inputs of a logic gate OU82 of which the output is connected to the input R of the flip flop R85. The signal s/$\overline{n}$ is also connected, in an inverted manner, to a logic gate ET91 which receives on its other input the phase θ89. The output of the logic gate ET91 is connected to the input of a logic gate NOU80 which receives on its other input the output of the logic gate OU82. The output of the logic gate NOU80 is connected to the input $\overline{R}$ of the flip flop B80. The output maj of the decoder DEC80 is connected to the input of the logic gates ET92, ET93, ET94, ET95, which receive on their other input respectively the phases θ81, θ85, θ85, θ91. The outputs of the logic gates ET92 and ET93 inverted are connected respectively to the inputs S and R of a flip flop B86, and those of logic gates ET94 and ET95 to the inputs S and R of a flip flop B82. The output Q of the flip flop B82 produces the logic signal cl also delivered to the input cff of the line AFIFO and to the control input sel80 of a multiplexer MUX80. The part tag, cadre of the common bus BUSA is connected to the data input of the line AFIFO and to one of the data inputs of the multiplexer MUX80. The output dl of the decoder DEC80 is also connected to one of the data inputs of the line AFIFO in order to produce the reading/writing signal l/e. The data output of the lint AFIFO is connected to the other input of the multiplexer MUX80. The output of the multiplexer MUX80 is connected to the address bus of the central memory RAM for the part tag.cadre, and to the inputs of the decoders DEC81 and DEC82 for the part champ cpu. The output $\overline{Q}$ of the flip flop B86 is connected to the writing input of the central memory RAM and to the input $\overline{en84}$ of the decoder DEC82. The output Q of the flip flop B85, slightly retarded, is connected to the reading input of the central memory RAM and to one of the inputs of a logic gate ET96, which receives on its other input the output of the logic gate OU82. The output of the logic gate ET96 is connected to the input en83 of the decoder DEC81. The output j of the decoder DEC81 is connected to the validation input of the passage buffers of the memory shift register RDM$_j$ and the output j of the decoder DEC82 to the loading input of said memory shift register RDM$_j$.

The operation of this assembly is as follows:

The activation of the signal $\overline{valid}$ provokes the unlatching of the phase distributor DP_H, and the validation of the decoder DEC80, which comes to permit the determination of the nature of the request. The phase θ81 is used for reading the state of the bits corresponding to the block requested in the memory RAMFG, and the combination ro.rw is stored in the flip flop B84. A first writing takes place in the memory RAMFG on the phase θ83 which permits updating the status bits. Their value is furnished by the logic PAL80 and permits obtaining the following chains:

in case of request for a block of non-shared data (dnp) then regardless of the state of the bits ro.rw (rw is forced to zero), the state 10 is forced ("block broadcast in reading");

in case of request for a block for reading (dl) or writing (de), if ro.rw=01, then the request is placed in the waiting line on the phase θ83 and the state 01 is forced (in fact this is the preceding state), if not the state 10 is forced in case of reading ("block broadcast in reading") and the state 01 is forced in case of writing ("block broadcast in writing");

in case of request for updating (maj), the state 00 is forced ("block not broadcast"). In these various cases, a reading or a writing into the central memory RAM is carried out, toward or away from the memory shift register RDM$_j$ identified by the field cpu of the common bus BUSA. In the example chosen, the duration of the memory cycle RAM is 4 periods of the general clock h. In the case of reading of non-shared data, the cycle is carried out from θ81 to θ85, in the other cases from θ83 to θ87. The writing is carried out from θ81 to θ85;

in case of informative writing, this does not cause movement of data, but forces the status bits to the value 01 (state of departure is in this case forcedly 10);

in case of request for updating, a consultation of the waiting line AFIFO is systematically carried out. This consultation may cause the reading of a block, in the case where a central unit CPU is waiting in the line AFIFO for operating this block.

The reading is carried out from O86 to O90 and the state of the bits is forced to 10 (request for a reading) or 01 (request for writing). The end of all operation translates by resetting to zero the flip flop B80 which activates the signal $\overline{done}$. This deactivation may be produced on the phases θ85, θ87 or θ91 according to the requested operation, or on θ89 if the consultation of the line gives a negative result.

The associative waiting line is not detailed. It constitutes in a conventional manner an associative store used in the waiting line. The number of words of this memory is equal to the number of the central unit CPU of the multiprocessor system. An internal "daisy chain" identifies on each phase θ81 the next candidate word to a writing, which is produced on the phase θ83 by the signal wff. The signal cff unlatches a comparison starting from the phase θ85, the flip flops of the response memory having been reset to zero on the phase θ84. The result of the comparison is propagated on the signal s/n (some/none) and the contents of the word concerned are available on the data output from the phase θ86. This word is then invalid on the phase θ90.

In the architecture described above, the snooping processors PE$_j$ are urged to each address transfer on the common bus BUSA, with eventual consultation of their cache memory MC$_j$. This consultation is most of the time useless (low probability of the presence of the address of the block corresponding to the transfer, in the cache memories).

It should be noted that the memory management processor PGM keeps the state bits of the blocks and makes possible a central management for maintaining coherence. To this effect, one can add to the architecture described above (FIG. 10) a parallel synchronization bus operating according to the same algorithm as the synchronization bus SYNCHRO of the variation which is described hereafter. The snooping processors are no longer then properly spoken of as snooping (since connected on the synchronization bus and not on the common bus BUSA), and are designed as coherence maintenance processors (PMC$_j$ for the variation in FIG. 18). Thus, the memory management processor PGM remains urged to each transfer on the common bus BUSA, but the coherence maintenance processors are urged by the processor PGM only when they are concerned by the transfer.

Figure 18:
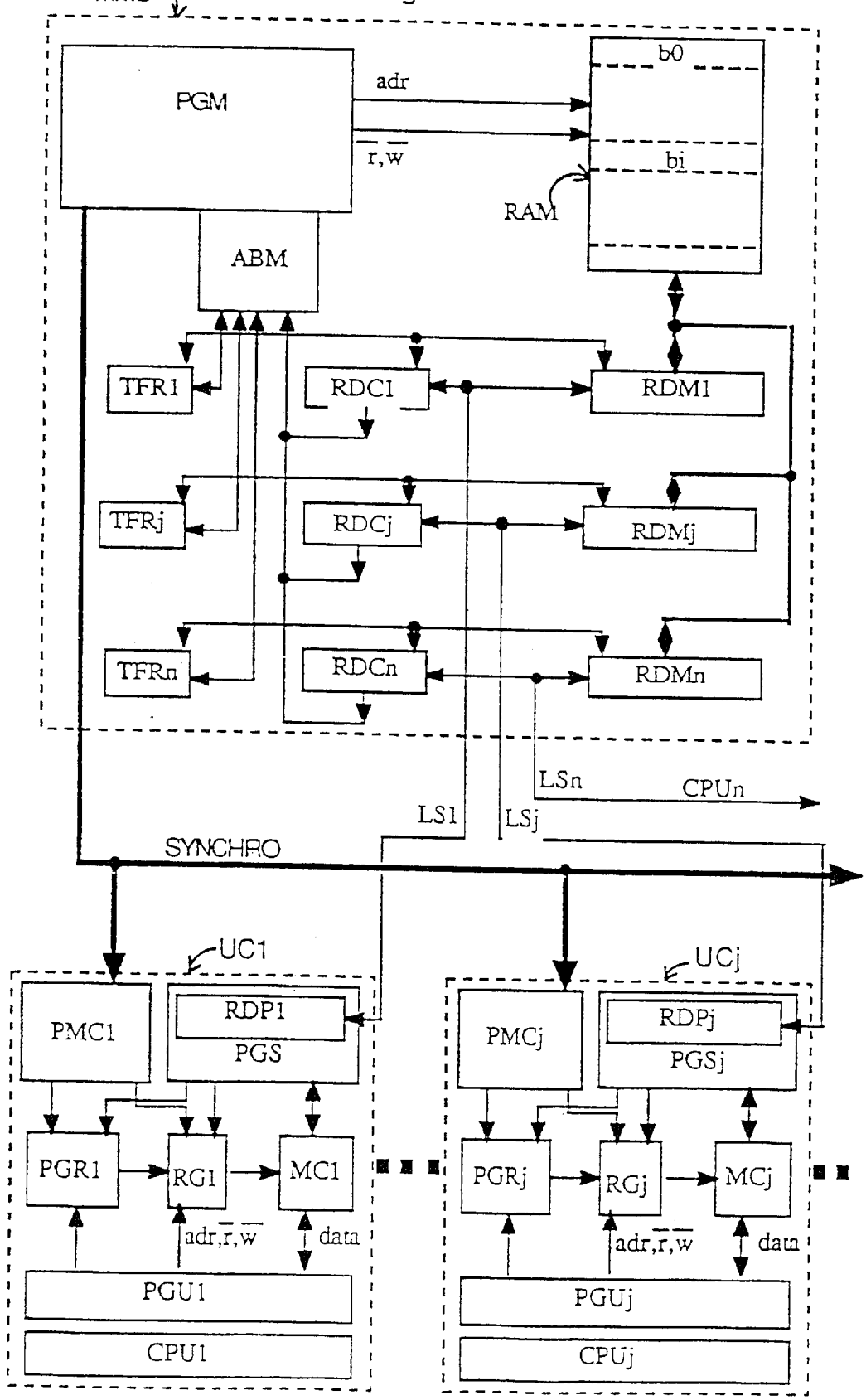
FIG. 18 is a block diagram of a system of the type as that of FIG. 6, provided with means for shared data management.

FIG. 18 presents a variation in which the coherence is maintained according to the principle discussed above. This variation takes the general architecture of FIG. 6, with the address of the blocks which transfer by the serial links LS$_j$. This system comprises a parallel synchronization bus SYNCHRO, of the same logic structure as the common bus BUSA, but directed at the sole initiative of the memory management processor PGM.

The structure of the central unit UC$_j$ is conformed to that presented in FIG. 10, with some modifications:

the structure of the cache memory MC$_j$ remains the same, as well as the structure of the management directory RG$_j$, the parallel management processor PGP$_j$ disappears, since the common bus BUSA no longer exists and the functions which had been attributed to it are turned over to the serial link management processor PGS$_j$;

the snooping processor $PE_j$ is replaced by a coherence maintenance processor $PMC_j$ which takes care of keeping the state bits of the blocks in the cache memory $MC_j$ in order to assure the coherence and which is active at the sole initiative of the memory management processor $PGM_j$ via the synchronization bus SYNCHRO;

the request management processor PGU no longer knows a single partner: the serial link management processor $PGS_j$, on which it reports all its requests;

the serial link management processor $PGS_j$ is charged with the transfer of the addresses and the data, conforming to the principle described for the system of FIG. 6, each address being prefixed by the nature of the request;

the functionalities of the memory management processor PGM are those described in reference to FIG. 17, its activation no longer being assured by the signal $\overline{valid}$, which disappears (since previously associated with the common bus BUSA), but by the arbitrator ABM described in the system of FIG. 6, which serializes the requests for service which move by the serial links. The memory RAMFG is also constituted by a supplementary field cpu associated with the state bits ro.rw.

The general functioning of the embodiment shown in FIG. 18 is as follows:

Each request of the treatment processor CPU activates the request management processor $PGU_j$ with the reading or writing indication and code or data. This processor requires an access to the management directory $RG_j$ after the directory management processor in comparison with the directory management processor $PGB_j$. The consultation of the directory leads to one of the following cases:

the block is present in the cache memory $MC_j$, with an unmodified state (m=0): if the request is for reading, the information requested is extracted from the cache memory $MC_j$ and furnished to the treatment processor $CPU_j$. If the request is for writing, then an informative writing request ei is transmitted to the serial link management processor $PGS_j$;

the block is present in the cache memory $MC_j$, with a modified state (m=1); the request, reading or writing, is satisfied;

the block is absent from the cache memory $MC_j$; a block request for reading or writing is transmitted to the serial link management processor $PGS_j$.

Thus, the requests made to the serial link management processor may be: a request for reading non-shared data (code): dnp, a request for reading the block: dl, a request for reading of the block in order to carry out there a writing: de, a request for informative writing: ei.

At these various states, it is necessary to add the state maj corresponding to the purging of a block, either at the request of the coherence maintenance processor $PMC_j$, or for liberating a placement of a block in the cache memory. The addresses thus prefixed move by the serial links $LS_j$, and conformingly to the principle set out during the description of the architecture of FIG. 6, urge the arbitrator ABM when:

in case of reading a block, the address is transmitted, in case of writing a block, the address and the data are transmitted.

These requests are treated sequentially by the memory management processor PGM, of the same general structure as that described in FIG. 17. Their treatment is as follows:

1/ dnp: request for non-shared data. The block is transmitted and takes the state ro.rw=10.

2/ dl: request for reading of a block.

If the block is in the non-broadcast state (ro.rw=00) or "broadcast in reading" (ro.rw=10), it is transmitted and takes or keeps the state ro.rw=01.

If the block is in the state of broadcast in writing, the request is sent into the waiting line AFIFO. The memory management processor PRM then finds in the field cpu of the memory RAMFG the address of the cache memory $MC_i$ which contains the current version of the requested block. A request for purging is then emitted on the synchronization bus SYNCHRO, to the sole destination of the coherence maintenance processor $PMC_i$ associated with the cache memory $MC_i$ concerned. This request may be qualified by the addressed command.

One will note that the coherence maintenance processor $PMC_i$ has not consulted the associated management directory $RG_i$ since the memory management processor PGM knows of the fact that it is the only possessor of the current copy. Its role consists simply of removing the request and depositing it in the associated file $FIFO_i$.

3/ de: request for reading of a block in order to make a writing.

If the block is in the "non-broadcast" state (ro.rw=00), it is transmitted and takes the "broadcast in writing" state (ro.rw=01).

If the block is in the "broadcast in reading" state (ro.rw=10), then the memory management processor emits a universal block invalidation command, then transmits the bloc with the state "broadcast in writing" (ro.rw=01). The universal command provokes the activation of all of the coherence maintenance processors $PMC_j$ which execute strictly the same operations as those described for the system of FIG. 10. If the block is in the "broadcast in writing" state, the request is sent to the waiting line AFIFO. As before, the memory management processor PGM sends a command addressed to the only possessor of the current copy.

4/ maj: request for writing of a block after a purge.

The operating algorithm is in this case strictly the same as that described in reference to FIG. 17 for the PGM processor.

It will be noted that the problem of discharge of the writing naturally found its solution in this embodiment by an addressed command for discharge.

5/ ei: informative writing.

This case is treated directly on the common bus BUSA in the architecture presented in FIG. 10. In the embodiment provided here, and in order to assure the synchronization, this operation is controlled by the memory management processor PGM.

If the block is in the state "broadcast in reading", then a command, at the time universal and addressed, is sent out: addressed in the sense that the coherence maintenance processor $PMC_j$ concerned notes the discharge of the request for informative writing and passes the block concerned into the state "modified" in the management directory $RG_j$, universal in the sense that all the other processors $PMC_i$ must invalidate this block in their directory.

The block in the "broadcast in writing" state indicates that an informative writing request has been treated on this same block during the time waiting for treatment of the request. In this case, the informative writing request is transformed into a writing request de, and follows the same treatment as in the corresponding case of writing.

The parallel synchronization bus SYNCHRO is charged with broadcasting the block addresses prefixed by a processor number and a type of request, to be about 30 to 40 bits according to the characteristics of the multiprocessor. These data are moreover transmitted in a unidirectional manner. Their transfer may advantageously be made there by a serial link. Their transfer rate is less critical than for the block, and simplified solutions may therefore be envisioned, for example by the bias of "TAXI" circuits made by the A.M.D. Company.

Figure 19:
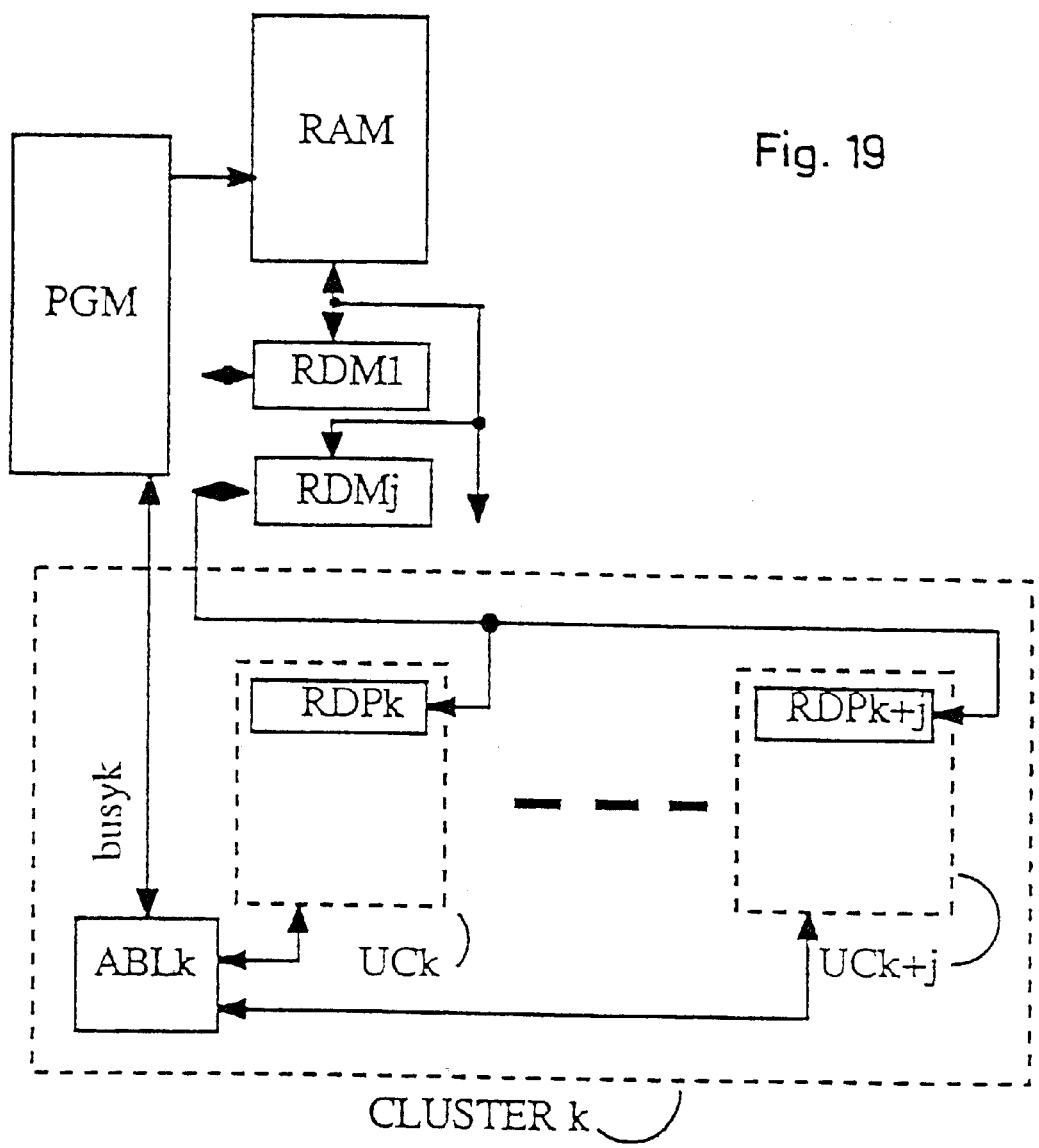
FIG. 19 is a simplified block diagram of a variation of the system, in which several central units share the same serial link.

FIG. 19 shows a partial block diagram of one architecture according to the invention, in which several central units $UC_k \ldots$ are connected in clusters and share the same serial link $LS_k$. In this goal, a local arbitrator $ABL_k$ associated with the cluster is charged with arbitrating the access conflicts by means of communication of block addresses, and sharing with the memory processor PGM, transported for this purpose, a signal $busy_k$ indicating permanently the free state or occupied by the serial link $LS_k$. Means for coding and decoding of one at the head of the identification of the processor concerned at the interior of a cluster are associated with emission logic and reception of blocks of data.

In the case where the address communication means for blocks are constituted by the common bus BUSA, the operation is as follows:

If the central unit $CPU_{k+j}$ desires to make a transfer of a block in the direction of the central memory RAM to a cache memory $MC_{k+j}$ (case dnp, dl, de) or carry out an informative writing ei, then it requires access to the common bus BUSA by the local arbitrator $ABL_k$, which propagates the request, its turn coming, to the arbitrator AB. The accord for access to the common bus BUSA is re-sent to the central unit $CPU_{k+j}$ and the transfer is carried out in the manner described in reference to FIG. 10. All blocks transmitted in the direction of the central memory RAM to the cache memory $MC_{k+j}$ must then be identified, since the order of the requests is not respected of the fact of the possibility of being waiting in the line AFIFO of the memory management processor PGM. If the central unit $CPU_{k+j}$ desires to make a transfer of a clock in the direction of the cache memory $MC_{k+j}$ toward the central memory RAM (case maj), then it requests first of the local arbitrator $ABL_k$ access to the serial link $LS_k$. The local arbitrator $ABL_k$ and the memory management processor PGM are both suitable for authorizing the serial link $LS_k$: the contention is avoided by synchronizing the modification of the signal $busy_k$ with the signal valid (the memory management processor PGM only activates or reactivates a transfer during a memory transaction). The occupation accord of the serial link $LS_k$ leads the central unit $CPU_{k+j}$ to transfer its block of information to the memory shift register $RDM_k$, then to request the local arbitrator $ABL_k$ for access to the common bus BUSA in order to carry out there the operation request, which is carried out according to the algorithm described in reference to FIG. 10. The writing of the operation may cause a liberation of the block in the waiting line AFIFO of the memory management processor PGM and request an occupied shift register $RDM_j$. In this case, the transfer requested is delayed and chained with the transfer in progress.

In the case where the block address communication means is the serial links themselves, the operation is then identical to the preceding case for the preemption of the series link, and identical for the general operating algorithm to that shown with reference to FIG. 17.

For example, a reading request of the block emitted by the central unit $CPU_{k+j}$ necessitates first an access accord to the serial link $LS_k$, an accord given by the local arbitrator $ABL_k$ in concert with the memory management processor PGM. The access accord causes the transfer of the address of the block requested on the serial link $LS_k$, which is immediately liberated: it is available for any other transaction if necessary. A writing request of a block follows the same protocol for access to the serial link $LS_k$.

In the architecture described with reference to FIGS. 1 to 19, there exist as many memory shift registers $RDM_j$ as central units $CPU_j$: one serial link $LS_j$ being provided in a static manner to a couple ($RDM_j$, $CPU_j$).

If there must evidently be at least one serial link $LS_j$ between a central unit and the central memory RAM, the number of shift registers $RDM_j$ may be less. In effect, if tacc is the time for access to the central memory RAM, and ttfr the time for transfer of a block, it is not possible to keep more than n=ttfr/tacc shift registers simultaneously occupied. For example, for tacc=100 ns and ttfr=1200 ns, one obtains n=12.

Tacc and ttfr are then the criteria characteristic of the performance of the multiprocessor system according to the invention and putting in place n memory shift registers $RDM_j$ is compatible with a greater number of serial links $LS_j$ that the condition of interspersing a logic of the interconnection network type RI between registers and links, the allocation of a memory register $RDM_j$ to a serial link $LS_j$ being achieved in a dynamic manner by the memory management processor PGM.

Further, the central memory RAM will generally constitute m memory banks $RAM_1, \ldots RAM_p, RAM_m$ arranged in parallel, each memory bank comprising n shift registers $RDM_j$ connected by an interconnection network $RI_p$ to the assembly of serial links $LS_j$. It is then possible, under reserve that the addresses of the blocks be uniformly distributed in the memory banks $RAM_p$, to obtain a theoretical performance of m×n shift registers simultaneously active. The uniform distribution of the addresses is assured by conventional mechanisms for interlacing the addresses.

In FIG. 20a, there is partially shown an architecture conforming to the invention, comprising m memory banks $RAM_p$ with n shift registers $RDM_j$ per memory bank and q central units $UC_j$. Each memory bank is of the random access type provided with an input/output of data of a size corresponding to a block of information bi, this input/output being (as before for the memory RAM) connected by a parallel bus to the assembly of elementary registers $RDM_{1p} \ldots RDM_{jp}$.

The interconnection network is of a known structure ("cross-bar," "delta," "banyan," ... ). One will note that a multi-stage network is well suited in the case where the time for establishing a path is negligible before its time of occupation (the time of transfer of a block) and that it only concerns one bit per link.

The memory management processor PGM is adapted to be assured of the dynamic allocation of an output and an input of the network, that is putting in relation a memory shift register $RDM_j$ and a serial link $LS_i$.

In the case where the block address communication means constitutes the common bus BUSA, the operation is as follows:

In the case of a request for reading of a block of the part of the central unit $CPU_j$, the memory management processor $PGM_p$ concerned allocates a shift register $RDM_i$, controls the interconnection network RI as a consequence, and initializes the transfer.

In the case of a request for writing of a block of the part of the central unit $CPU_j$, a path must first be established. To this end, a first request for establishment of the path is sent on the common bus BUSA, followed by the writing request effecting the transfer of the block from the cache memory $MC_j$ to the shift register $RDM_i$. At the time of the first request, the memory management processor PGM is charged with allocating a path and controlling the interconnection network RI.

In the case where the block address communication means is the serial links themselves, a path must be established for all preliminary transfer. This problem is identical to the classical problem of sharing of an assembly of n resources by m users and may be controlled by classical solutions for arbitration of access conflicts (communication protocols, supplementary signals).

In the example of the architecture shown in FIG. 5, the shift registers $RDM_j$ and $RDP_j$, their validation logic LV1 and LV2 were provided with high speed, the assembly being synchronized by a clock of a frequency F at least equal to 100 MHz.

FIG. 20b shows a variation of the architecture proposed in FIG. 20a, a solution conforming to the invention in which each serial link $LS_j$, which connects the processor $CPU_j$ to all of the memory banks, is divided into m serial links $LS_{jp}$, connecting by point to point the processor $CPU_j$ to each of the memory banks $RAM_p$.

This process presents the double advantage following:
  each link being of the point to point type, may be better adapted from the electrical point of view or the fiber optic point of view,
  a level of supplementary parallelism is obtained starting from when the treatment processor is in the state of anticipating block requests, which is the case actually for the for the highest performance processors.

The interface logic (noted previously $TRF_j$ and $RDP_j$) which is associated with the serial link $LS_j$, side processor $CPU_j$, is then duplicated into m copies $I_i, \ldots I_p \ldots I_m$. One will note the presence of a link for maintaining the coherence of information, proprietary to each memory bank $RAM_p$. The operation of this link is analogous to that of the bus SYNCHRO of FIG. 18.

Figure 21A:
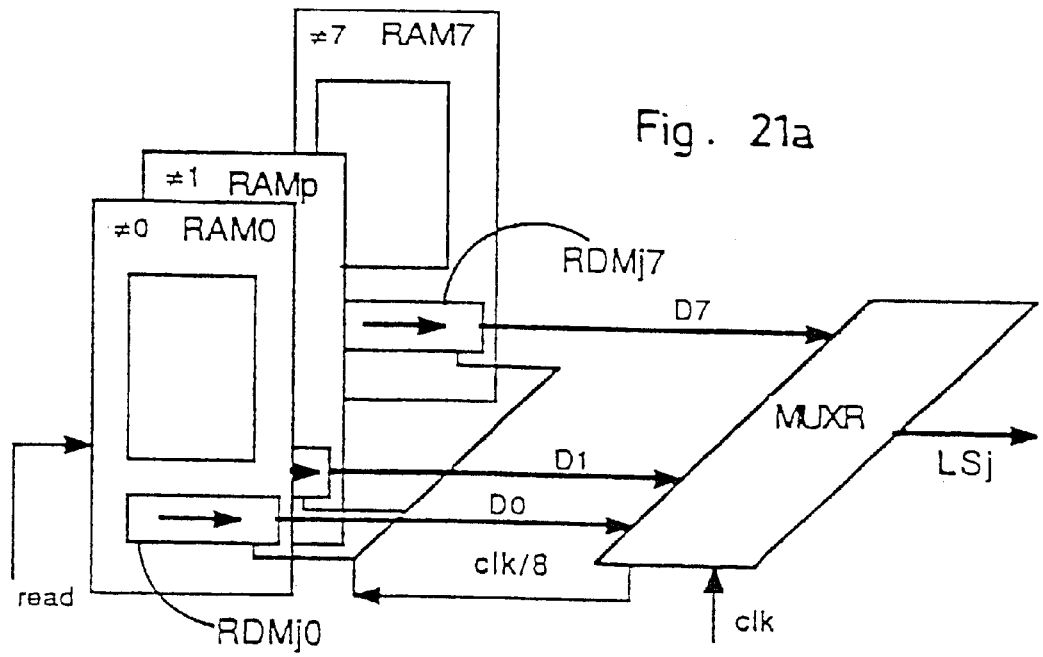
FIGS. 21a and 21b schematically show another structure of the memory RAM suitable for equipping said system.
Figure 21B:
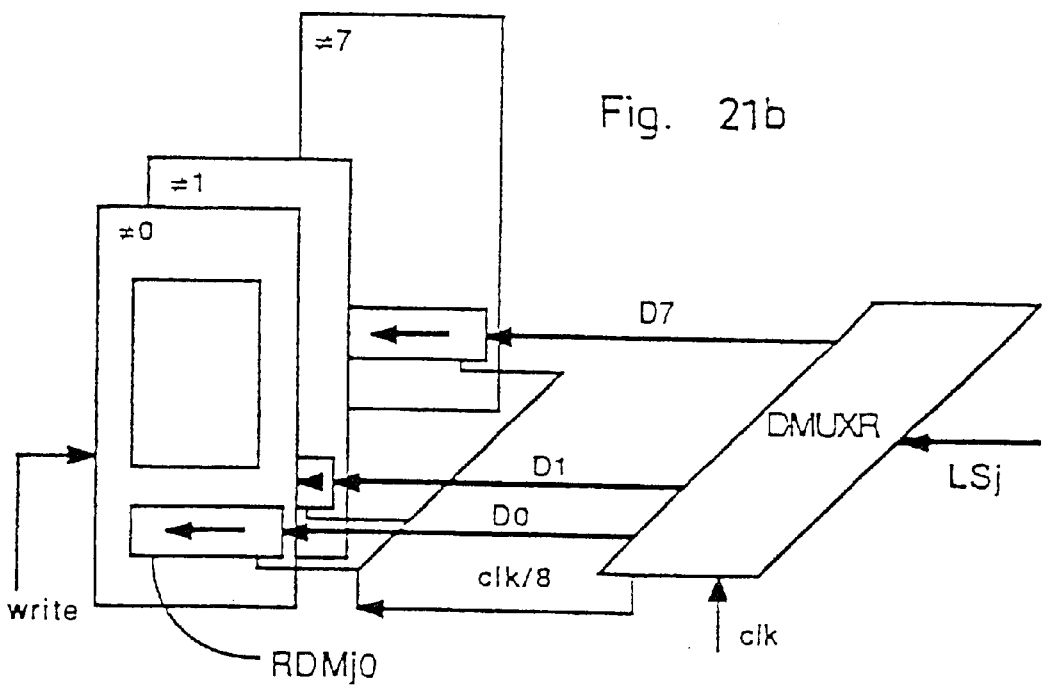

There is shown in FIGS. 21a and 21b another structure of the memory RAM which comprises $2^u$ memory planes, each memory plane having a front of $t/2^u$ binary data (for reasons of clarity, in FIG. 21a is shown the means necessary for the reading of a block bi, and in FIG. 21b the means necessary for writing). The shift registers $RDM_j$ or $RDP_j$ are constituted of $2^u$ elementary sub-shift registers $RDM_j$, with $t/2^u$ bits of capacity. The example shown in FIG. 20 is a realization of 8 memory planes (u=3). (For clarity of the drawing, there is shown a single shift register $RDM_j$ formed for the assembly of sub-registers $RDM_{jp}$). Each memory plane $RAM_p$ comprises opposite its access front an assembly of elementary shift registers $RDM_{jp}$ and is capable of operating with a shift frequency of at least $F/2^u$.

The operation of the assembly in case of reading is illustrated in FIG. 21a. A block is read in a synchronous manner in the assembly of $2^u$ memory planes and loaded in the same manner in the elementary registers of the same rank. The serial outputs of these registers are connected to the inputs of a multiplexer MUXR made of high speed technology (GaAs). A circuit of this type, perfectly adapted, is available at "Gigabit Logic" under the name "LOGO40", and is capable of delivering a logic signal at a frequency of 2.7 GHz. It also furnishes a clock frequency divided by eight, which constitutes the clock for shift of the elementary registers $RDM_{jp}$.

In the case of writing, a symmetrical operation, shown in FIG. 21b, is obtained with a multiplexer circuit DMUXR of the same manufacturer (known as "LOG41"), with the same characteristics of performance.

Thus, a transfer frequency of 500 MHz is obtained with 8 elementary registers operating at a frequency of 500/8= 62.5 MHz, which makes then able to be accomplished with more conventional technology ("MOS" for example).

The multiplexer and demultiplexer circuits reference hereabove are combinable into assemblies of 16, 32, . . . bits. Thus, by associating respectively 16, 32 memory planes operating at 62.5 MHz, it is possible to obtain flow rates of 1 and 2 GHz, or a level of performance 2 to 4 times greater.

It should be noted that the logic TFR may be provided on one of the elementary registers, and that the validation logic LV is integrated with the circuits "GaAs" (output with open collector).

Figure 22:
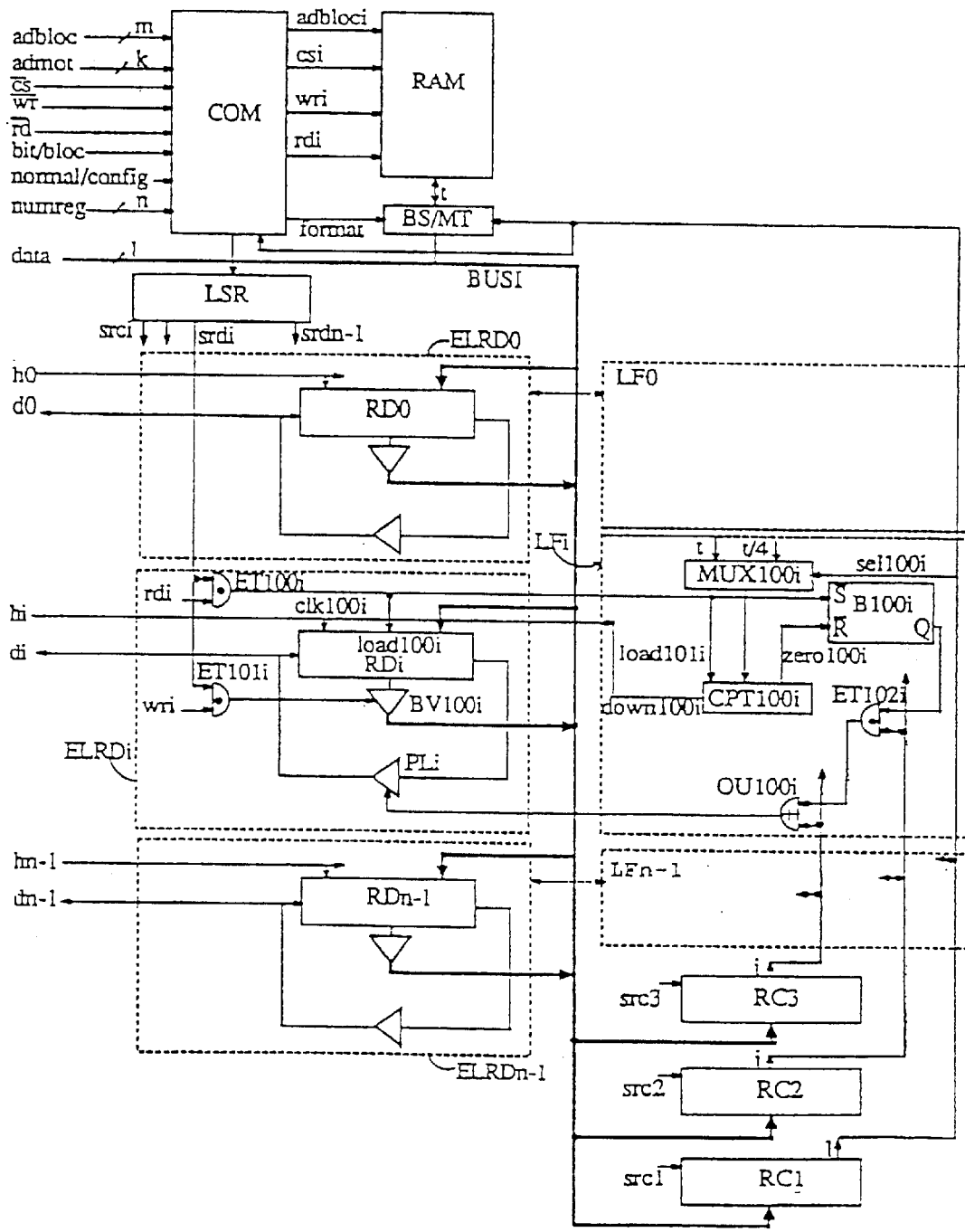
FIG. 22 is a block diagram showing the structure of a multiport serial memory component, capable of equipping the system.

FIG. 22 shows the general structure of a component of the "VLSI" integrated circuit type, called a multiport serial memory and capable of equipping a multiprocessor system according to the invention. This component may be used in multiprocessor architecture described previously, either to provide the central memory RAM and the associated shift registers $RDM_j$, or for providing each cache memory $MC_j$ and its shift register $RDP_j$. To simplify the notations, in the description which follows, the symbols relative to the central memory RAM and the associated shift registers will be retained.

The list of pins of this circuit with the corresponding signals is as follows:

$adbloc_0$-$adbloc_{m-1}$: m address bits of block bi, $admot_0$-$admot_{k-1}$: k bits of word addresses in the block, $numreg_0$-$numreg_{n-1}$: n bits of register addresses rd, $\overline{cs}$: "chip select": circuit selection signal, $\overline{wr}$: "write": signal for writing, $\overline{rd}$: "read": signal for reading, bit/$\overline{bloc}$: control signal for the multiport function, normal/$\overline{config}$: signal for the operating mode, $data_0$-$data_{l-1}$: l bits of data, $h_1$-$h_n$: n clock signals, $d_1$-$d_n$: n data signals.

The values m, n, l are functions of the current state of technology. The actual values may be as follows:

m=16 or $2^{16}$ blocks bi of 64 bits each (or 4 bits), n=3 or 8 registers rd, l=8 or a parallel interface of the byte type, k=3 because of the fact of 8 bytes per block.

The component provided comprises about 50 pins.

This serial multiport memory circuit is composed of a random access read-write memory RAM, of a predetermined size t, capable of being controlled in writing on the external interface independent of the size t/4 (value chosen by way of example in FIG. 22) and t/l. The data lines of this memory RAM are connected to the inputs of a logic of the "barrel shifter" type BS, or of the multiplexing MT, depending on the version of the component, the multiplexing logic MT may be considered as offering a sub-assembly of possibilities of barrel shifter logic and therefore simpler to provide. The address signals and the control signals of this memory RAM, namely csi, wri, rdi, adbloci, are delivered from a control logic COM. This logic COM receives further the information signals from the pins $\overline{cs}$, $\overline{wr}$, $\overline{rd}$, bit/$\overline{bloc}$, normal/$\overline{config}$, numreg and is con-nected by the control lines "format" to the barrel shifter logic BS, and to the output of a configuration register RC1, and to the input of a selection logic LSR providing the sig-nals $srd_0, \ldots srd_{n-1}$ and $src_1$, $src_2$, $src_3$. The outputs of the barrel shifter type of logic BS constitute an internal parallel communication bus BUSI, connected to an assembly of shift registers $RD_0, \ldots RDn_{-1}$, on their parallel inputs, for one part, on their parallel inputs, and for the other part on their parallel outputs through the validation buffers $BV100_0, \ldots BV100_{n-1}$ and to the parallel input of the configuration registers $RC_1, RC_2 \ldots RC_i$.

The 1 bits of low significance of the bus BUSI are also received on the 1 pins $data_0, \ldots data_{l-1}$. Each shift register $RD_i$ and the associated logic gates constitute a functional unit $ELRD_i$, controlled by an assembly of logic elements which constitute a forcing logic $LF_i$. Each functional unit $ELRD_i$ comprises logic gates $ET100_i$ and $ET101_i$, connected on one of their inputs to the output $srd_i$ of the selection logic LSR, and receiving on their other input respectively the signals $rd_i$ and $wr_i$. The output of the logic gate $ET100_i$ is connected to the input $load100_i$ of the shift register $RD_i$, as well as the input $load101_i$ and the input S respectively of a counter $CPT100_i$ and of a flip flop $B100_i$ appertaining to the forcing logic $LF_i$. The output of the logic gate $ET101_i$ is connected to the control input of the validation buffers $BV100_i$. The output di is connected to the output of a logic gate $PL_i$, which receives on its data input the serial output of the shift register $RD_i$ and on its control input the output of a logic gate $OU100_i$. The signal sent from the pin $h_i$ is delivered to the input $clk100_i$ of the register $RD_i$ as well as the input $down100_i$ of the counter $CPT100_i$. The output $zero100_i$ of the counter $CPT100_i$ is connected to the input R of the flip flop $B100_i$.

The forcing logic $LF_i$ comprises in addition a multiplexer $MUX100_i$ which receives on its data inputs the values t and t/4. The data output of the multiplexer $MUX100_i$ is connected to the data input of the counter $CPT100_i$, and the selection command $sel100_i$ of the multiplexer $MUX100_i$ is connected to the output 1 of the register $RC_1$. The output Q of the flip flop $B100_i$ is connected to one of the inputs of a logic gate $ET102_i$, which receives on its other input the signal issued from the pin i of a register $RC_2$. The output of the logic gate $ET102_i$ is connected to one of the inputs of the logic gate $OU100_i$, which receives on its other input the signal issued on the pin i of a register $RC_3$. The loading inputs of the registers $RC_1, RC_2, RC_3$ receive respectively the signals $src_1, src_2, src_3$ issued from the selection logic LSR.

This component presents a duality of functioning: if the signal bit/$\overline{bloc}$ is in the "bit" state, then the functioning of this component is that of a conventional semiconductor memory: the signals adbloc associated with the signals admot constitute the address bus in the word unit (8 bits in the example), the signals $\overline{Cs}$, $\overline{rd}$, $\overline{wr}$ have the usual direction attributed to these signals, and the data pins convey these data.

In an internal manner, in reading, the block of information designated by adbloc is read in the memory RAM and presented at the input of the barrel shifter logic BS or of the multiplexing MT. The combination of signals admot and bit/$\overline{bloc}$ permit the control logic COM to provide to the barrel shifter logic BS or the multiplexing MT the "format" signals. The word concerned is then right justified in the output of the barrel shifter logic or the multiplexing and presented thus on the data pins data.

In an internal manner, in writing the word presented on the data lines data is aligned by the barrel shifter logic LS or the multiplexing MT by the same signals of the control format as in reading, with regard to its position in the block. The control logic COM emits then a partial writing signal wri on the only leg of the memory concerned, and to the address designated by the signals adbloc.

If the signal bit/$\overline{bloc}$ is in the "bloc" state, then the operation depends on the state of the normal/$\overline{config}$ signal. The config mode programs the configuration registers $RC_1$, $RC_2$, $RC_3$ addressed by the signals numreg, and programmed from the data lines data. The register $RC_1$ permits modifying the size of the block: t and t/4 in the example are 64 bits and 16 bits, respectively. In an internal manner, the functioning is similar to that described in the "bit" embodiment: t or t/4 bits are aligned on the internal bus BUSI (in reading), or opposite the leg of the block concerned (in writing). The sizes of the multiple blocks may be envisioned (t, t/2, t/4 . . . ).

The register $RC_3$ permits selecting for each register a permanent direction of operation: either in the input ($RC3_i$ 0) or in the output ($RC3_i$=1). This permanent direction permits adapting the component to serial links with permanent unidirectional connections. The register $RC_2$ permits choosing for each register, under reserve that the corresponding bit of $RC_3$ be at the logic state 0, a mode of operation with alternate bidirectional links: on a reading memory RAM, the shift register $RD_i$ concerned passes to the output mode for the time of transmission of the block, then returns to the wait state in the input mode. In an internal manner, the flip flop $B100_i$, which controls the logic gate $PL_i$, is set to 1 on a loading signal of the register $RDM_i$ and reset to zero upon issue of the transfer of t or t/4 bits, through the counter $CPT100_i$, initialized at t or t/4 according to the state of the register $RC1$, and which receives on its counting input the clock pulses hi. In normal operation (normal/$\overline{config}$ signal in the normal state) for a reading, the block addressed by the pins adbloc is loaded in the register $RD_i$ addressed by the numreg pins. If the block is partial (t/4), then it is transmitted in a position of low significance on the internal bus BUSI by the barrel shifter type logic BS or the multiplexer MT. This block is then transmitted upon activation of the clock signal hi.

In the normal operation for a writing, the contents of the register $RD_i$ addressed by the numreg pins is written in the block memory RAM with the address adbloc. If the block is partial, it is transmitted into a position of high significance on the internal bus BUSI, then aligned opposite the leg of the block concerned by the barrel shifter logic BS or the multiplexer MT, and finally a partial writing signal wri is sent out on the leg concerned.

It should be noted that if a partial block is in service, then the address of this partial block in the block is furnished by the address lines admot.

This component is perfectly adapted to the diverse variations of the architecture described. Associated in parallel, 8, 16 . . . circuits of this type permitting provision of the apparatus described in FIGS. 20a, 20b. If the memory PAM is of high speed technology, then this component may also be used at the level of the cache memory, while multiplexing, according to the device described in FIGS. 20a, 20b, the internal registers of a same component.

What is claimed is:

1. A memory component on a single integrated circuit having a plurality of pins for coupling to an external master, the memory component comprising:

a storage subsystem having a plurality of storage locations;

a plurality of configuration bits in at least one configuration register, the configuration bits specifying one of a plurality of modes including transfer-length modes corresponding to transfers of a mode-specific number of the storage locations between the storage subsystem and the external master; and control logic coupled to the storage subsystem and the configuration bits, the control logic executing the transfers in accordance with the configuration bits.

2. The memory component of claim 1, wherein the number of the storage locations transferred between the storage subsystem and the external master is decoded based on the mode of operation specified by the configuration bits.

3. The memory component of claim 1, wherein the number of unique transfer-lengths over all the modes is less than the number of storage locations transferred in a transfer of the maximum length.

4. The memory component of claim 3, wherein the available transfer lengths include lengths of 2 and 8 addressable locations.

5. The memory component of claim 4, wherein the available transfer lengths further include a length of 4 addressable locations.

6. The memory component of claim 3, wherein the available transfer lengths include lengths of 16 bits and 64 bits.

7. The memory component of claim 6, wherein the available transfer lengths further include a length of 32 bits.

8. The memory component of claim 3, wherein the plurality of storage locations is implemented as dynamic random access memory.

9. The memory component of claim 1, wherein the number of available transfer lengths is less than the length of the maximum transfer.

10. The memory component of claim 1, wherein the plurality of pins is 51.

11. The memory component of claim 1, wherein the plurality of pins includes at least a first pin dedicated to an externally provided clock, and at least a second pin dedicated to data that is latched synchronous to the externally provided clock.

12. The memory component of claim 11, further wherein at least a third pin is dedicated to a second externally provided clock, and at least at least a fourth pin dedicated to data that is latched synchronous to the second externally provided clock.

13. The memory component of claim 11, further including additional data pins.

14. The memory component of claim 11, wherein the plurality of storage locations is implemented as dynamic random access memory.

15. The memory component of claim 1, wherein the plurality of pins includes a first subset of pins dedicated to externally provided clocks, and a second subset of respectively associated pins dedicated to data, wherein the data on the data pins is latched synchronous to the respectively associated externally provided clocks.

16. The memory component of claim 1, further wherein the control logic is a slave to the external master, the control logic executing the transfers only when commanded by the external master, the configuration bits having been previously loaded at the command of the external master.

17. The memory component of claim 16, wherein the transfer-length selected via the configuration bits is persistent across multiple transfers commanded by the external master.

18. The memory component of claim 16, wherein the plurality of storage locations is implemented as dynamic random access memory.

19. The memory component of claim 1, wherein the storage locations are physically organized as at least a two dimensional array, the array including a plurality of addressable locations in a first dimension, and a plurality of addressable locations in a second dimension, the storage subsystem having first dimension control inputs for accessing a block of locations corresponding to a particular first dimension address and second dimension control inputs for accessing a selected subset of the block of locations, the control logic generating the first and second dimension control inputs as a function of both an address provided by the external master and the configuration bits specified transfer-length mode.

20. The memory component of claim 19, wherein the plurality of addressable locations in the first dimension is $2^{16}$.

21. The memory component of claim 19, wherein the plurality of addressable locations in the first dimension is at least $2^{16}$.

22. The memory component of claim 19, wherein each addressable location in the first dimension corresponds to a block of 64 bits.

23. The memory component of claim 19, wherein each addressable location in the first dimension corresponds to a block of at least 64 bits.

24. The memory component of claim 19, wherein the plurality of addressable locations in the second dimension is 8.

25. The memory component of claim 19, wherein the plurality of addressable locations in the second dimension is at least 8.

26. The memory component of claim 19, wherein each addressable location in the second dimension corresponds to 8 bits.

27. The memory component of claim 19, wherein each addressable location in the second dimension corresponds to at least 8 bits.

28. The memory component of claim 1, further including:
   a first and second interface coupled to the control logic and to which a first and second number of the pins are respectively dedicated during normal operation, and wherein commands are received from the external master via the first interface and data transfers between the storage subsystem and the external master are performed via the second interface.

29. The memory component of claim 28, wherein the data transfers between the storage subsystem and the external master are burst data transfers.

30. The memory component of claim 28, wherein the transfers between the second interface and the external master are synchronized to a normally continuously operating externally provided data transfer clock.

31. The memory component of claim 30, wherein the data transfer clock is asynchronous with other circuitry of the memory component.

32. The memory component of claim 30, wherein the length of the transfers is determined by the control logic in accordance with the configuration bits.

33. The memory component of claim 28, wherein the second interface comprises a plurality of bit-slices enabling the concurrent transfer of a plurality of bits.

34. The memory component of claim 33, wherein the second interface is 8 bits wide.

35. The memory component of claim 33, wherein the transfers between the second interface and the external master are synchronized to at least one data transfer clock.

36. The memory component of claim 35, wherein each data transfer clock is asynchronous with other circuitry of the memory component.

37. The memory component of claim 35, wherein the data transfer clock is externally provided to the memory component.

38. The memory component of claim 37, wherein the externally provided data transfer clock is normally continuously operating.

39. The memory component of claim 38, wherein the length of the transfers is determined by the control logic in accordance with the configuration bits.

40. The memory component of claim 37, wherein the length of the transfers is determined by the control logic in accordance with the configuration bits.

41. The memory component of claim 40, wherein the plurality of storage locations is implemented as dynamic random access memory.

42. The memory component of claim 33, wherein the second interface is bi-directional and is used for both writes and reads commanded by the external master.

43. The memory component of claim 28, wherein the second interface is bi-directional and is used for both writes and reads commanded by the external master.

44. The memory component of claim 28, further including a third interface to which a third number of pins are dedicated during normal operation and wherein configuration data is received from the external master via the third interface.

45. The memory component of claim 28, further wherein addresses are received from the external master via the first interface.

46. The memory component of claim 28, wherein the second includes at least 1 pin dedicated to data being selectively transferred between the storage subsystem and the external master in accordance with the configuration bits.

47. The memory component of claim 46, wherein the data transfer between the storage subsystem and the external matter is a burst data transfer.

48. The memory component of claim 46, wherein the total number of pins dedicated to data being transferred is 8.

49. The memory component of claim 48, wherein the data transfer between the storage subsystem and the external master is serial data transfer.

50. The memory component of claim 1, wherein the plurality of configuration bits are organized in a plurality of configuration registers.

51. The memory component of claim 50, wherein the number of unique transfer-lengths over all the modes is less than the number of storage locations transferred in a transfer of the maximum length.

52. The memory component of claim 50, further wherein the control logic is slave to the external master, the control logic executing the transfers only when commanded by the external master, the configuration bits having been previously loaded at the command of the external master.

53. The memory component of claim 52, wherein the transfer-length selected via the configuration bits is persistent across multiple transfers commanded by the external master.

54. The memory component of claim 53, wherein the plurality of storage locations is implemented as dynamic random access memory.

55. The memory component of claim 50, further including:
a first and second interface coupled to the control logic and to which a first and second number of the pins are respectively dedicated during normal operation, and wherein commands are received from the external master via the first interface and data transfers between the storage subsystem and the external master are performed via the second interface.

56. The memory component of claim 55, wherein the transfers between the second interface and the external master are synchronized to a normally continuously operating externally provided data transfer clock.

57. The memory component of claim 56, wherein the plurality of storage locations is implemented as dynamic random access memory.

58. The memory component of claim 50, wherein the plurality of storage locations is implemented as dynamic random access memory.

59. The memory component of claim 1, wherein the plurality of storage locations is implemented as dynamic random access memory.

* * * * *